US007060512B2

(12) United States Patent
Peddle

(10) Patent No.: US 7,060,512 B2
(45) Date of Patent: Jun. 13, 2006

(54) PATCHING METHODS AND APPARATUS FOR FABRICATING MEMORY MODULES

(75) Inventor: Charles I. Peddle, Las Vegas, NV (US)

(73) Assignee: Celetronix, Inc., Simi Valley, CA (US)

( * ) Notice: Subject to any disclaimer, the term of this patent is extended or adjusted under 35 U.S.C. 154(b) by 488 days.

(21) Appl. No.: 10/371,663

(22) Filed: Feb. 20, 2003

(65) Prior Publication Data

US 2003/0163218 A1    Aug. 28, 2003

Related U.S. Application Data

(60) Provisional application No. 60/360,036, filed on Feb. 26, 2002.

(51) Int. Cl.
*G01R 31/26* (2006.01)
*G01C 29/00* (2006.01)

(52) U.S. Cl. ............................ 438/14; 438/17; 365/201

(58) Field of Classification Search ................ 438/14, 438/15, 17; 324/765; 365/189.01, 201
See application file for complete search history.

(56) References Cited

U.S. PATENT DOCUMENTS

| | | |
|---|---|---|
| 5,644,541 A | 7/1997 | Siu et al. |
| 5,987,623 A | 11/1999 | Ushida |
| 6,057,169 A | 5/2000 | Singh et al. |

*Primary Examiner*—Scott Geyer
(74) *Attorney, Agent, or Firm*—Steven L. Nichols; Paul W. Fish; Rader, Fishman and Grauer PLLC

(57) ABSTRACT

A method and apparatus for building a memory module using improved patching schemes comprises, mounting multiple primary and secondary memory parts on a multi-layer circuit board, positioning I/O bit line patching networks adjacent to the primary and secondary memory parts, matching read/write control signals for primary and secondary memory parts which share I/O bit line patching networks, testing primary and secondary memory parts to identify non-operable I/O lines, and patching any non-operable I/O line of a primary memory part by replacing it with a fully operable I/O line of its associated backup memory part. The method and apparatus include multi-layer circuit boards which utilize 2-to-1, 4-to-1, and 8-to-1 patching configurations.

20 Claims, 57 Drawing Sheets

FRONT

BACK

Fig. 6D
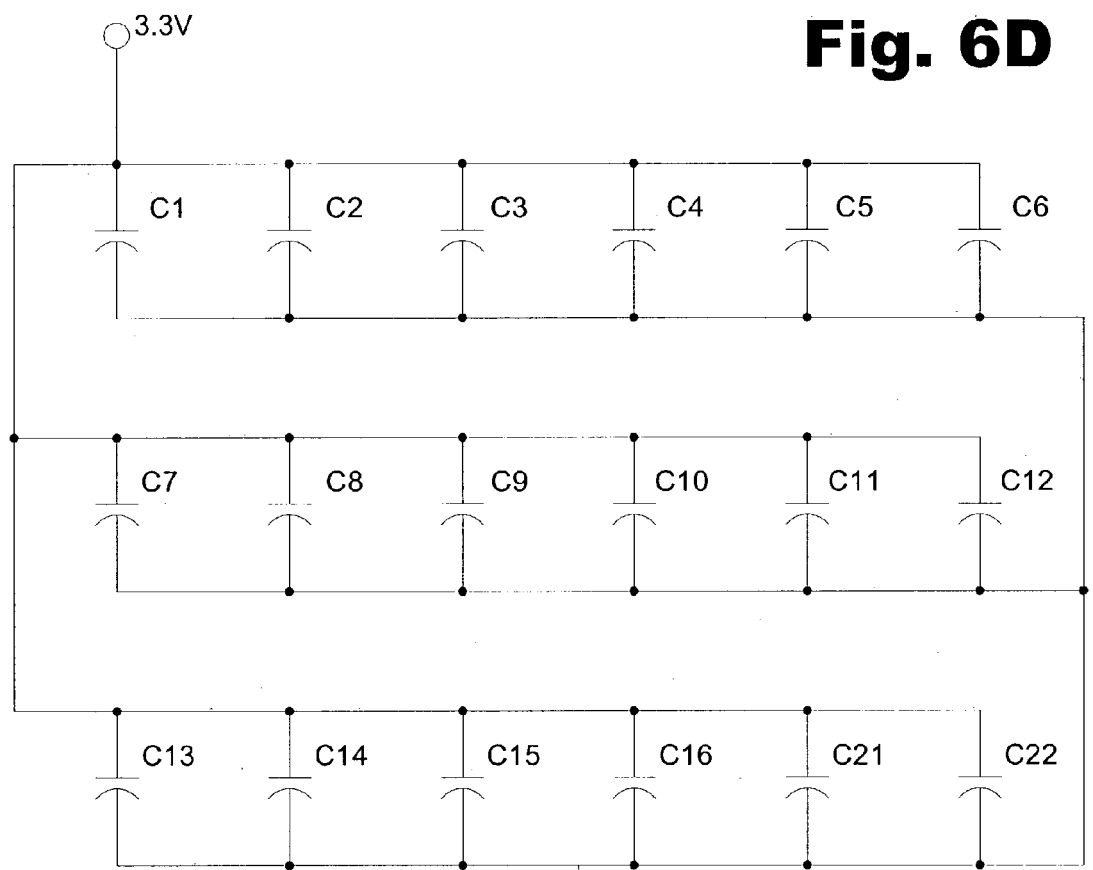
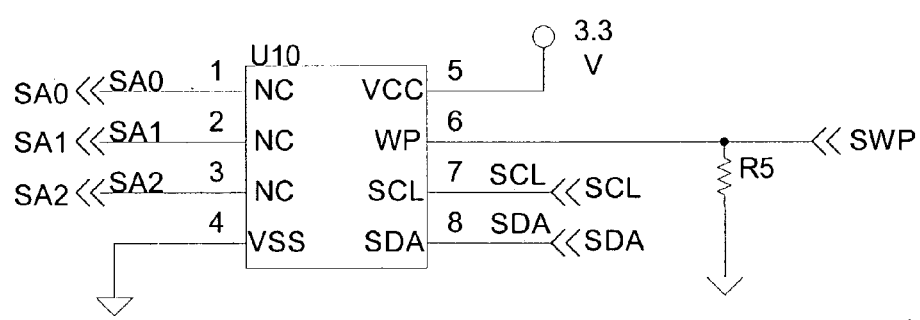
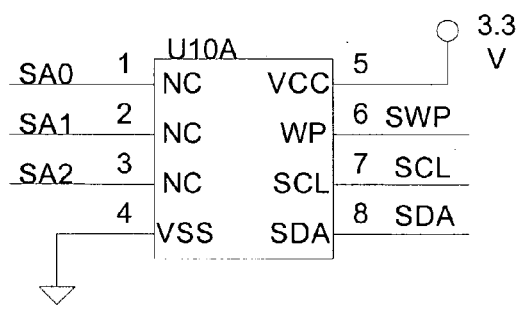

PATCHING METHODS AND APPARATUS FOR FABRICATING MEMORY MODULES

RELATED APPLICATIONS

The present application claims the filing date of U.S. Provisional Patent No. 60/360,036, filed on Feb. 26, 2002, and references the related U.S. patent application Ser. No. 10/371,800, entitled "Improved Methods and Apparatus for Fabricating Chip-on-Board Modules," filed Feb. 20, 2003, both of which are herein incorporated by this reference.

TECHNICAL FIELD

Selected embodiments of the present invention relate to the field of electronic memory modules. More specifically, the selected embodiments relate to the fabrication of memory modules that selectively use operating segments of a plurality of less-than-perfect chips or packages exclusively, or in combination with perfect ones.

BACKGROUND

Semiconductor manufacturing processes have become increasingly more complex. From the beginning with the creation of discrete transistors and other semiconductor devices through subsequent medium and large scale integrated devices, the number of transistors or independent elements we can fit on to a semiconductor chip has grown exponentially each year. For example, the first integrated processors comprised on the order of 2300 transistors. A recently announced integrated circuit processor comprises more than 220 million transistors. Other circuits are projected to contain over 1 billion transistors in the foreseeable future.

This continued exponential growth of semiconductor manufacturing processes, while contributing to the greatly decreased costs of individual semiconductor devices and products has also exacerbated many production and testing problems associated with commercial semiconductor manufacturing processes. The substantial increase in the density of electronic circuits in the semiconductor integrated manufacturing processes has resulted in the production of many more less-than-perfect semiconductor die or chips. This increase in the production of less than perfect chips and die has spawned a new market for electronic component sellers who find ways to utilize less-than-perfect chips or die to assemble working components.

In recent years, advancements in memory technology have resulted in several varieties of improved memory chips. These memory chips include chips that provide higher density memory, new control signals, and simplified input/output control. Consequently, memory products which employ a new variety of partially-defective and flawless memory parts, enable new patching processes and techniques, which are different from those disclosed in U.S. Pat. No. 6,119,049.

In summary, there is an ongoing need in the art for means and methods of producing low cost semiconductor devices, particularly memory modules. Related to this is an ongoing need to make use of modem, common-use semiconductor devices that are partially-defective so that such devices are not completely wasted.

SUMMARY OF SELECTED EMBODIMENTS

In one of many possible embodiments, the present invention provides a method for building a memory module using improved patching schemes. The method includes mounting multiple primary and secondary memory parts on a multi-layer circuit board, positioning I/O bit line patching networks adjacent to the primary and secondary memory parts, matching read/write control signals for primary and secondary memory parts which share I/O bit line patching networks, testing primary and secondary memory parts to identify non-operable I/O lines, and patching any non-operable I/O line of a primary memory part by replacing it with a fully operable I/O line of its associated backup memory part.

In another embodiment, a variety of memory modules are fabricated using multi-layer circuit boards, each using a conductive pathway for combining read/write control signals for each primary memory parts and its associated secondary memory part, and a number of I/O bit line patching networks.

BRIEF DESCRIPTION OF THE DRAWINGS

The accompanying drawings illustrate various embodiments of the present invention and are a part of the specification. Together with the following description, the drawings demonstrate and explain the principles of the present invention. The illustrated embodiments are examples of the present invention and do not limit the scope of the invention.

FIGS. 6A–6L are a schematic diagram illustrating a SDRAM DIMM memory module fabricated using a 8-to-1 I/O line patching networks according to one embodiment of the present invention.

Throughout the drawings, identical reference numbers designate similar, but not necessarily identical, elements.

DETAILED DESCRIPTION OF SELECTED EMBODIMENTS

The specification describes a method and apparatus for fabricating memory modules using I/O line patching networks. The method includes mounting multiple primary and secondary memory parts on a multi-layer circuit board, positioning I/O bit line patching networks adjacent to the primary and secondary memory parts, matching read/write control signals for primary and secondary memory parts which share I/O bit line patching networks, testing primary and secondary memory parts to identify non-operable I/O lines, and patching any non-operable I/O line of a primary memory part by replacing it with a fully operable I/O line of its associated backup memory part.

Figure 1A:
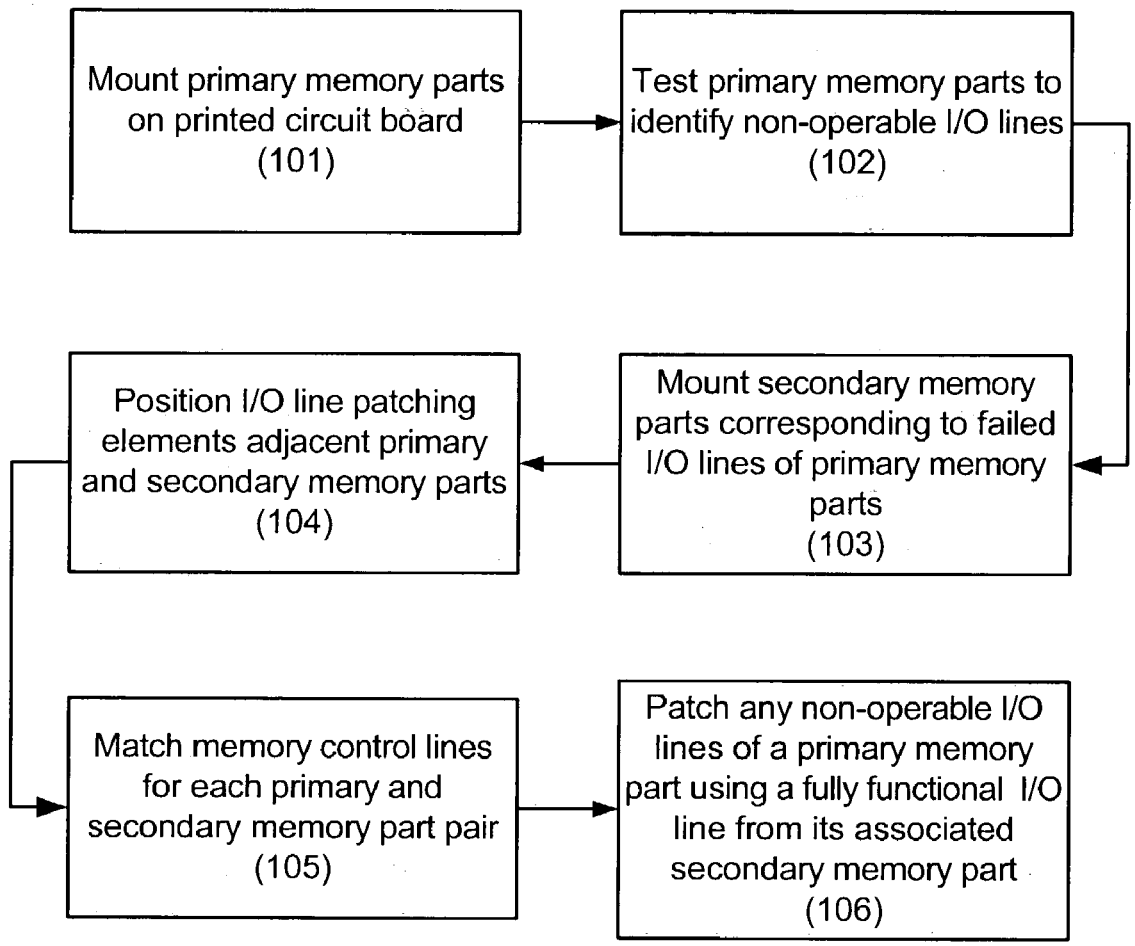
FIG. 1a is a flowchart illustrating a method for fabricating a memory module according to one embodiment of the present invention.

FIG. 1*a* is a flowchart illustrating a method of fabricating a memory module. As shown in FIG. 1*a*, primary memory parts are mounted on a multi-layer circuit board (step 101). This may be achieved by soldering the metallic leads of a memory part package to an appropriate set of pads on the multi-layer circuit board, or when using unpackaged memory parts, the mounting method described in U.S. patent application Ser. No. 10/371,800, entitled "Improved Methods and Apparatus for Fabricating Chip-on-Board Modules," may be used.

After the primary memory parts are mounted (step 101), functionality tests are performed in order to identify non-operable I/O lines (step 102). After any I/O line failures of primary memory parts have been identified, pre-tested secondary memory parts whose operable I/O lines "match" the failed I/O lines of the primary memory parts are mounted on the printed circuit board (step 103). In one example of a "matched" primary and secondary memory part, the primary memory part may have I/O lines 1, 2, 3, 4, 5, 6, 7, and 8, with I/O line 3 identified as non-operable. Therefore, the secondary memory part would have an operable I/O line 3 in order to "match."

By positioning I/O line patching elements adjacent to primary and secondary memory parts (step 104) and matching memory control lines for each primary and secondary memory part pair (step 105), the patching of failed I/O lines of primary memory parts is facilitated (step 106). More specifically, any non-operable I/O line of a primary memory part may be patched using a fully-functional I/O line from its associated secondary memory part (step 106). The method shown in FIG. 1*a* may be used with "matched" primary memory parts that are flawless or nearly flawless and secondary memory parts that have corresponding operable I/O lines but may be otherwise defective.

Figure 1B:
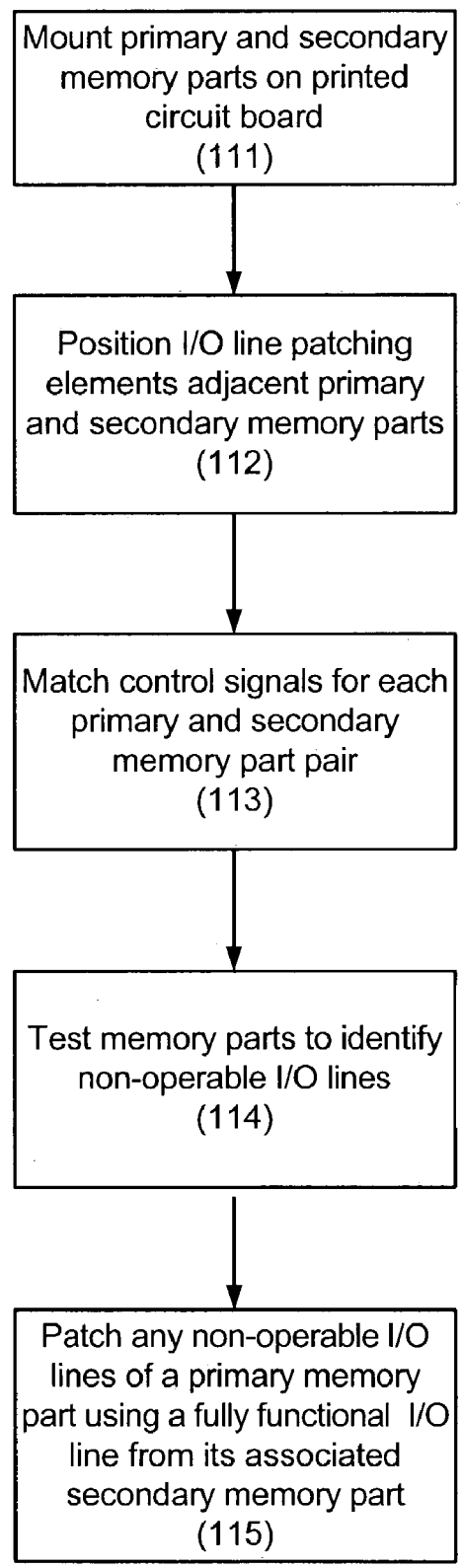
FIG. 1b is a flowchart illustrating a method for fabricating a memory module according to another embodiment of the present invention.

FIG. 1*b* is a flowchart illustrating a method of fabricating a memory module. As shown in FIG. 1*b*, primary and secondary memory parts may be mounted on a printed circuit board (step 111) at the same time. By positioning I/O line patching elements adjacent to primary and secondary memory parts (step 112) and matching memory control lines for each primary and secondary memory part pair (step 113), the patching of failed I/O lines of primary memory parts is facilitated (step 115).

In order to determine which primary I/O lines need to be patched and which I/O lines of secondary memory parts may be used for patching, functionality tests are performed for both primary and secondary memory parts (step 114). Using the test results, any non-operable I/O line of a primary memory part may be patched using a fully functional I/O line from its associated secondary memory part (step 115). In the selected embodiment of FIG. 1*b*, "matching" primary and secondary memory parts is not required, but secondary memory parts should provide a sufficient number of operable I/O lines to patch a corresponding primary memory part.

Figure 2A:
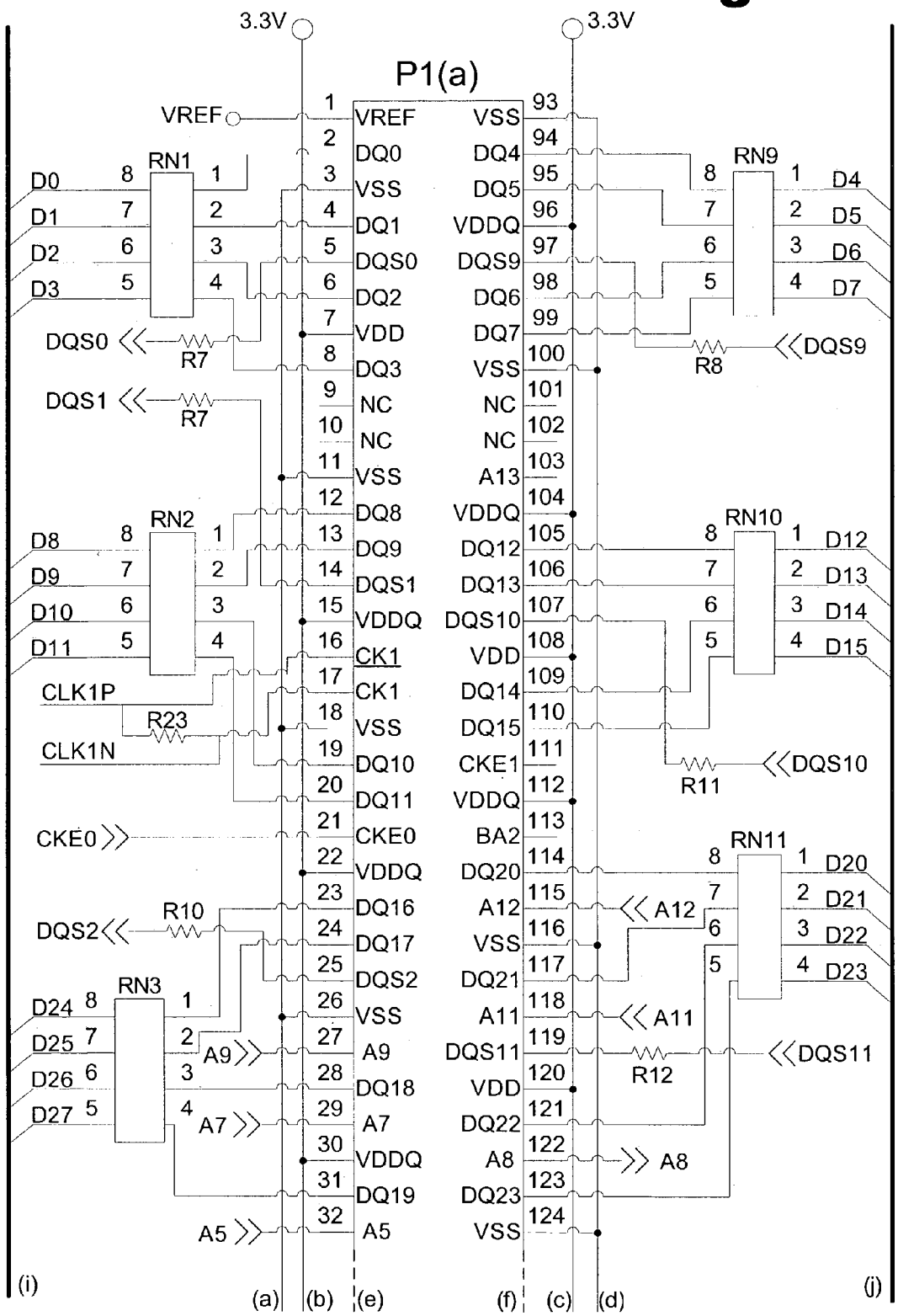
FIGS. 2A–2O are a schematic diagram illustrating an 8M×64 DDRAM DIMM memory module with 2-to-1 patching according to one embodiment of the present invention.

FIGS. 2A–2O are a schematic diagram illustrating an 8M×64 Double Data Random Access Memory (DDRAM) Dual Inline Memory Module (DIMM) with 2-to-1 patching. As shown in FIGS. 2A–2O, a variety of signals, comprising power supplies, clocks, ground, control signals, addressing signals, I/O lines, etc., are transferred between the memory module and a host device, e.g., a computer, capable of providing the signals necessary for the memory parts (U1–U8, U10–U17) to operate.

Figure 2B:
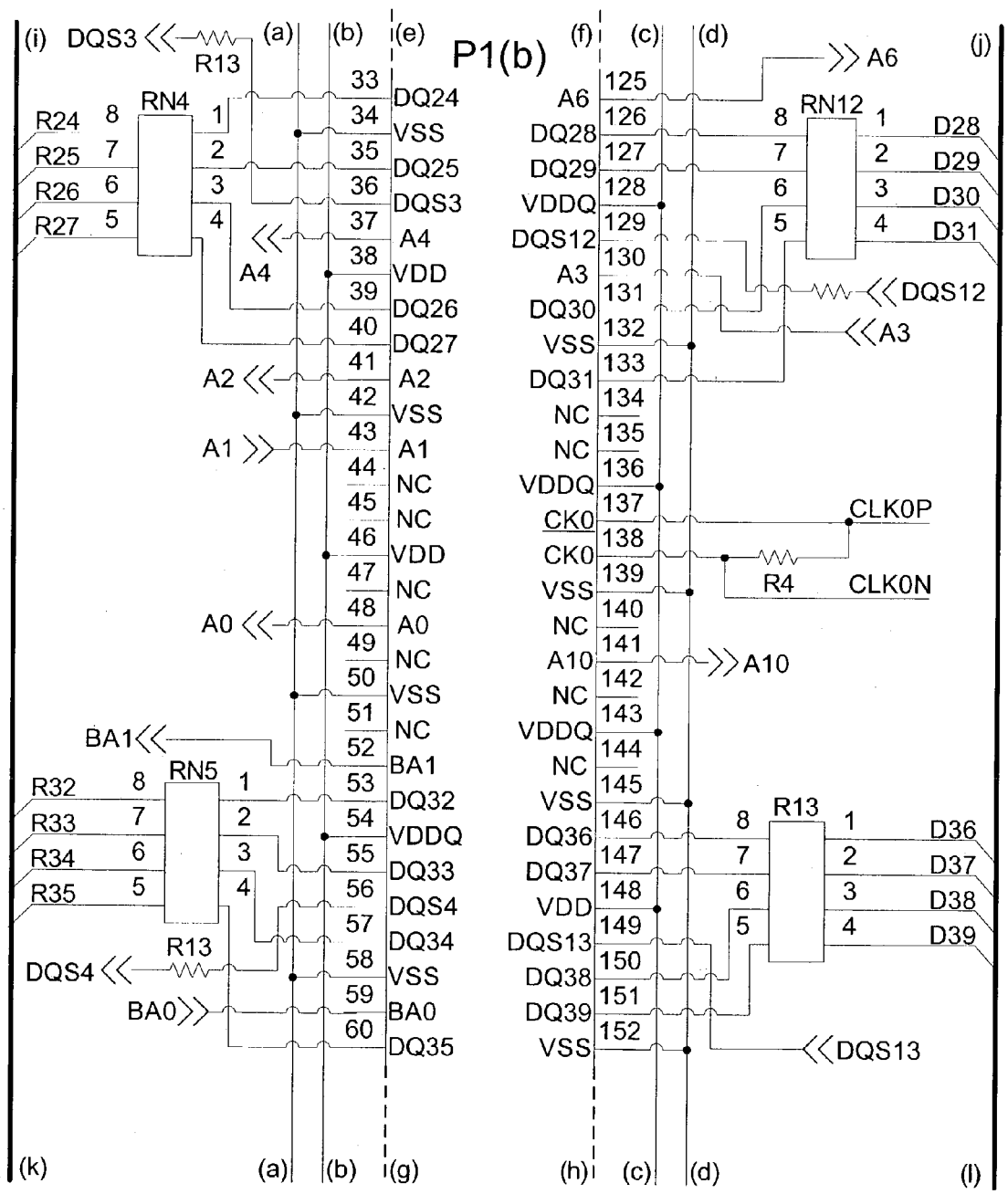
Figure 2C:
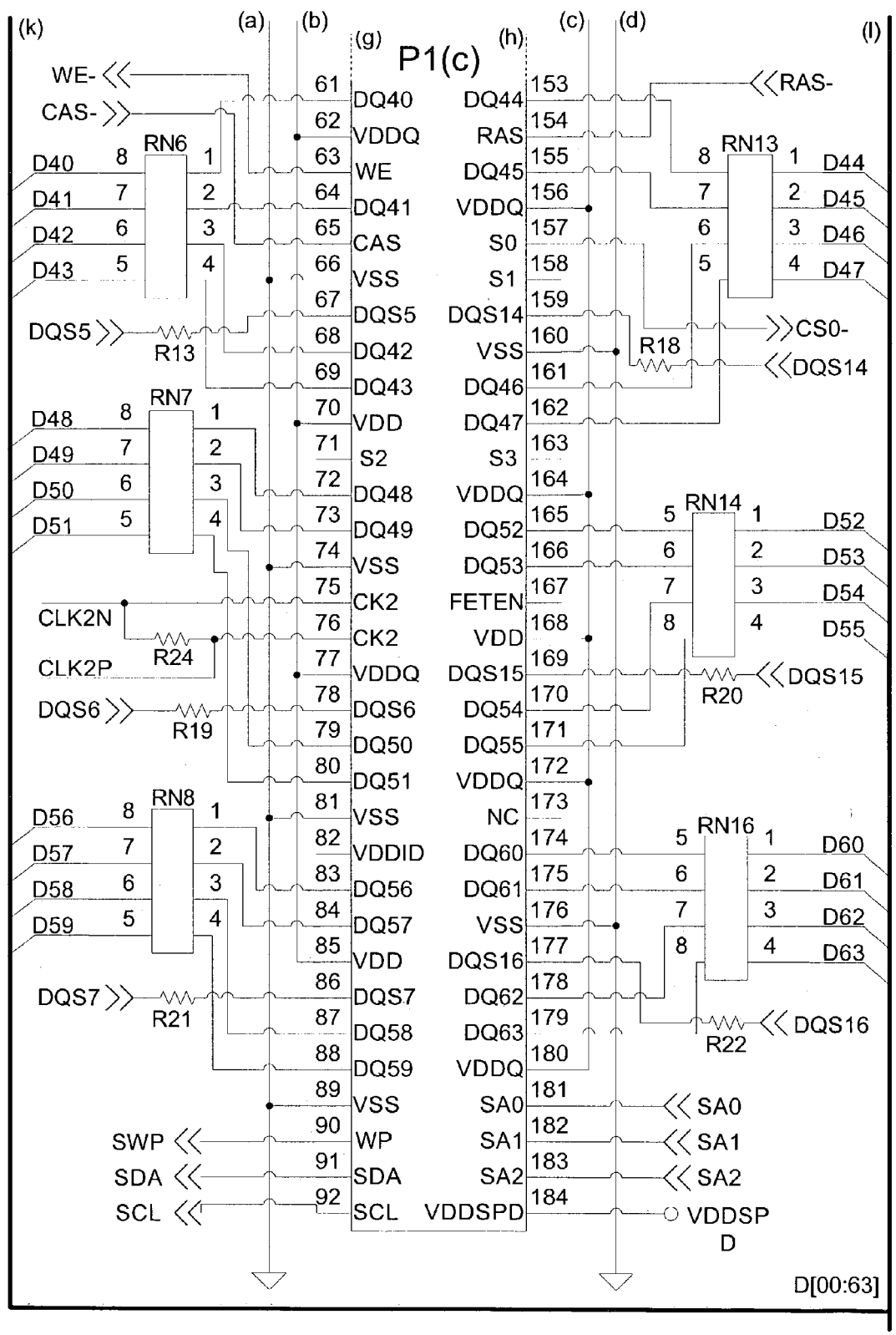
Figure 2D:
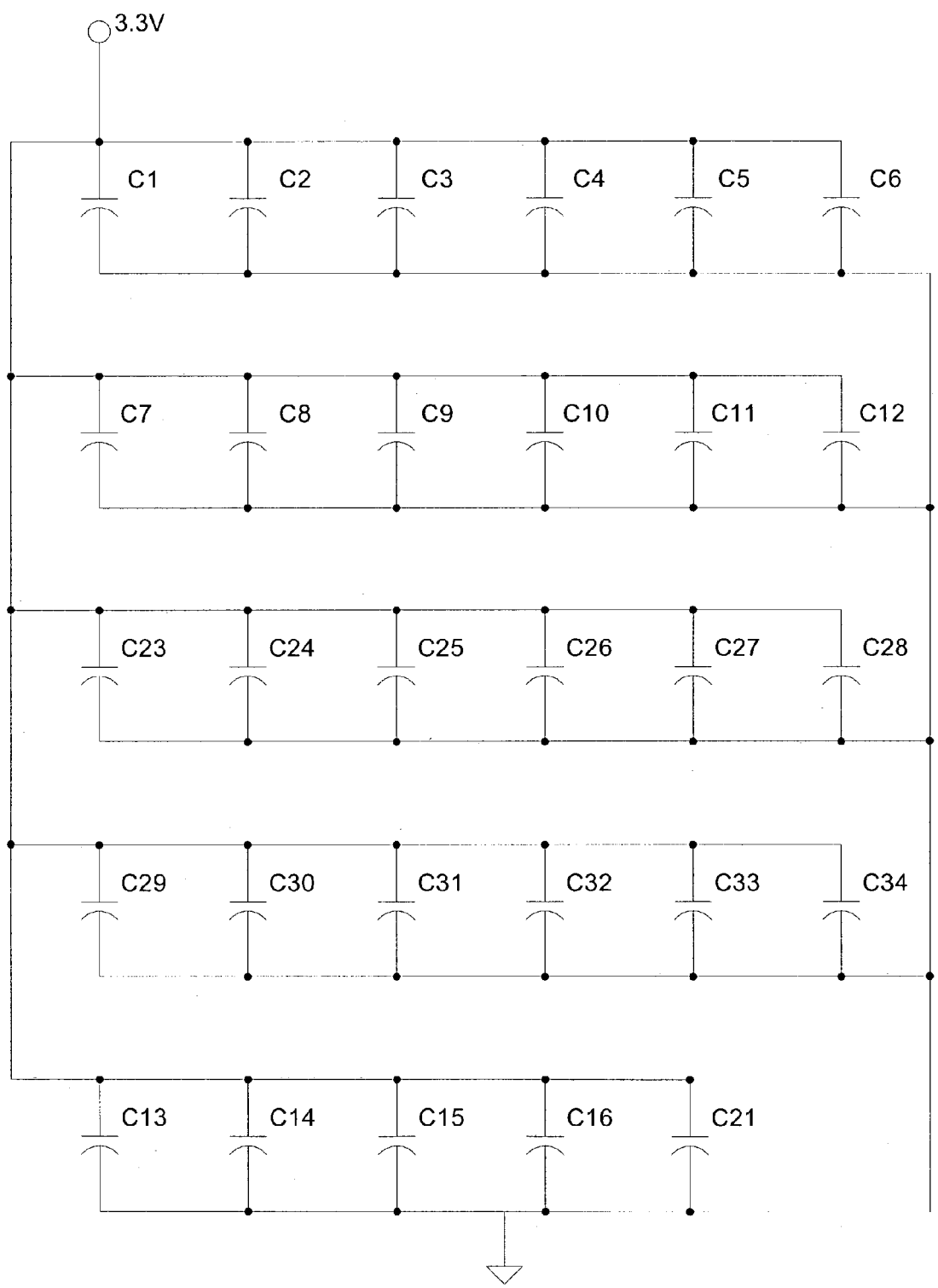
Figure 2E:
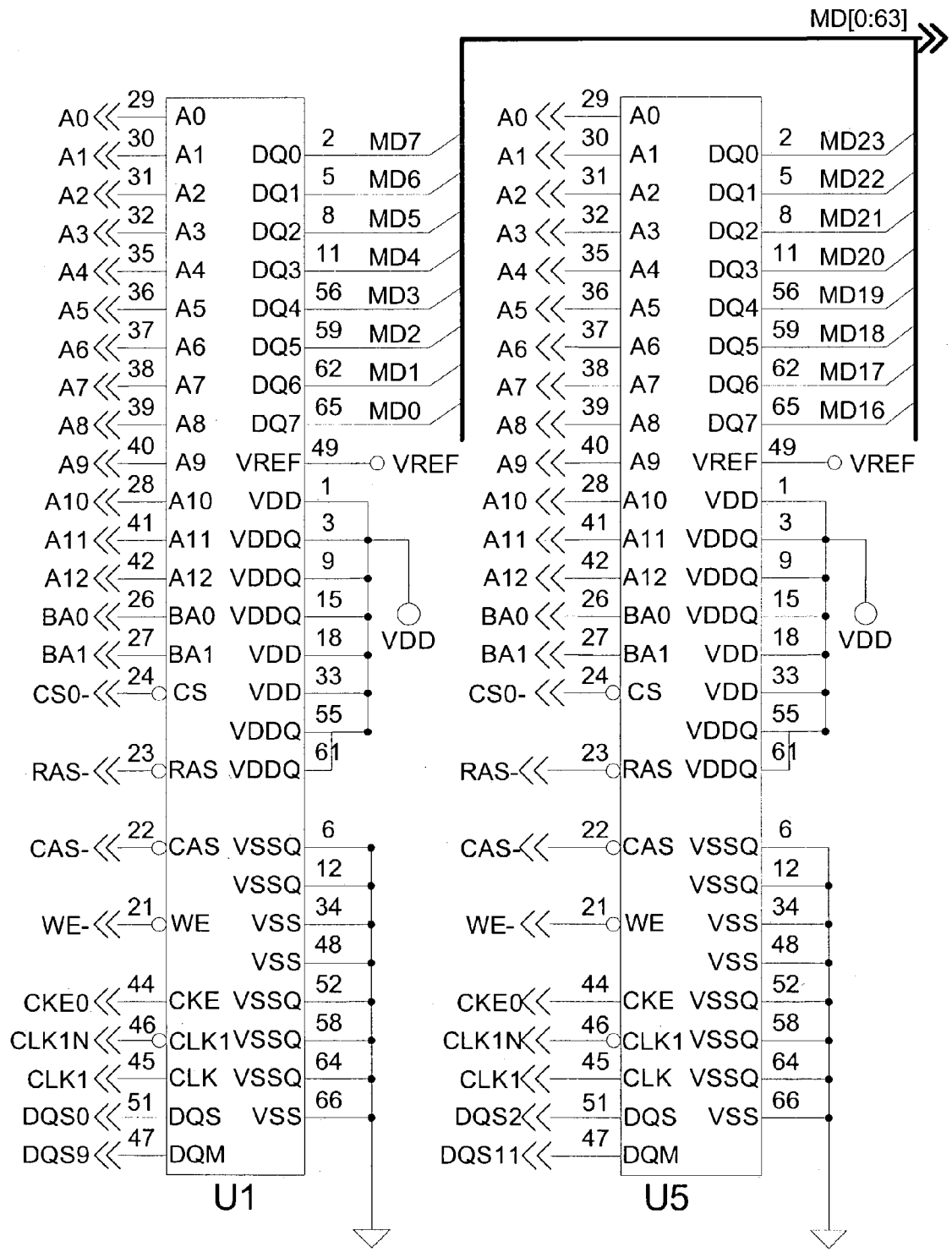
Figure 2F:
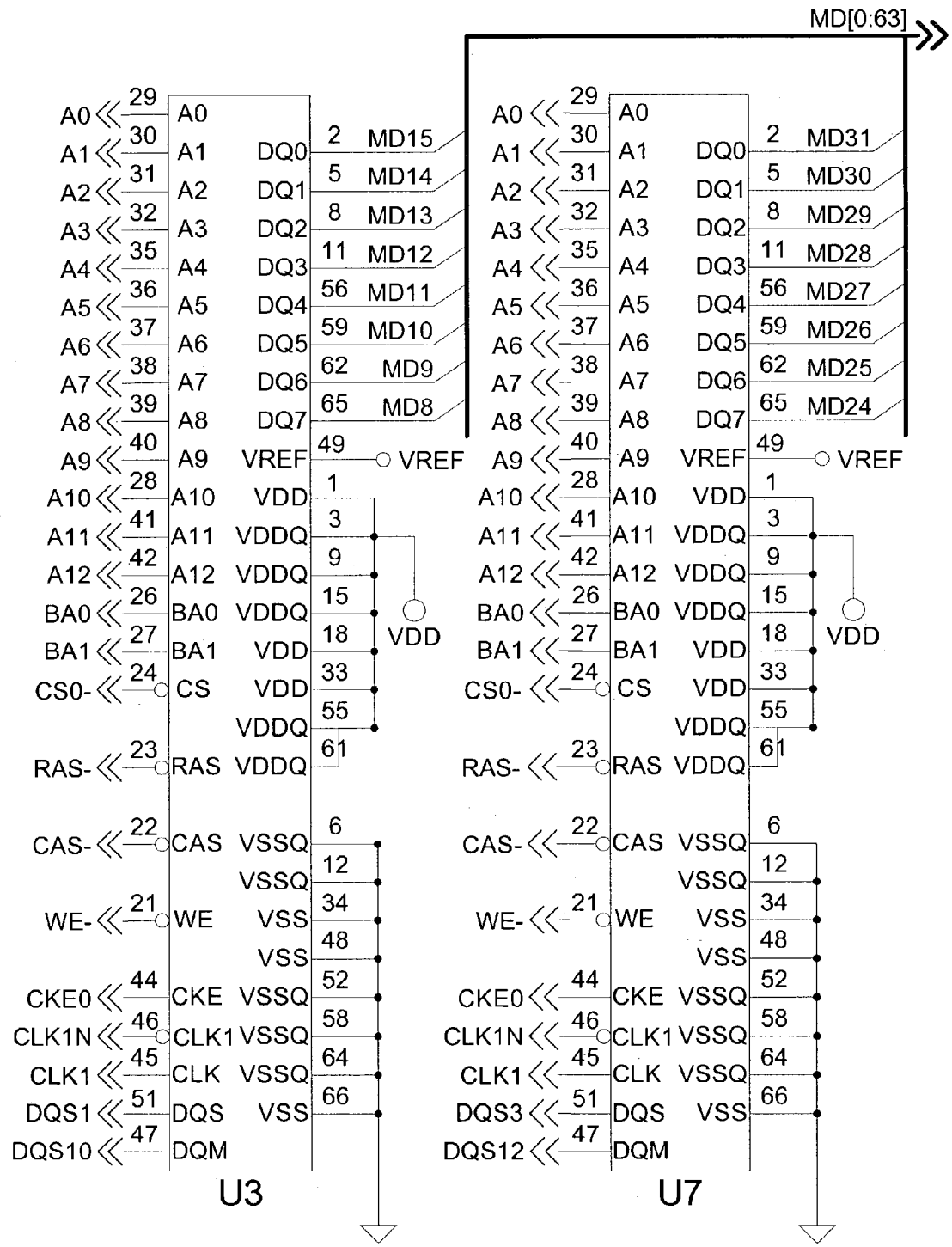
Figure 2G:
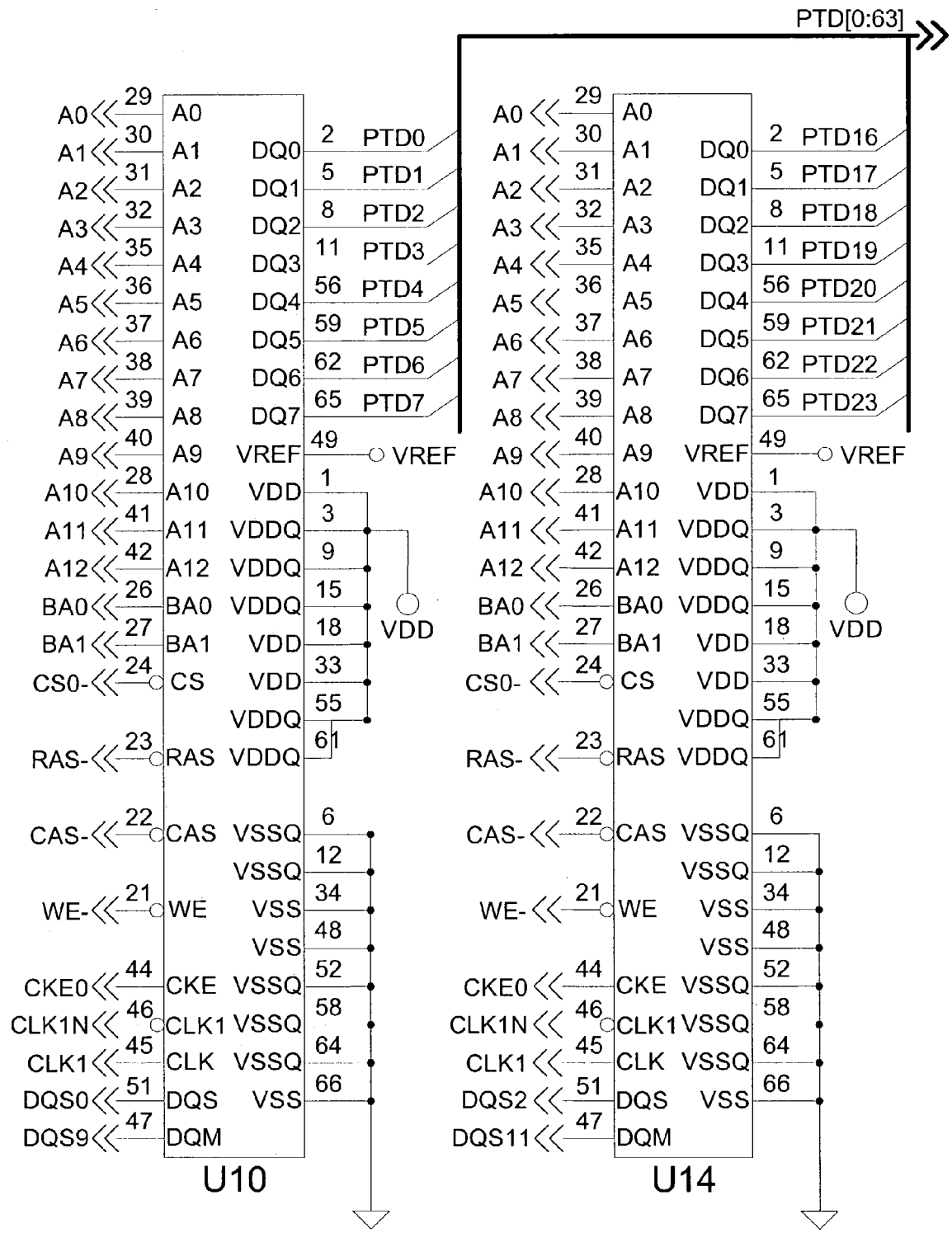
Figure 2H:
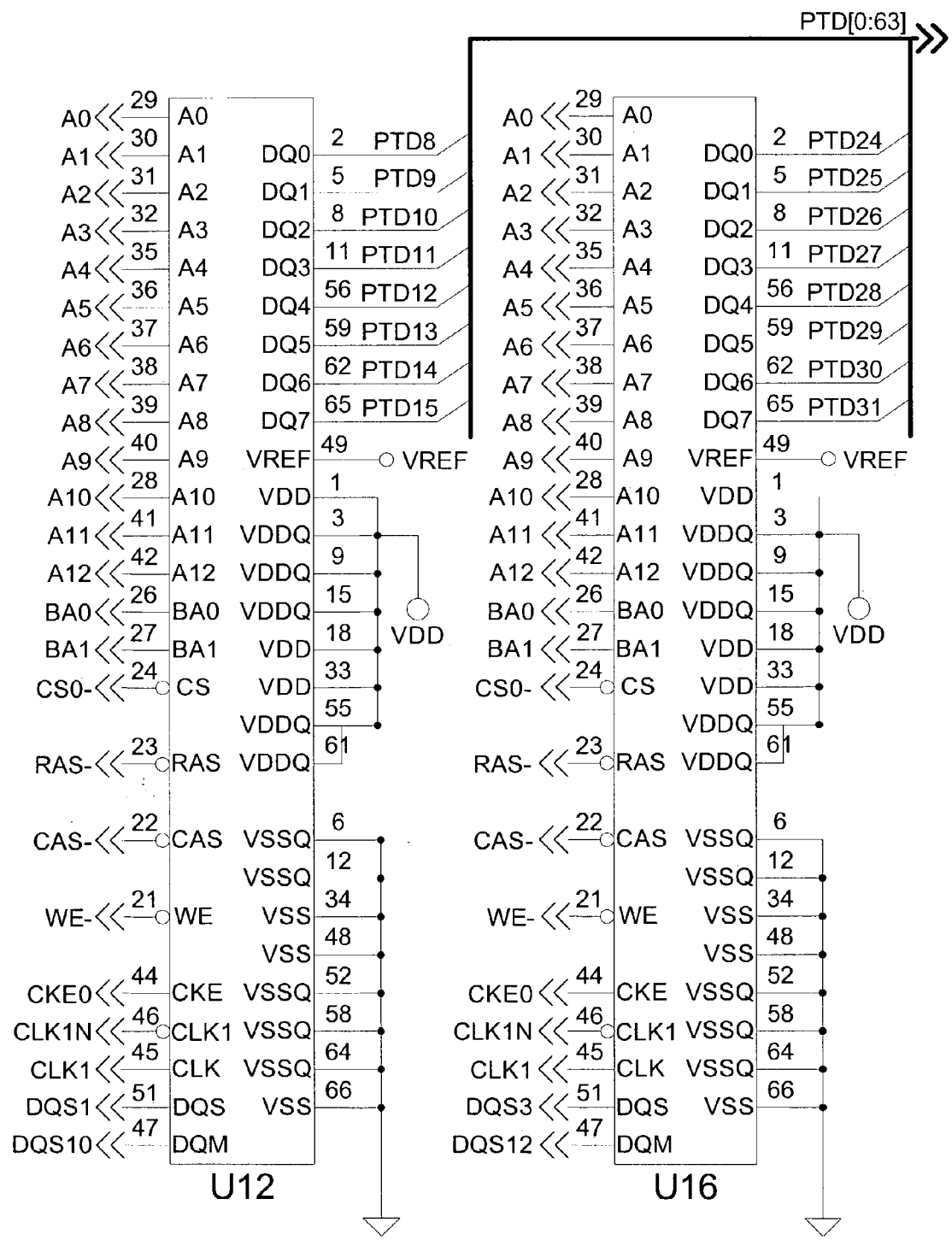
Figure 2I:
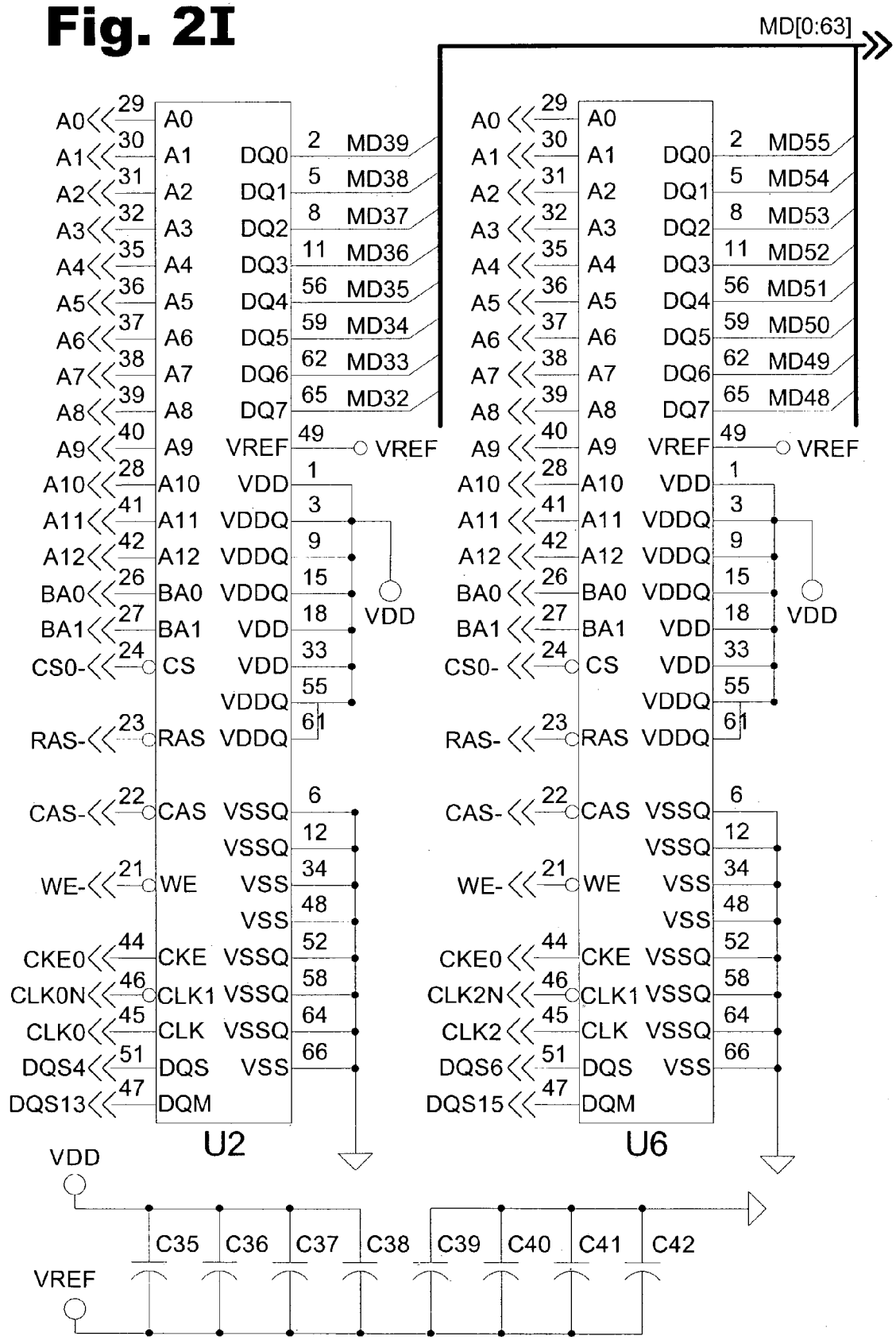
Figure 2J:
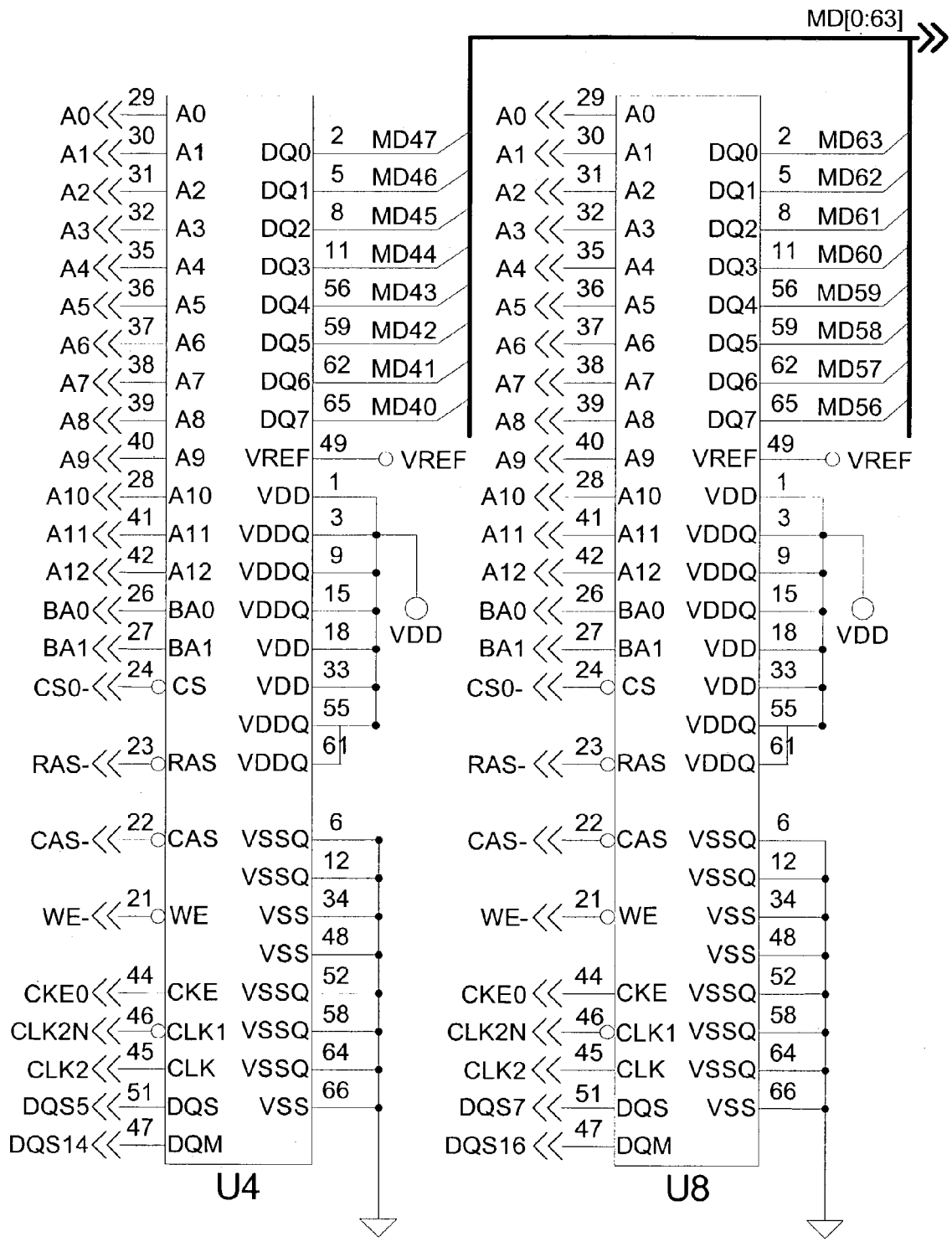
Figure 2K:
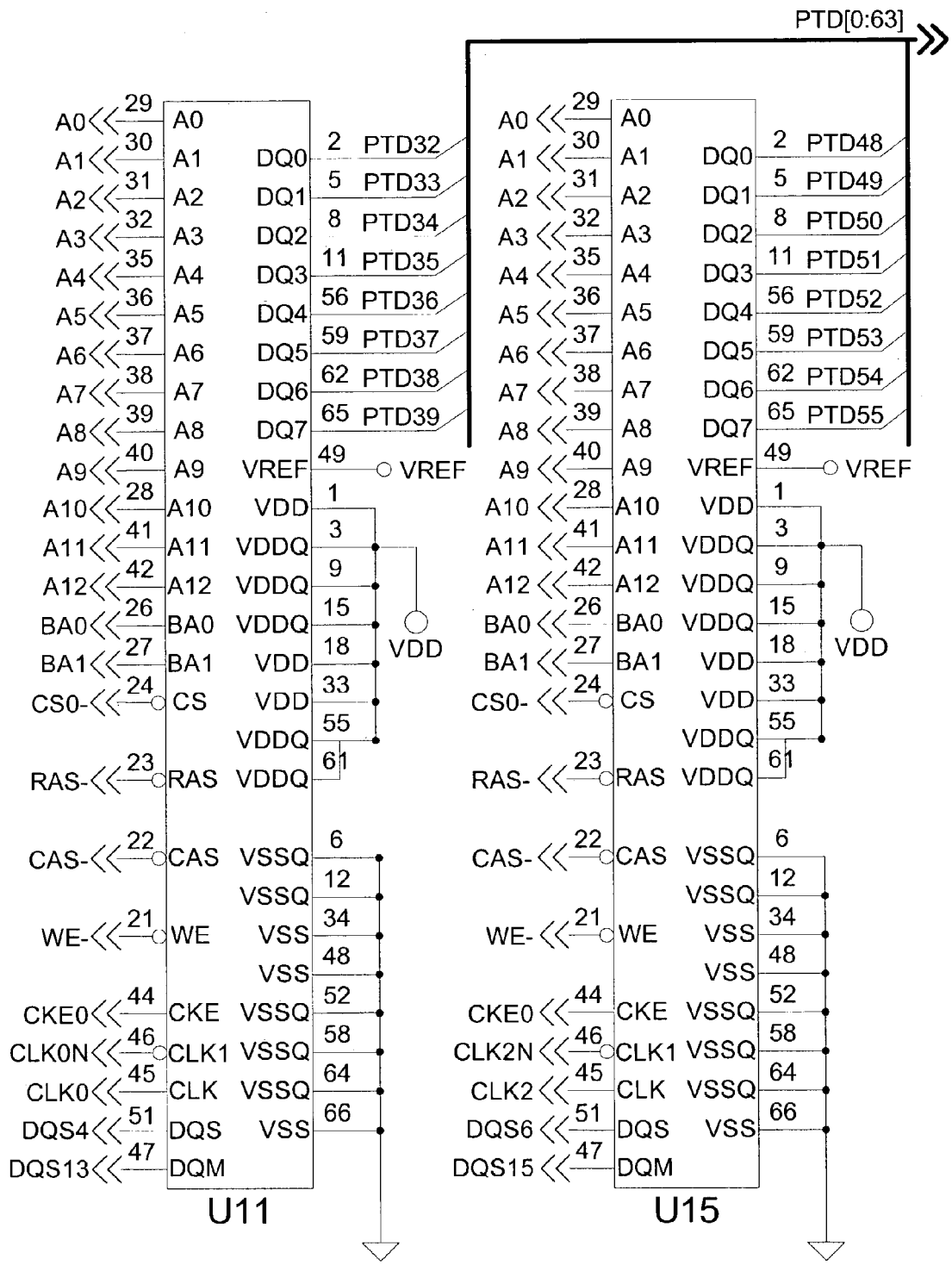
Figure 2L:
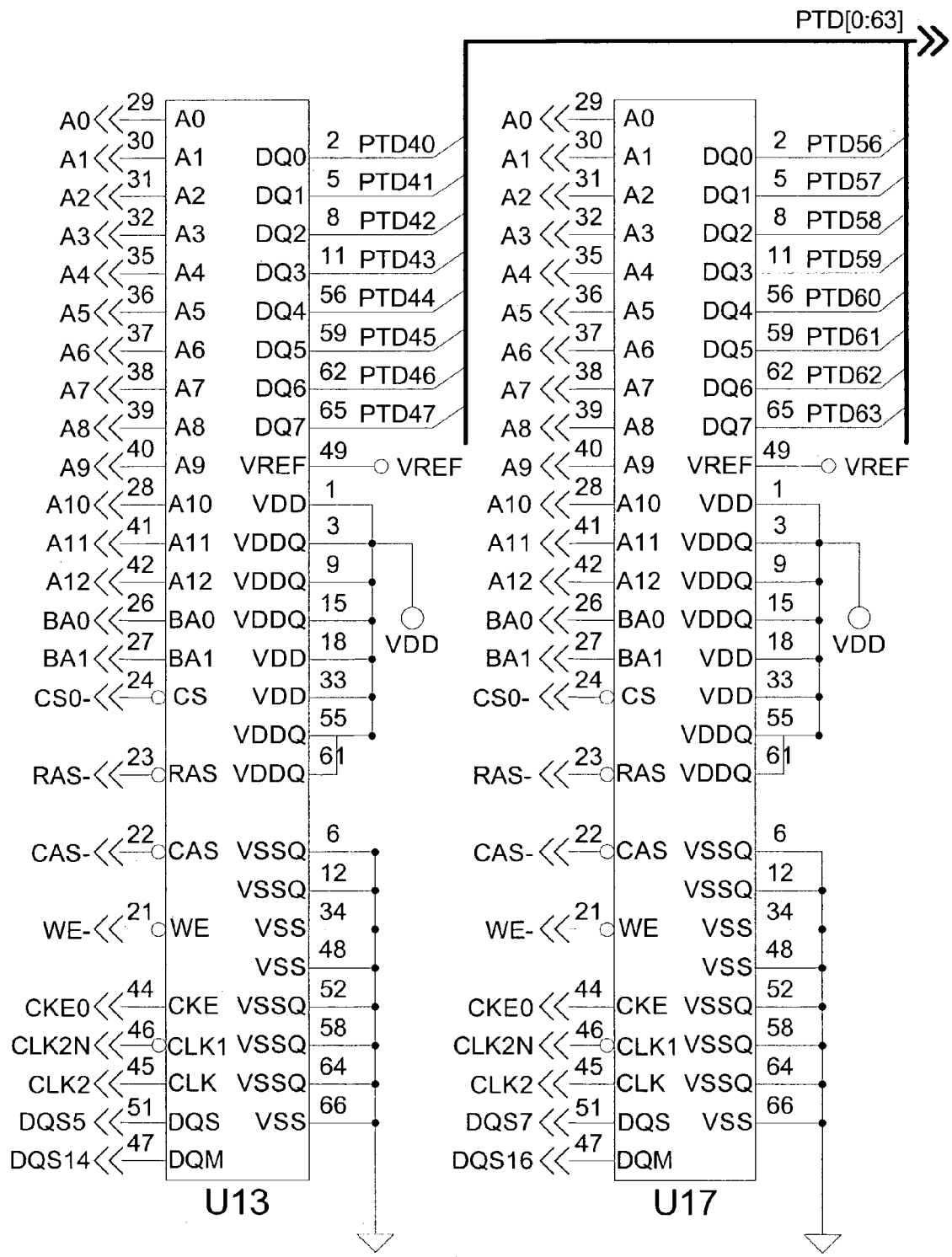

As shown in FIGS. 2A–2C, a number of resistive networks (RN1–RN16) provide a buffer between the host device and memory parts for I/O output lines D0–D63. FIG. 2D shows a schematic diagram of an arrangement of capacitors used to remove noise from the power supply signal (3.3V in this exemplification). FIGS. 2E–2L are schematic diagrams of commercially available memory parts commonly used in the 8M×64 DDRAM DIMM patching application, and FIGS. 2M–2O are a schematic diagram of a 2-to-1 patching network.

The 16 memory parts, U1–U8 and U10–U17, used to build the 8M×64 module are each 8M×8 DDRAM memory parts. U1–U8 are "primary" memory parts, and U9–U17 are "secondary" memory parts. Since the desired finished product requires only 64 working outputs, only half of the 128 I/O bits provided by the 16 memory parts are needed to create the 8M×64 module. Alternatively, less than sixteen memory parts could be mounted on the circuit board as long as 64 working I/O outputs can be connected using the 2-to-1 single-bit patching network.

In this particular 2-to-1 implementation, each of the 64 I/O bits of the primary memory parts (MD[0–63]) is paired with one of 64 I/O bits of the secondary memory parts (PTD[0–63]). By connecting either of the paired 128 I/O bit lines to 64 I/O output lines (D[0–63]), a fully-functional 8M×64 memory module may be assembled.

Figure 2M:
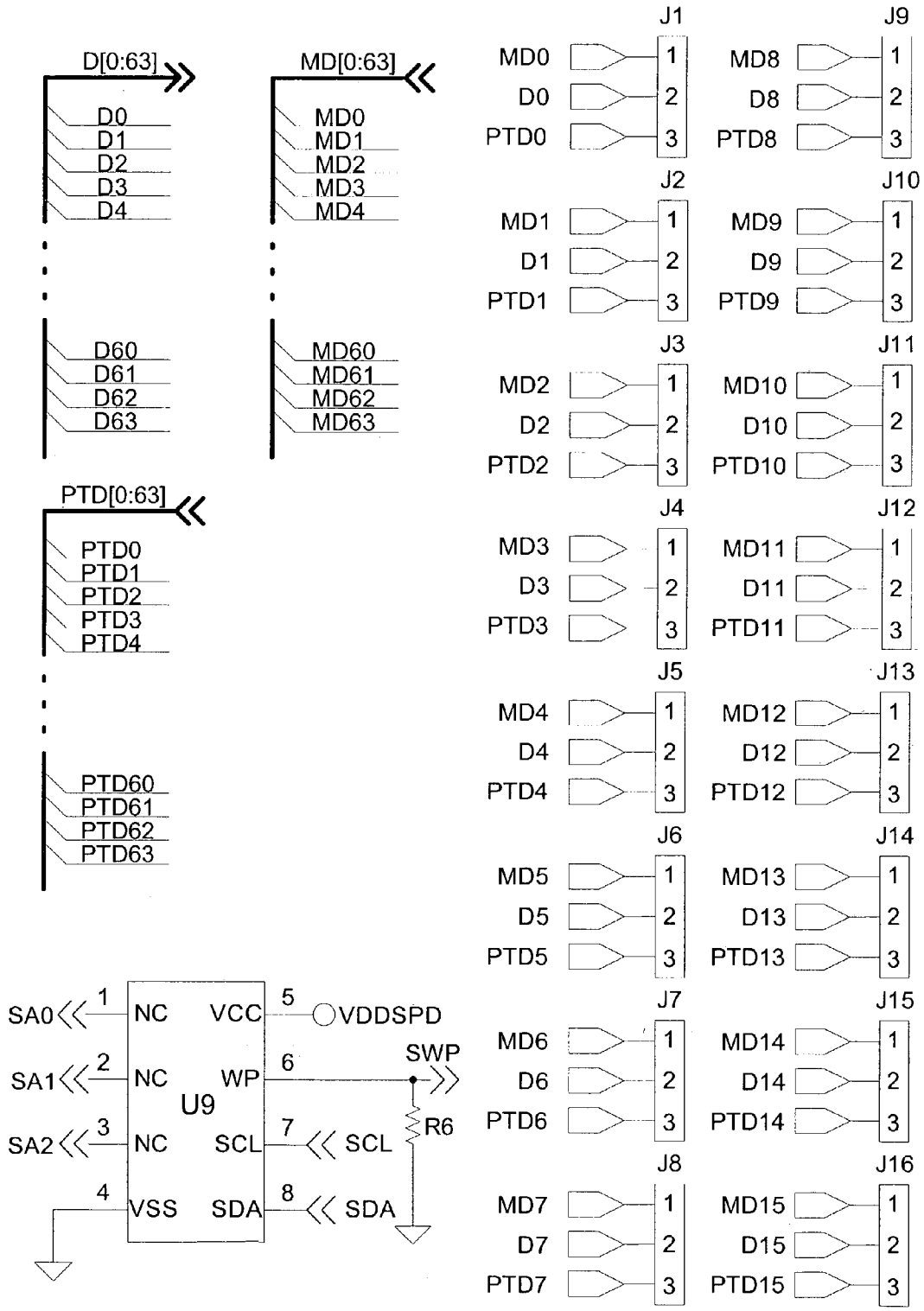
Figure 2N:
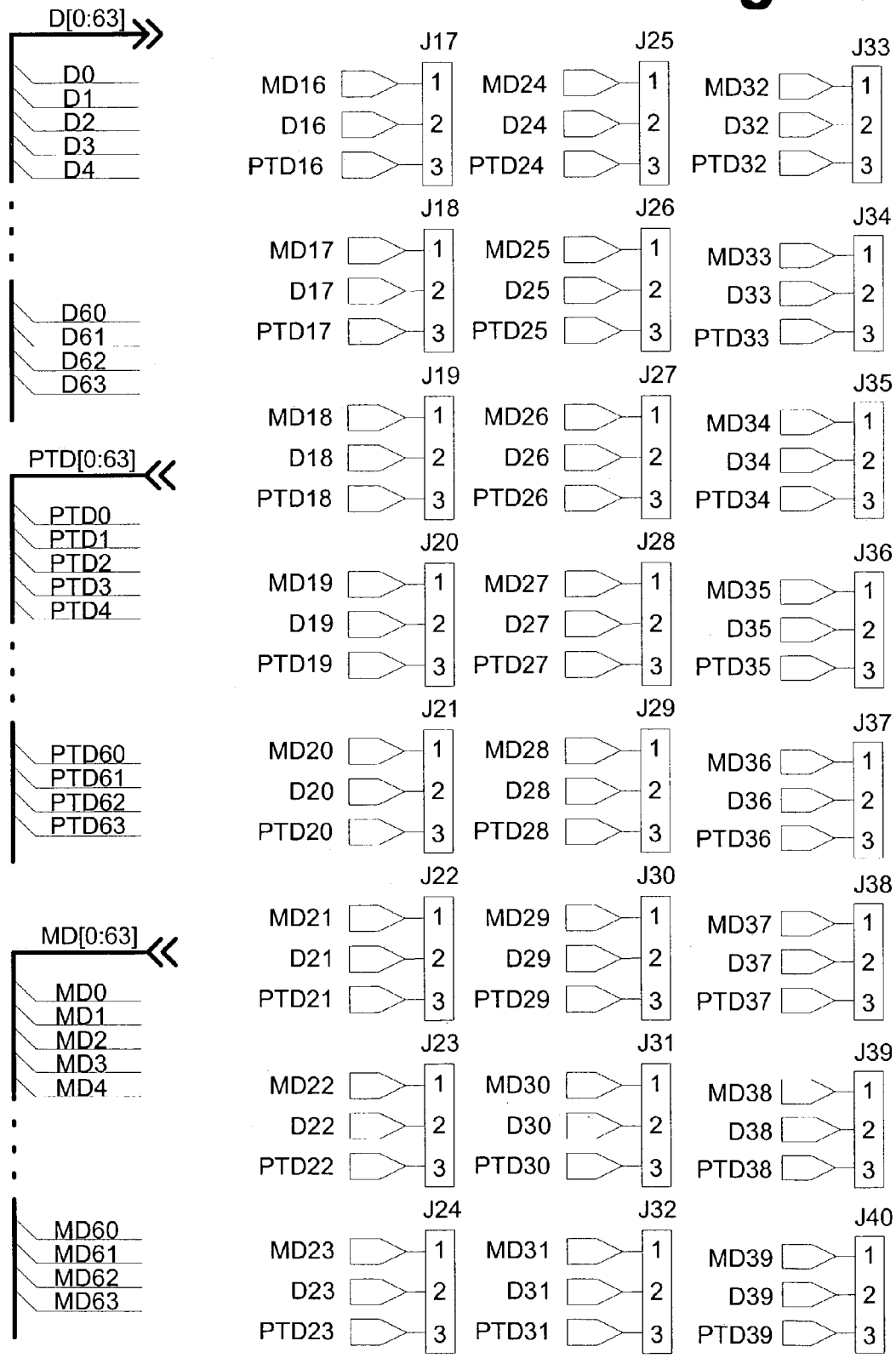
Figure 20:
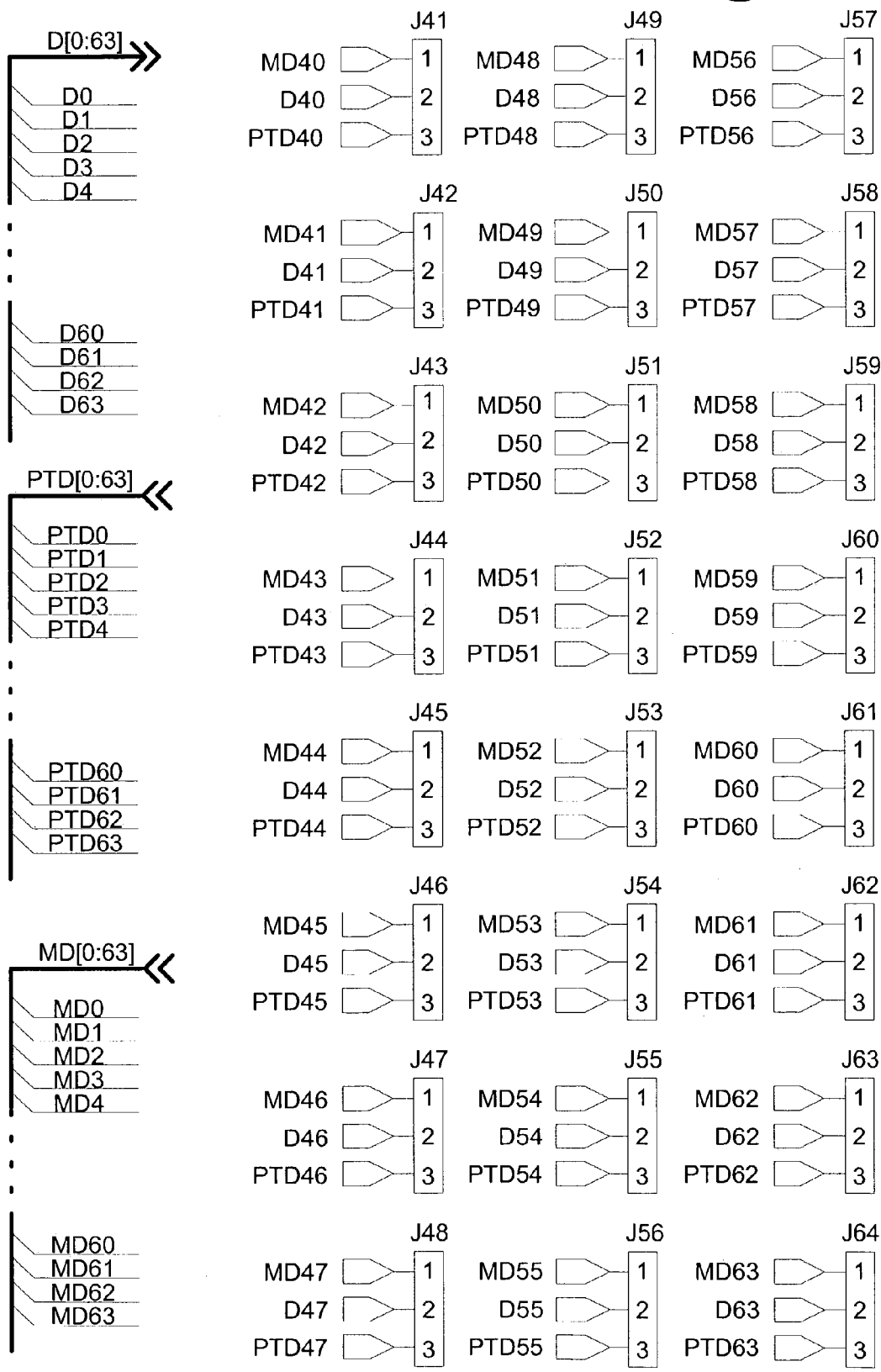

FIGS. 2M–2O illustrate a schematic diagram of a 2-to-1 patching network, utilizable to build the 8M×64 DDRAM DIMM. As shown in FIGS. 2M–2O, the primary I/O bits (MD[0:63]) and the secondary I/O bits (PTD[0:63]) are traced to a plurality of 3-pin connectors or junctions (J1–J64). Each 3-pin junction consists of a primary I/O bit line, a secondary I/O bit line, and an output I/O line. For example, J1, shown in FIG. 2M brings together MD0, D0, and PTD0. By connecting MD0 or PTD0 to D0 using solder-dots, jumper wire, etc., 1 of 64 I/O lines is completed. A more detailed illustration of the patching process will be described below.

In order to complete a functional 8M×64 module using the illustrated 2-to-1 patching network, all 64 I/O output lines, D0–D63, must be connected to a working I/O bit line. In some embodiments, this utilizes the, memory parts whose I/O bits are paired together, i.e., a primary memory part and a secondary memory part, to balance each other. For example, the I/O bits of primary memory part, U1 (shown in FIG. 2E) are pre-wired to be paired with the I/O bits of secondary memory part U10 (shown in FIG. 2G). In order for operable I/O lines of U10 to successfully patch failed I/O bits of U1, an exact match of working bits of the secondary memory part to failed bits of the primary memory part is preferred. More specifically, in the embodiment of FIGS. 2A–2O, if MD0 of U1 fails, then PTD0 of U10 is preferably functional in order for the 2-to-1 patching scheme to be optimized.

Alternatively, if MD0 of U1 and PTD0 of U10 are both failures, but MD1 of U1 and PTD1 of U10 are both functional, a jumper wire may be used to connect available backup I/O lines to I/O output lines, i.e., PTD1 could be used as a substitute for MD0 and PTD0 by using a jumper wire to connect PTD1 to D0, etc. In the embodiment shown in FIGS. 2A–2O, each memory part pair, e.g., U1 with U10, U2 with U11, U3 with U12, etc., provides eight working I/O bits using the 2-to-1 patching configuration. This is preferred because separate read/write control signals (DQM and DQS shown in memory parts U1–U8, U10–U17) are used for each memory part pair, thus allowing a host device to access 8 bits at a time.

More specifically, in the DDRAM embodiment shown in FIGS. 2E–2L, the primary memory parts U1, U2, U3, U4, U5, U6, U7, and U8 are matched with secondary memory parts U10, U11, U12, U13, U14, U15, U16, and U17, respectively. More specifically, each of the 8 I/O bits of U1 is paired with the one of 8 I/O bits of U10. Whereby, if a primary part I/O bit fails, the secondary part I/O bit matched to that particular primary I/O bit is preferably functional to use the pre-wired 2-to-1 patching configuration shown in FIGS. 2M–2O. The same is true for all other primary memory parts and corresponding secondary memory parts.

Additionally, each memory part (U1–U8, U10–U17) of FIGS. 2E–2L has separate control signals (DQS). The DQS control signals for each pair of primary and secondary memory parts are matched to enable simultaneous access to both parts. Thus no pair of primary and secondary memory parts utilizes the same control signals as another pair. For example, as shown by FIGS. 2E–2L, U1 and U10 use DQS signals, DQS0 and DQS9, whereas, U5 and U14 use DQS2 and DQS11, etc.

Figure 3A:
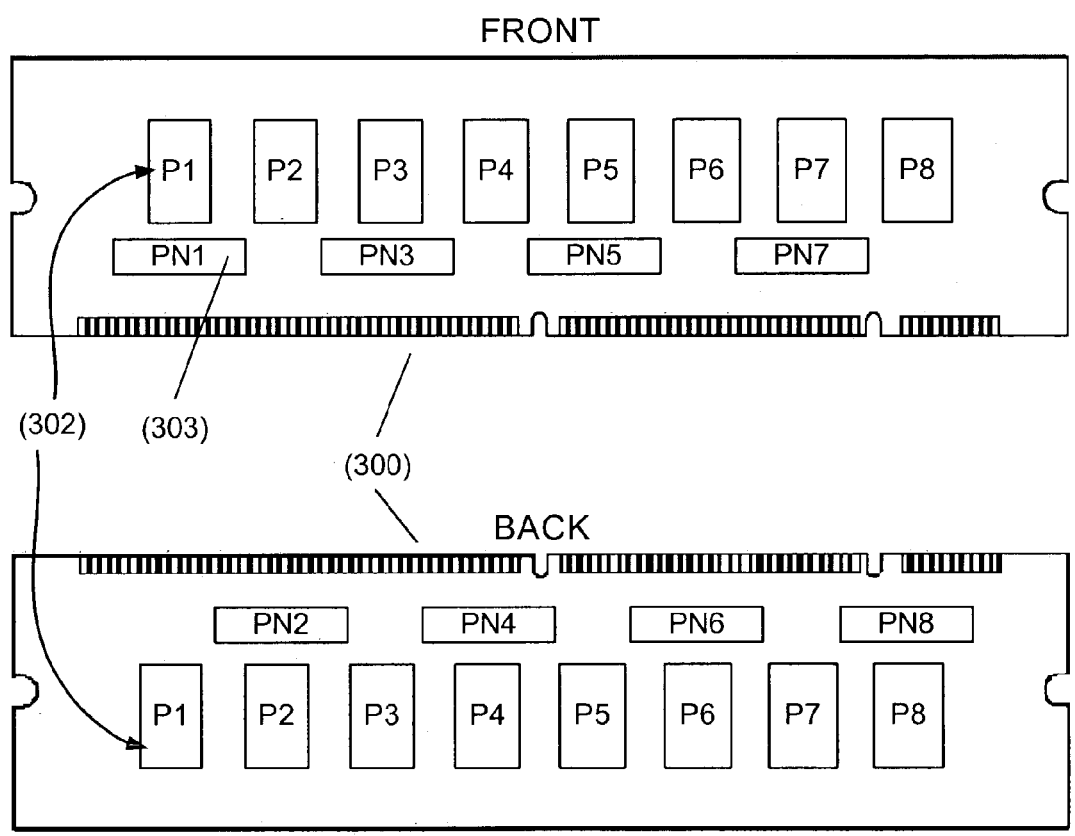
FIG. 3a is a block diagram illustrating a layout of major components of a memory module fabricated using 2-to-1 I/O line patching networks according to one embodiment of the present invention.

FIG. 3a is a block diagram illustrating a layout of major components of a memory module fabricated using 2-to-1 I/O line patching networks. As shown in FIG. 3a, memory parts (302) are mounted on the front and back of a multi-layer circuit board (300). More specifically, in the embodiment shown, 8 pairs (P1–P8) of memory parts (302), each pair consisting of one primary and one secondary memory part, are mounted on a multi-layer circuit board (300). For each memory part pair (P1–P8), a 2-to-1 I/O line patching network (303) is designated (PN1–PN8).

Figure 3B:
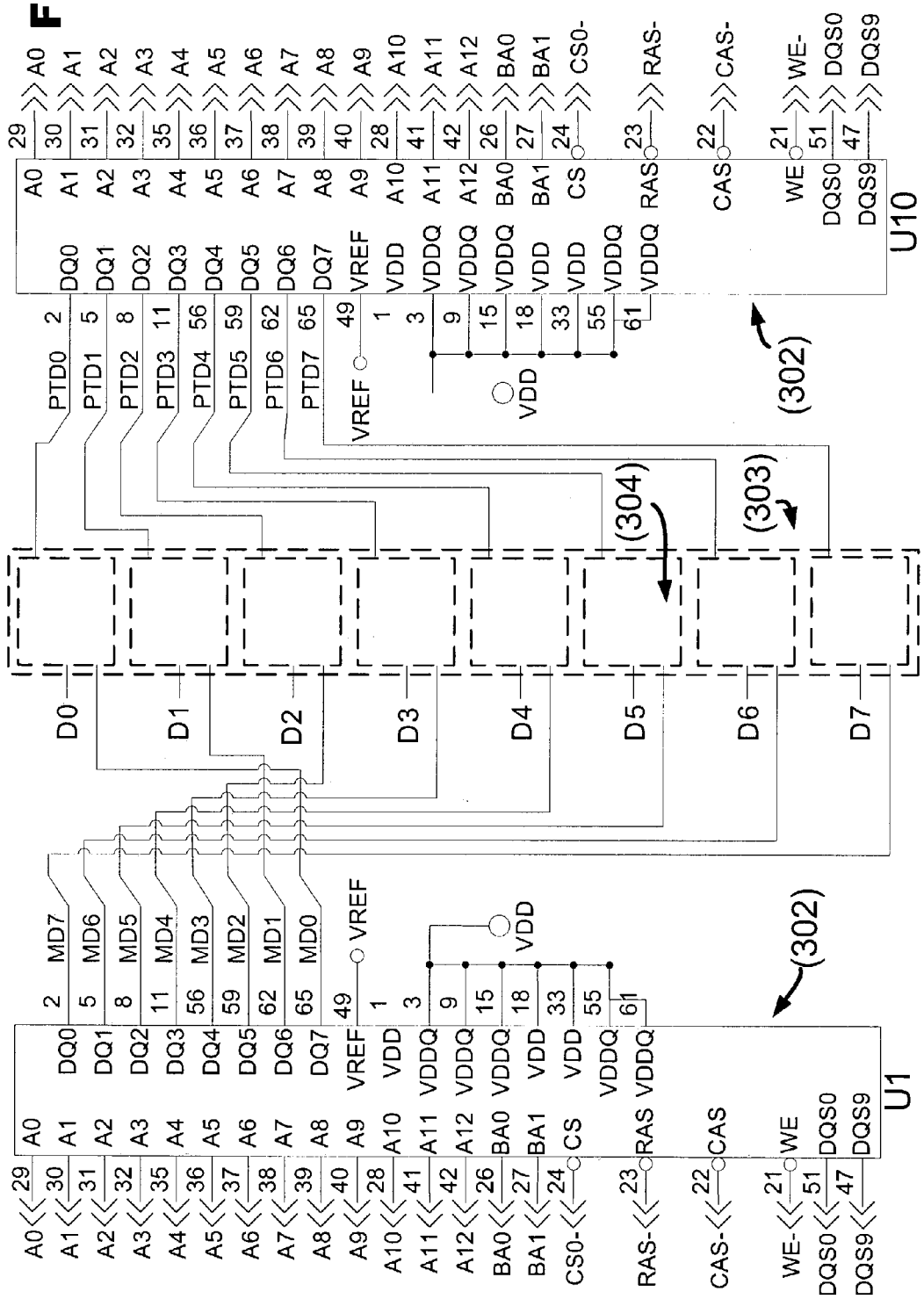
FIG. 3b is a block diagram illustrating a primary and secondary memory part in conjunction with a 2-to-1 I/O line patching network according to one embodiment of the present invention.

FIG. 3b is a block diagram illustrating a primary and secondary memory part in conjunction with a 2-to-1 I/O line patching network. In particular, FIG. 3b illustrates a memory part (302) pair, U1 and U10, as described in FIGS. 2A–2O. As shown in FIG. 3b, the primary I/O lines (MD0–MD7) of U1 and secondary I/O lines (PTD0–PTD7) of U10 are electrically connected to conductive pads (304) of a 2-to-1 patching network (303). Eight of the 3-pin connectors or junctions (J1–J8) described above for FIGS. 2A–2O are illustrated and may be used to connect primary I/O lines (MD0–MD7) or secondary I/O lines (PTD0–PTD7) to output I/O lines (D0–D7).

Figure 3C:
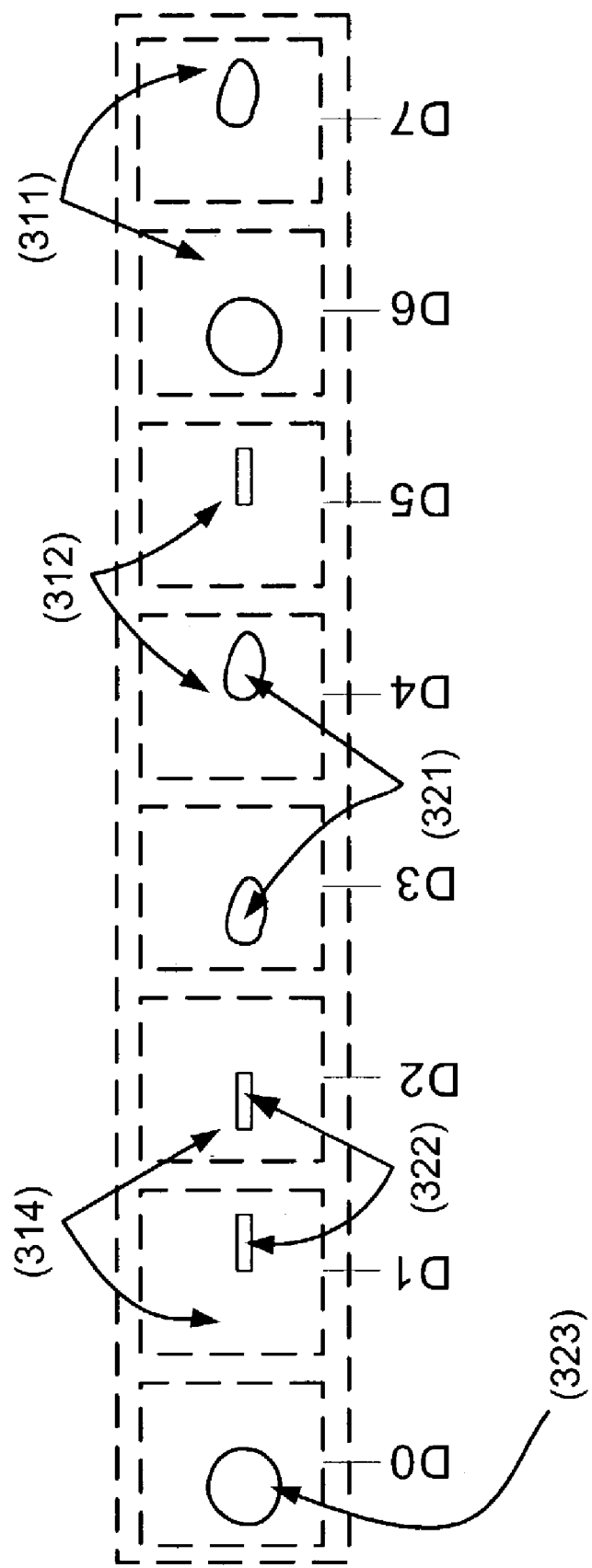
FIG. 3c is a block diagram illustrating a completed 2-to-1 I/O line patching network according to one embodiment of the present invention.

FIG. 3c is a block diagram illustrating a completed 2-to-1 I/O line patching network. In particular, FIG. 3c illustrates the completion of the 2-to-1 patching network (303) shown in FIG. 3b. As shown in FIG. 3c, a number of solder dots (321) and jumper wires (322) are used to electrically connect a primary I/O line pad (311) or secondary I/O line pad (314) to an output I/O line pad (312). U1 and U10 provide 8 working I/O lines (out of 16 possibilities). Additionally, a selectively settable material (323) may be used to protect solder dots (321) or jumper wires (322) from physical damage.

Figure 4A:
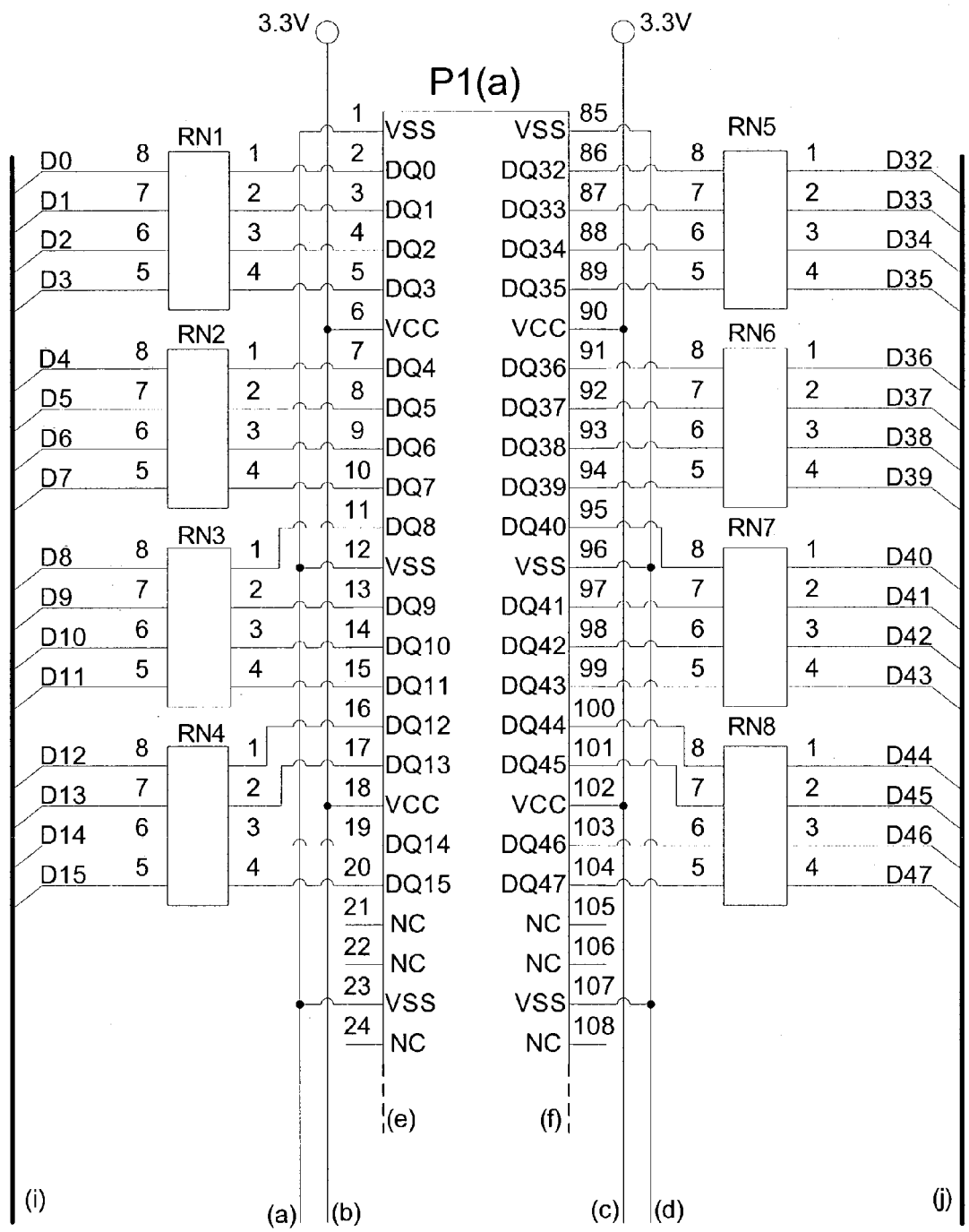
FIGS. 4A–4O are a schematic diagram illustrating a 128M×8 SDRAM DIMM memory module with 4-to-1 patching according to one embodiment of the present invention.

FIGS. 4A–4O are a schematic diagram illustrating a 128M×8 Synchronous Dynamic Random Access Memory (SDRAM) DIMM memory module with 4-to-1 patching. As shown in FIGS. 4A–4O, a variety of signals, comprising power supplies, clocks, ground, control signals, addressing signals, I/O lines, etc., are transferred between the memory module and a host device, e.g., a computer, capable of providing the signals necessary for the memory parts (U17–U32) to operate.

Figure 4B:
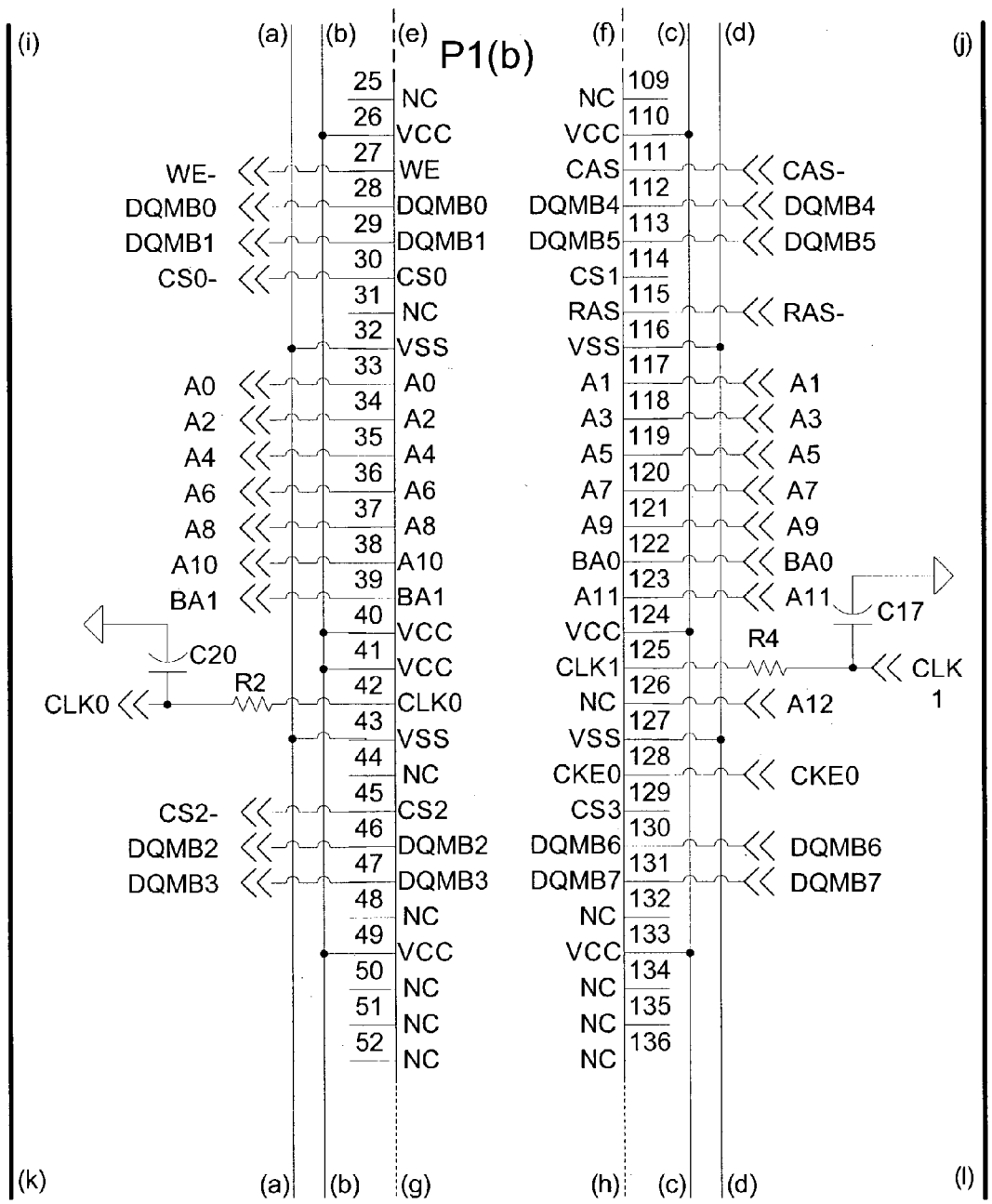
Figure 4C:
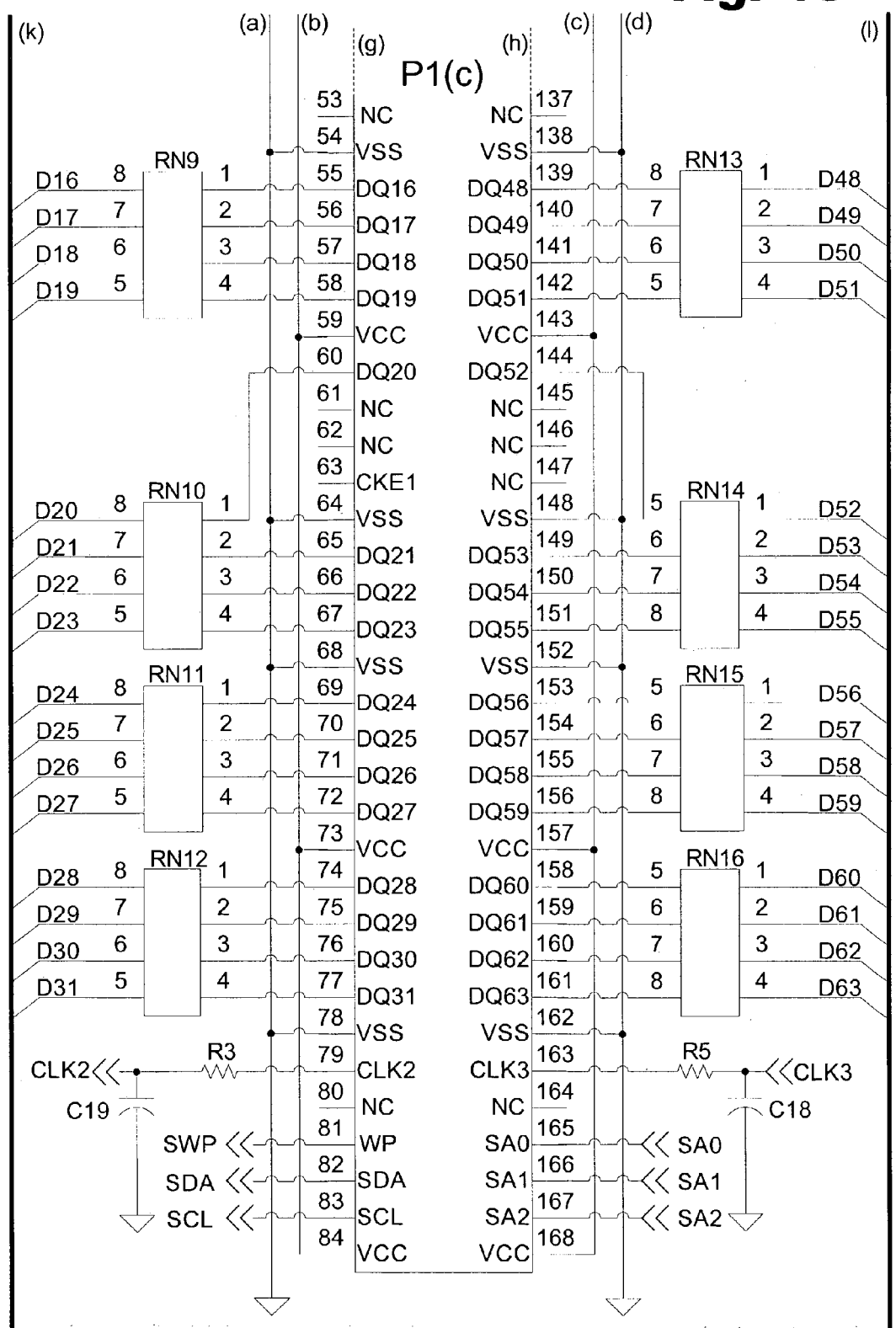
Figure 4D:
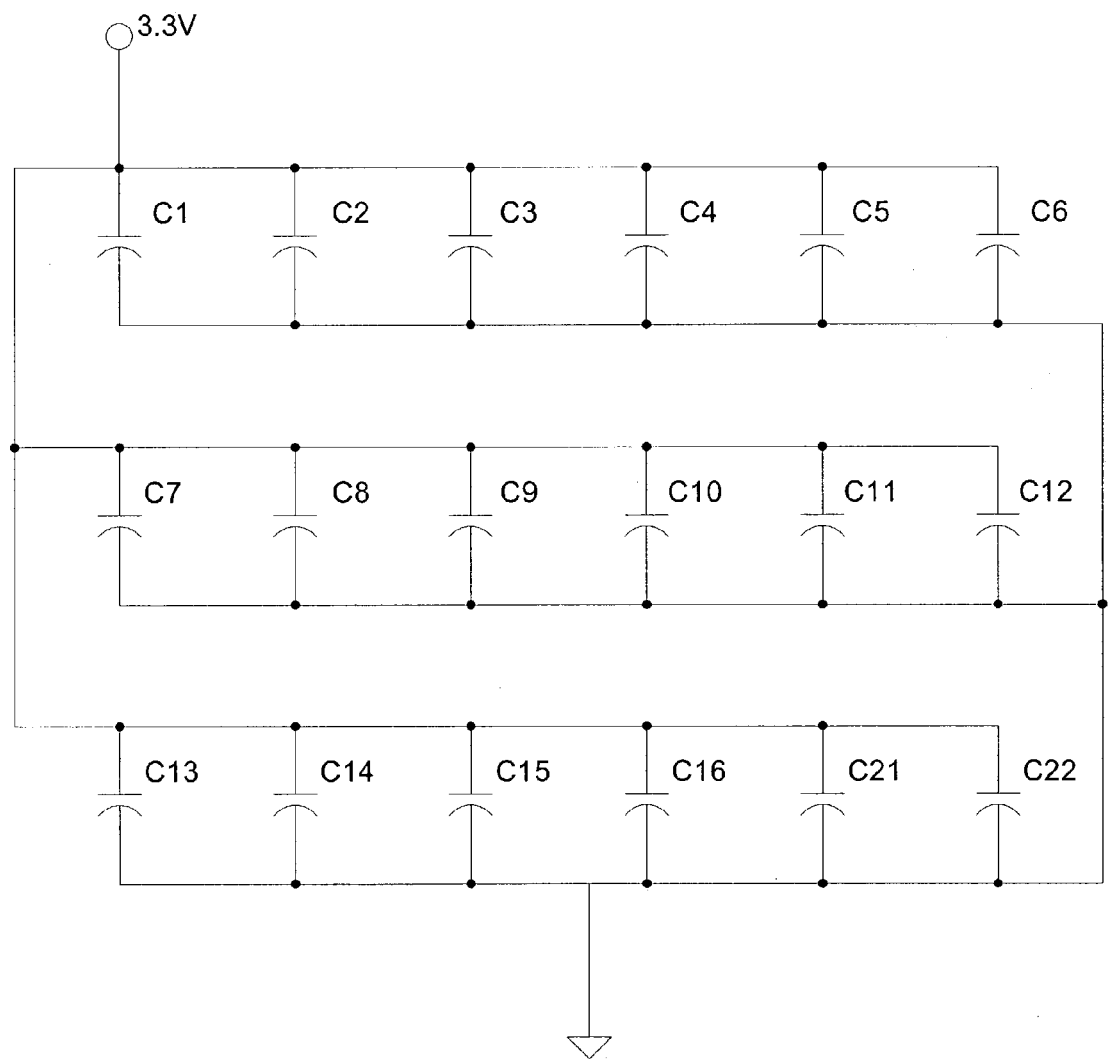
Figure 4E:
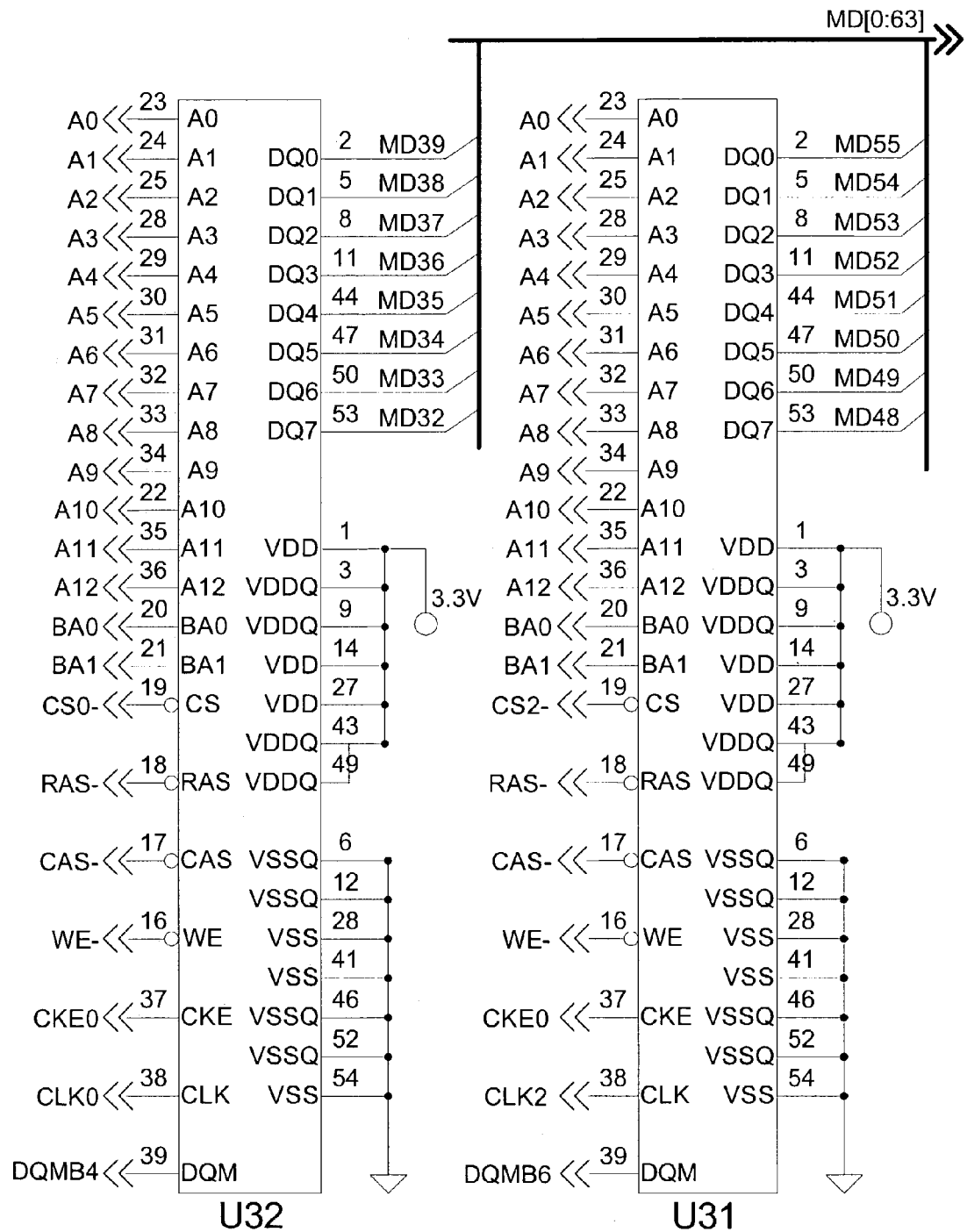
Figure 4F:
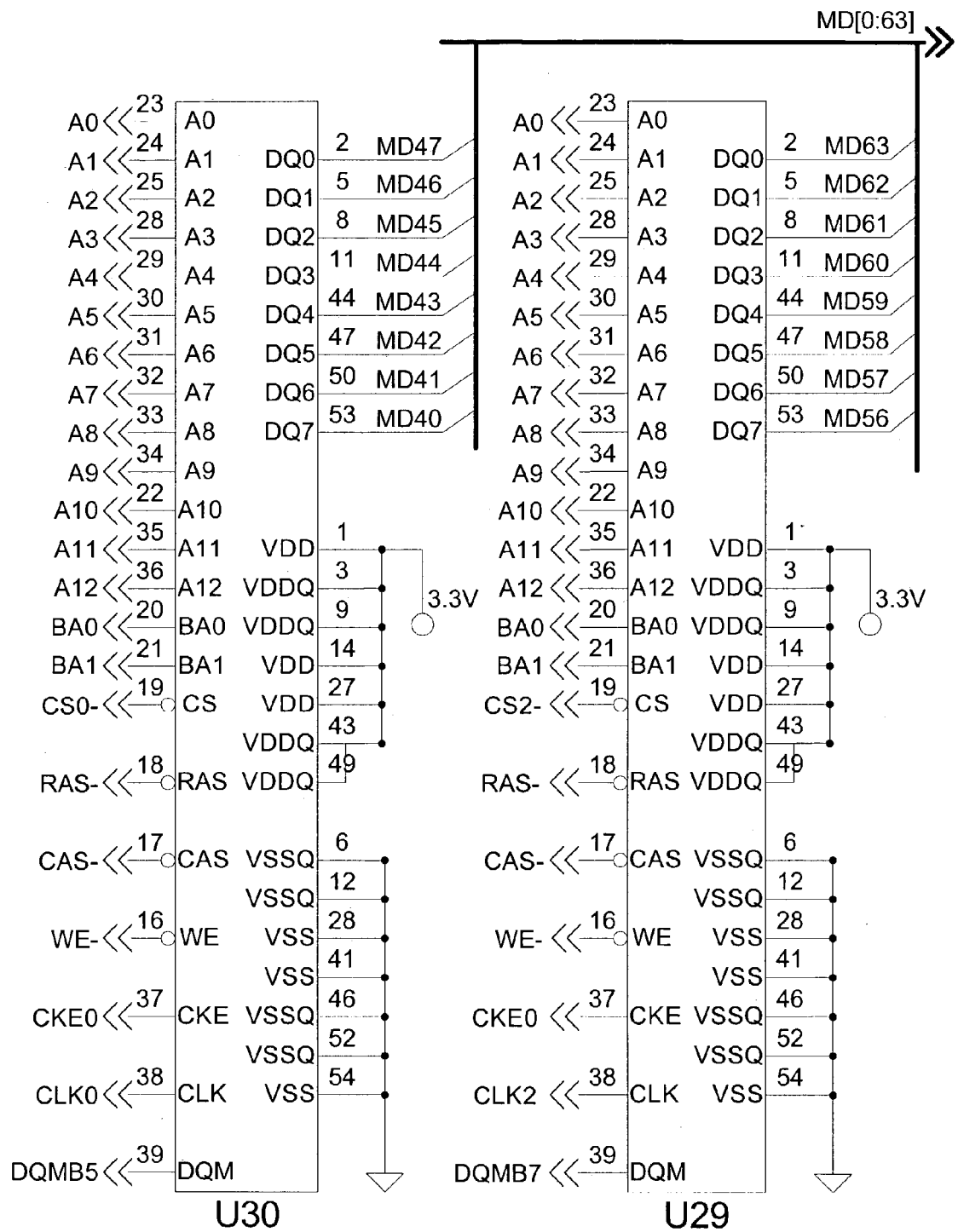
Figure 4G:
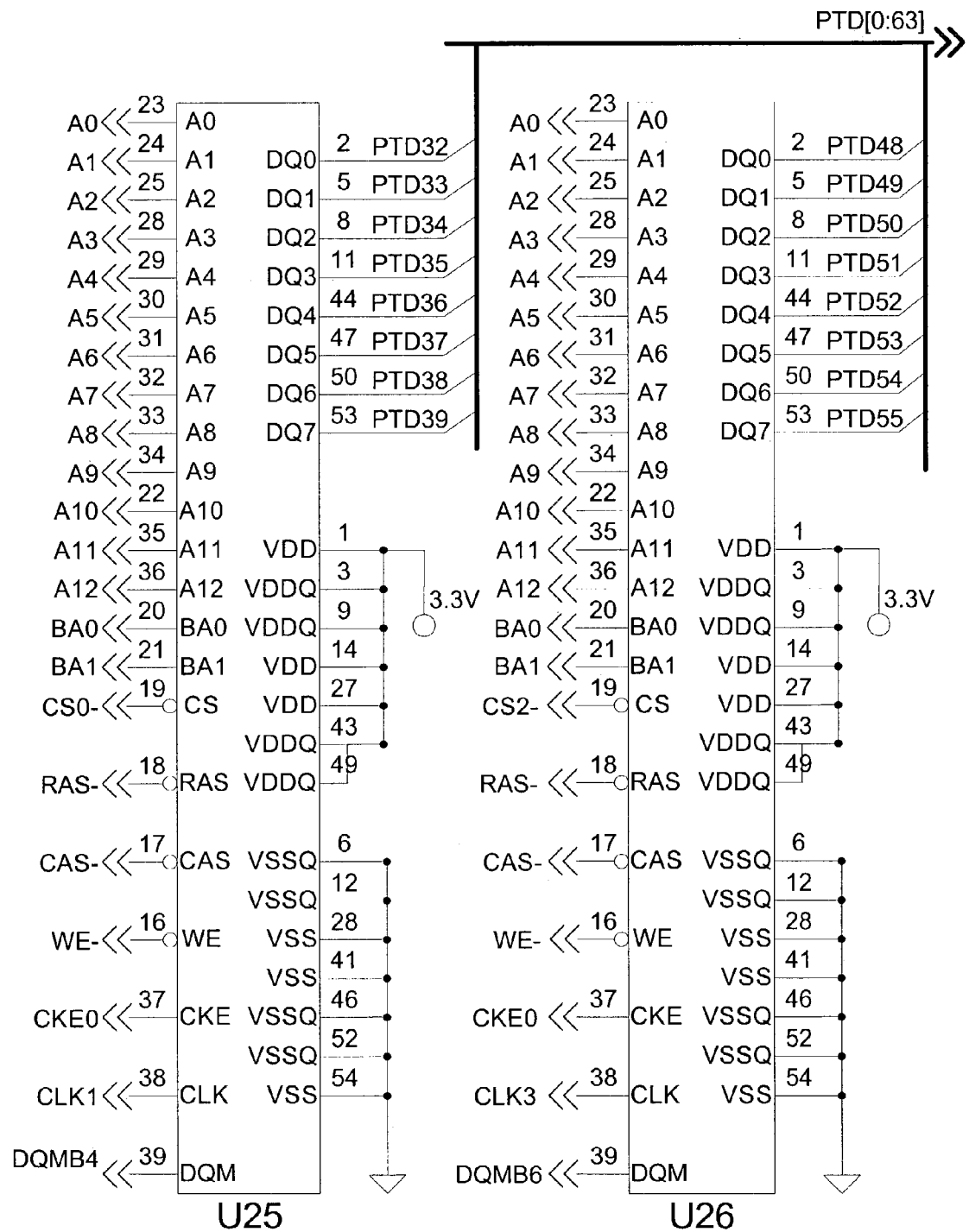
Figure 4H:
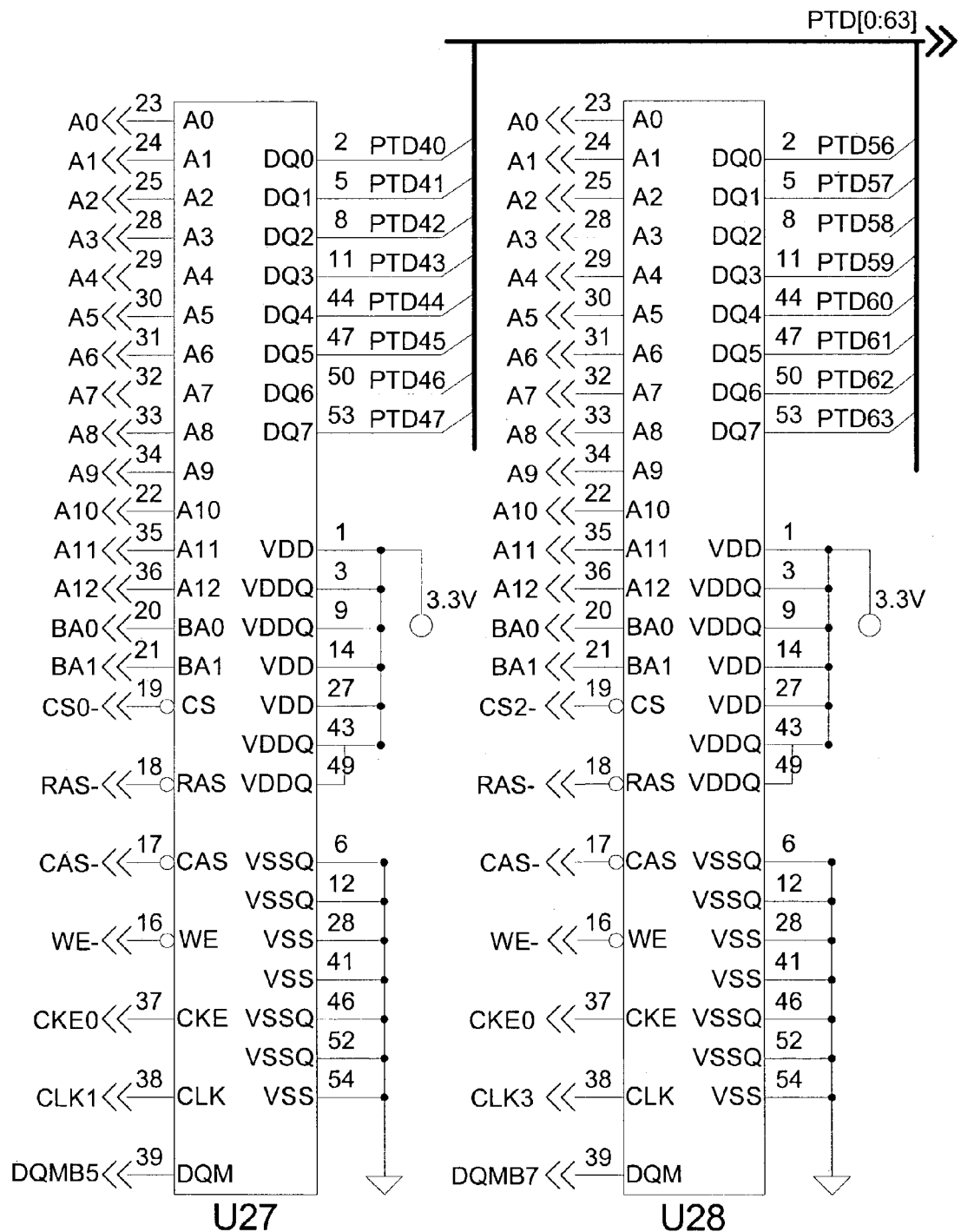
Figure 4I:
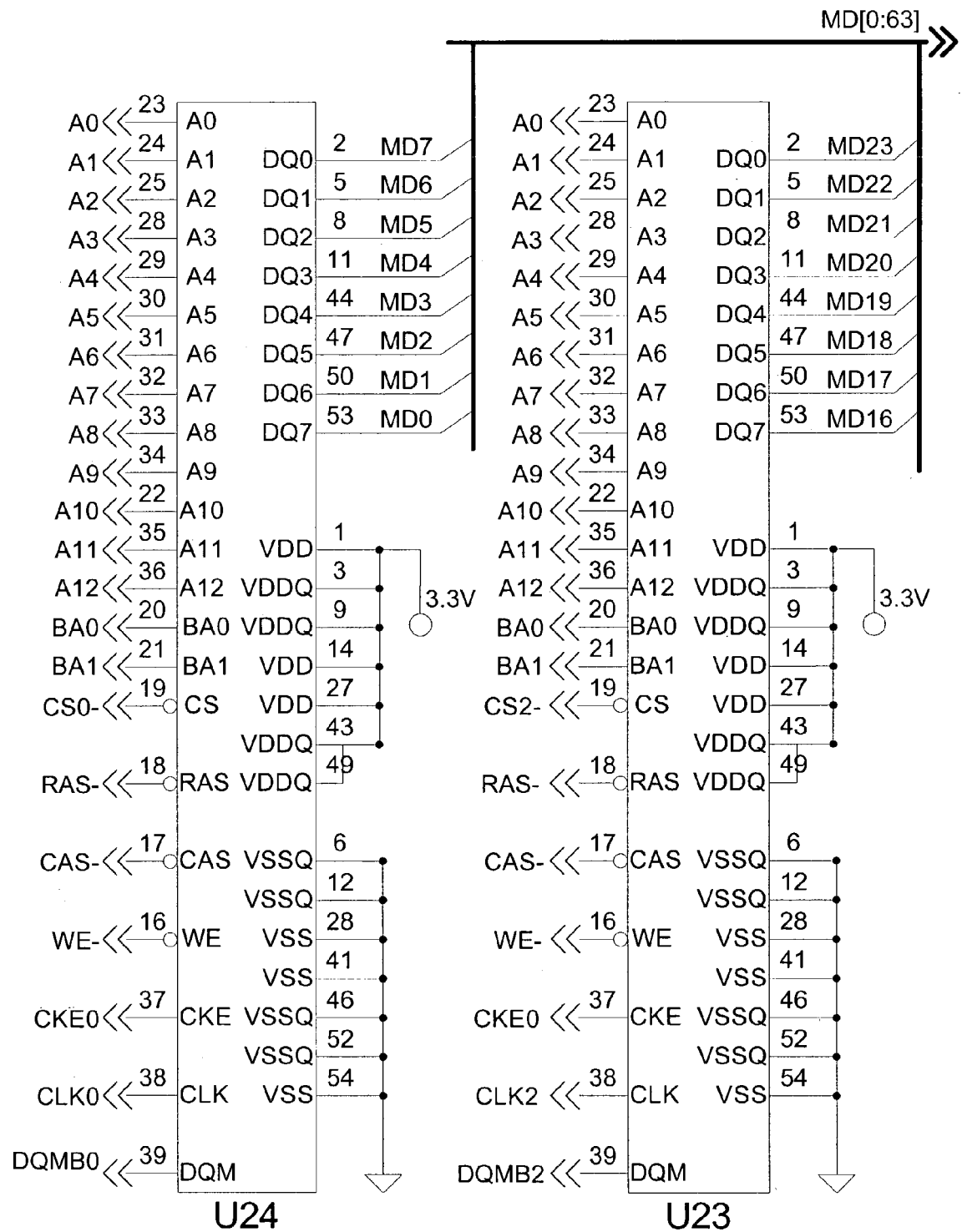
Figure 4J:
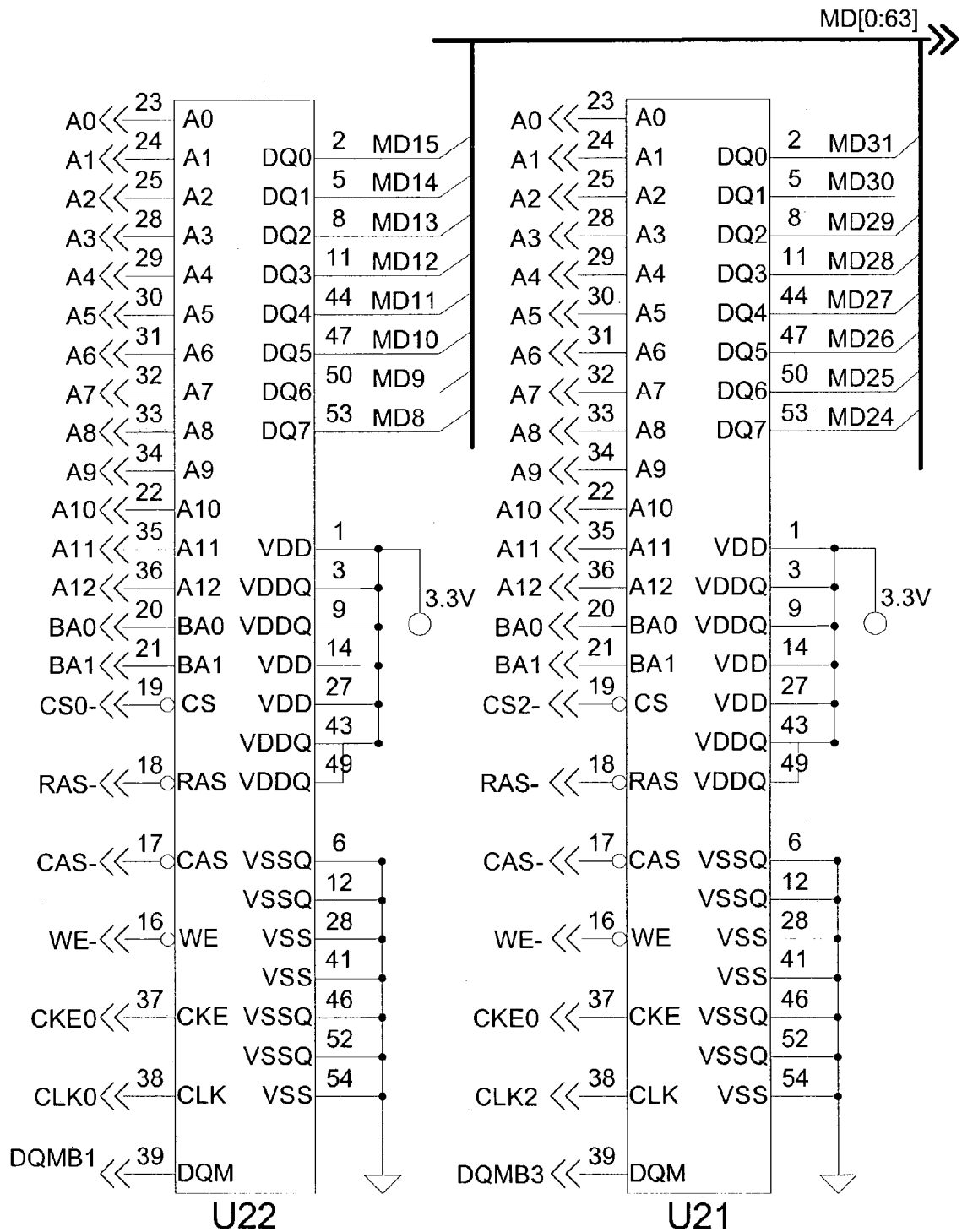
Figure 4K:
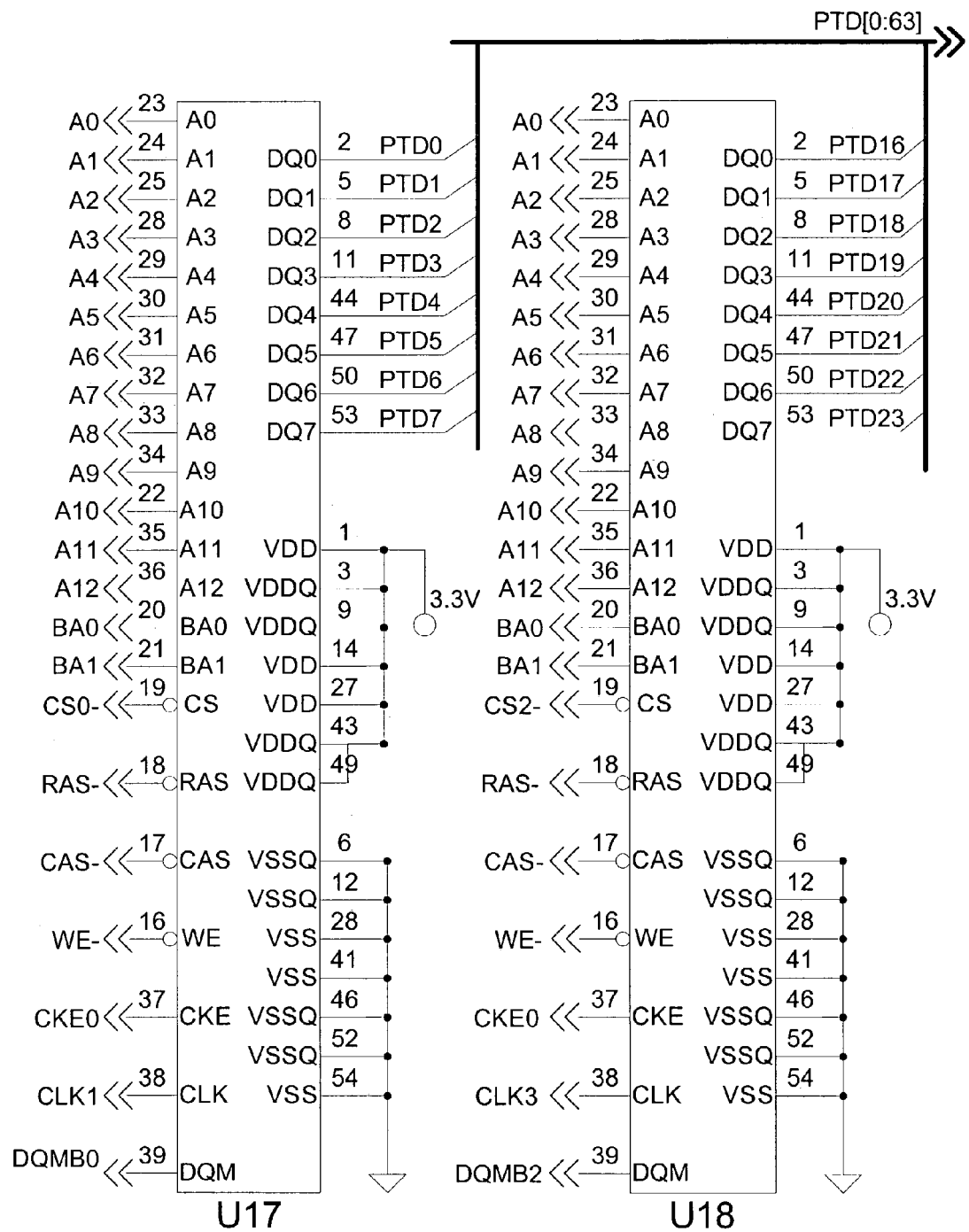
Figure 4L:
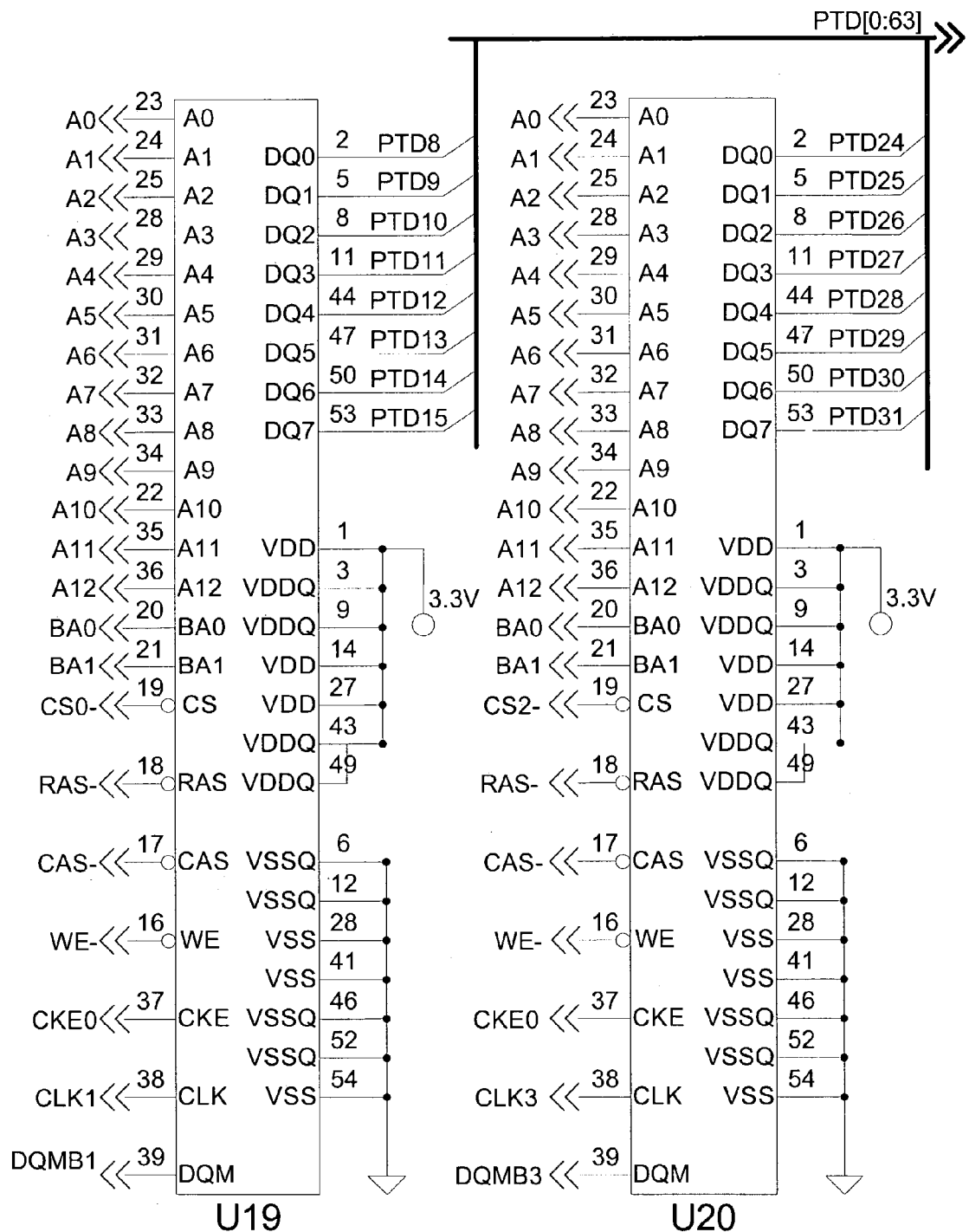

As shown in FIGS. 4A–4C, a number of resistive networks (RN1–RN16) provide a buffer between the host device and memory parts for I/O lines D0–D63. FIG. 4D shows a schematic diagram of an arrangement of capacitors used to remove noise from the power supply signal (3.3V in this example). FIGS. 4E–4L are schematic diagrams of primary and secondary memory parts used in the 128M×8 SDRAM DIMM 4-to-1 patching application, and FIGS. 4M–4O are a schematic diagram of a 4-to-1 patching network.

In the illustrated embodiment, the sixteen memory parts, U17–U32, used to build the 128M×8 module are each 8M×8 SDRAM memory parts. U21–U24 and U29–U32 are primary memory parts, while U17–U20 and U25–U28 are secondary memory parts. A host-device connected to the 128M×8 SDRAM DIMM module may access eight separate sets of 8 I/O bits using a different control signal (DQMB0–DQMB7) for each set. In order to create the eight sets of I/O bits, each primary memory part is paired with a secondary memory part, e.g., U32 with U25, U31 with U26, etc., with each pair (or set) of memory parts sharing a common DQMB control signal.

Figure 4M:
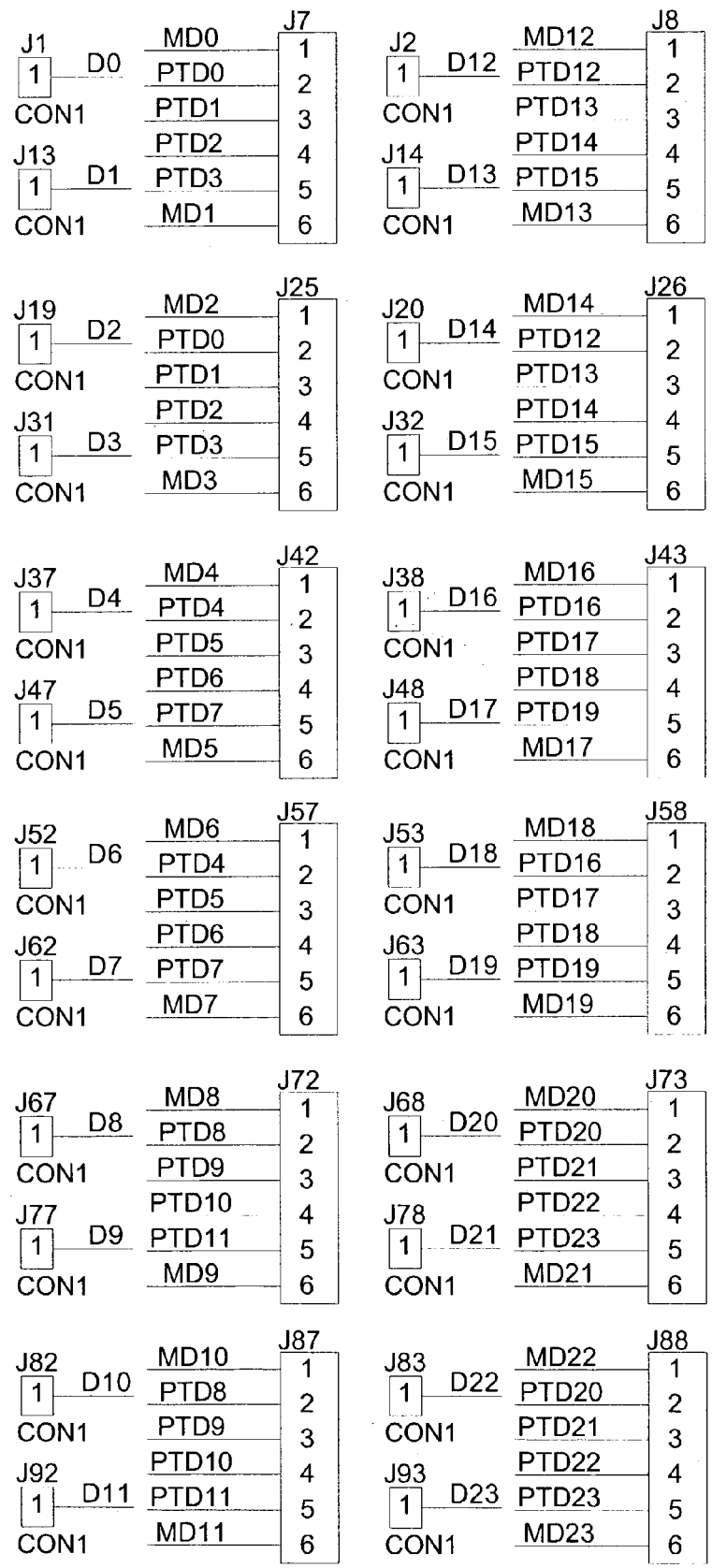
Figure 4N:
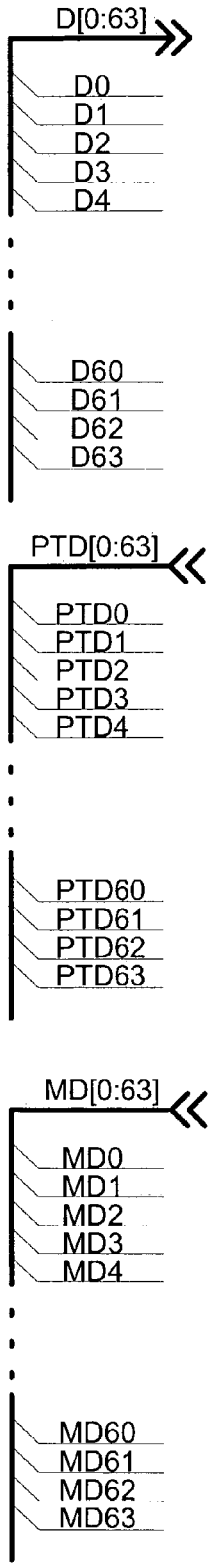
Figure 40:
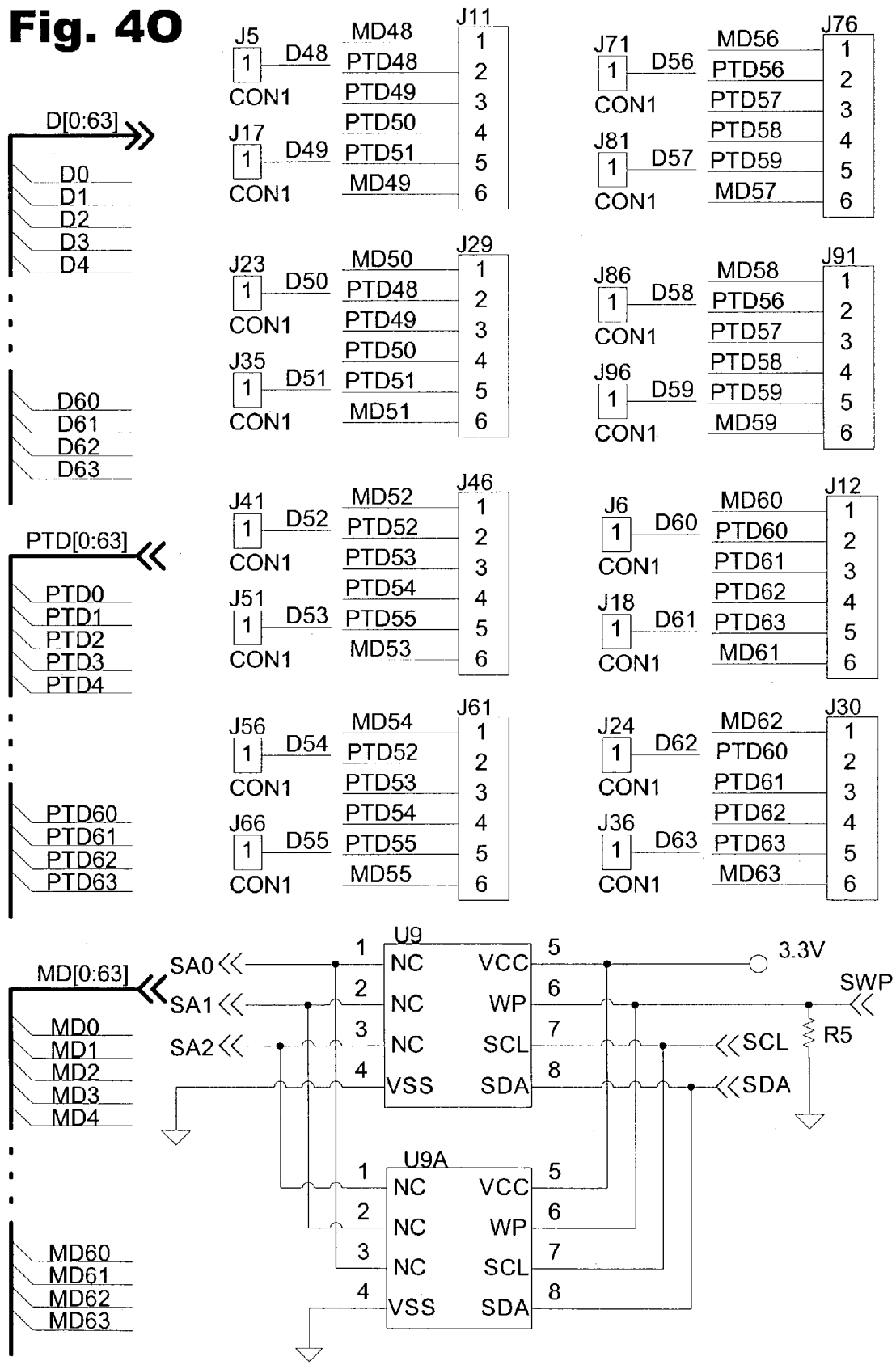

FIGS. 4M–4O show a schematic diagram of a 4-to-1 patching configuration used to build the 128M×8 SDRAM DIMM. As shown in FIGS. 4M–4O, a 4-to-1 patching configuration uses two primary I/O bits (MD0–MD63) from a primary memory part (U21–U24, U29–U32), four secondary I/O bits (PTD0–PTD64) from a secondary memory part (U17–U20, U25–U28), and two I/O output lines (D0–D63). For example, J7 of FIG. 4M brings the I/O bit lines MD0, PTD0, PTD1, PTD2, PTD3, and MD1 together allowing a patching solution to be completed by connecting I/O output lines, D0 and D1, to two of the six I/O bit lines using solder-dots, jumper wires, etc.

In order to complete a functional 128M×8 module using the 4-to-1 patching configuration shown in FIGS. 4M–4O, all 64 I/O lines (D0–D63) would be connected to a working I/O bit. Ideally, this requires each primary memory part and secondary memory part pair to supply 8 working I/O bits. More specifically, each failed primary I/O bit would be replaceable by an available secondary I/O bit pre-wired to the same junction, e.g., J7 of FIG. 4M. Alternatively, an external jumper wire may be used to connect any I/O bit to any I/O output line as long as the control signal (DQMB) is the same for the primary memory part and secondary memory part used.

More specifically, in the SDRAM embodiment shown in FIGS. 4A–4O, the primary memory parts U21, U22, U23, U24, U29, U30, U31, and U32 are matched with secondary memory parts U20, U19, U18, U17, U28, U27, U26, and U25 respectively. For example, the first four bits (MD39–MD36) of U 32(FIG. 4E) may be patched by any of the first four bits (PTD32–PTD35) of U 25(FIG. 4G), and the second four bits (MD35–MD32) of U32 may be patched by the second four bits (PTD36–PTD39) of U25. The same is true for all other primary memory part and secondary memory part pairs as illustrated by the 4-to-1 patching networks shown in FIGS. 4M–4O.

Each memory part (U17–U32) of FIGS. 4E–4L is equipped with a read/write control signal (DQM). The DQM control signal for each pair of primary and secondary memory parts are matched to simultaneously access both parts. In a selected embodiment, no pair of primary and secondary memory parts uses the same control signal as another pair. For example, as shown by FIGS. 4E–4L, U24 and U17 share DQM signal, DQMB0, while U23 and U18 share DQMB2, etc.

Figure 5A:
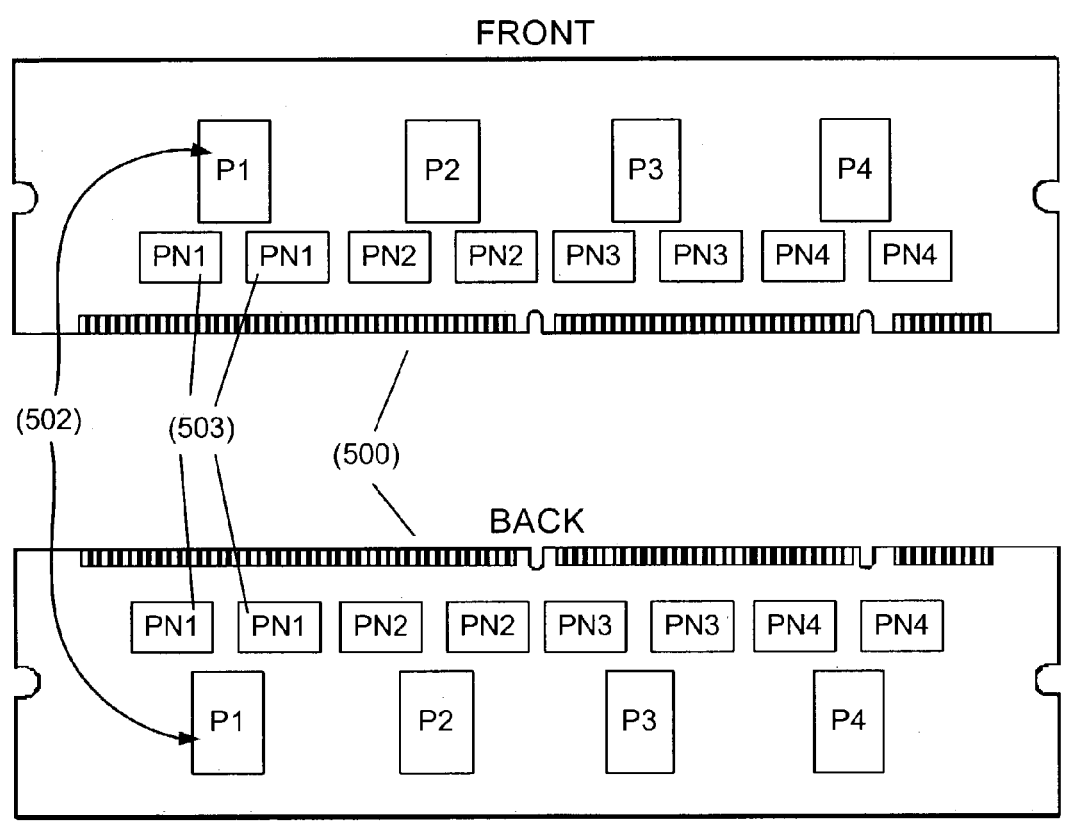
FIG. 5a is a block diagram illustrating a layout of major components of a memory module fabricated using 4-to-1 I/O line patching networks according to one embodiment of the present invention.

FIG. 5a is a block diagram illustrating a layout of major components of a memory module fabricated using 4-to-1 I/O line patching networks. As shown in FIG. 5a, memory parts (502) are mounted on the front and back of a multi-layer circuit board (500). More specifically, in the embodiment shown, 4 pairs (P1–P4) of memory parts (502), each pair consisting of one primary and one secondary memory part, are mounted on a multi-layer circuit board (500). For each memory part (502) pair (P1–P4), four 4-to-1 I/O line patching networks (503) are designated (PN1–PN4).

Figure 5B:
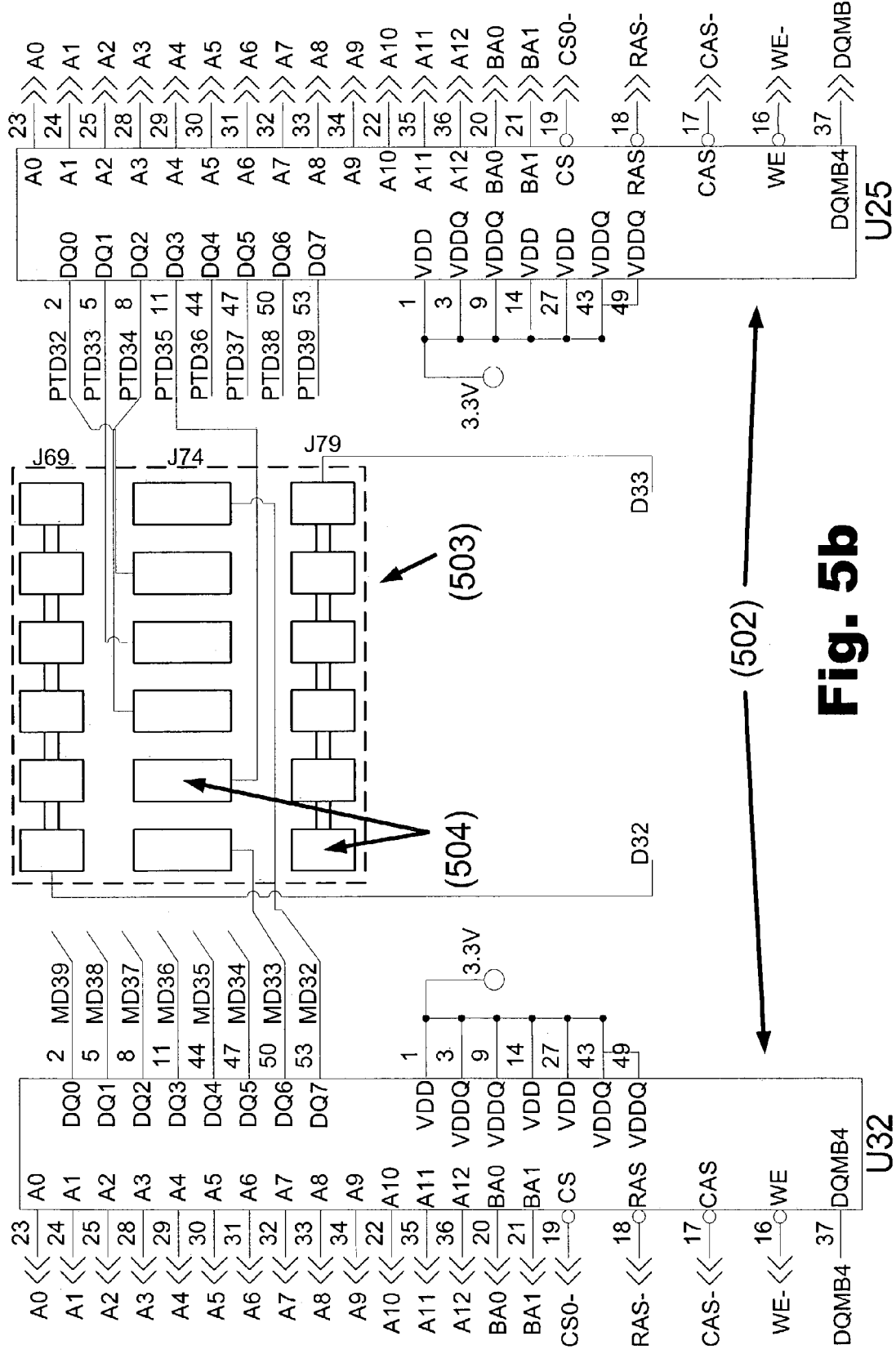
FIG. 5b is a block diagram illustrating a primary and secondary memory part in conjunction with a 4-to-1 I/O line patching network according to one embodiment of the present invention.

FIG. 5b is a block diagram illustrating a primary and secondary memory part in conjunction with a 4-to-1 I/O line patching network. In particular, FIG. 5b illustrates a memory part (502) pair, U32 and U25, as described for FIGS. 4A–4O. As shown in FIG. 5b, the primary I/O lines (MD32–MD39) of U32 and secondary I/O lines (PTD32–PTD39) of U25 are electrically connected to conductive pads (504) of a 4-to-1 patching network (503). As described in FIG. 5a, four 4-to-1 patching networks (503) would be used for each memory part (502) pair. Therefore, the illustration of FIG. 5b shows only a portion of the 4-to-1 patching networks (503) used in association with U32 and U25.

For a complete description of the 4-to-1 patching networks (503) used with U32 and U25 of FIG. 5b, a reference may be made to FIG. 4N, wherein the 4-to-1 patching network (503) shown in FIG. 5b is described by J69, J79, and J74, and their associated signals. Likewise, J84, J94, and J89; J4, J16, and J10; J22, J34, and J28 and their associated signals provide a complete description of the four 4-to-1 patching networks (503) associated with U32 and U25.

Figure 5C:
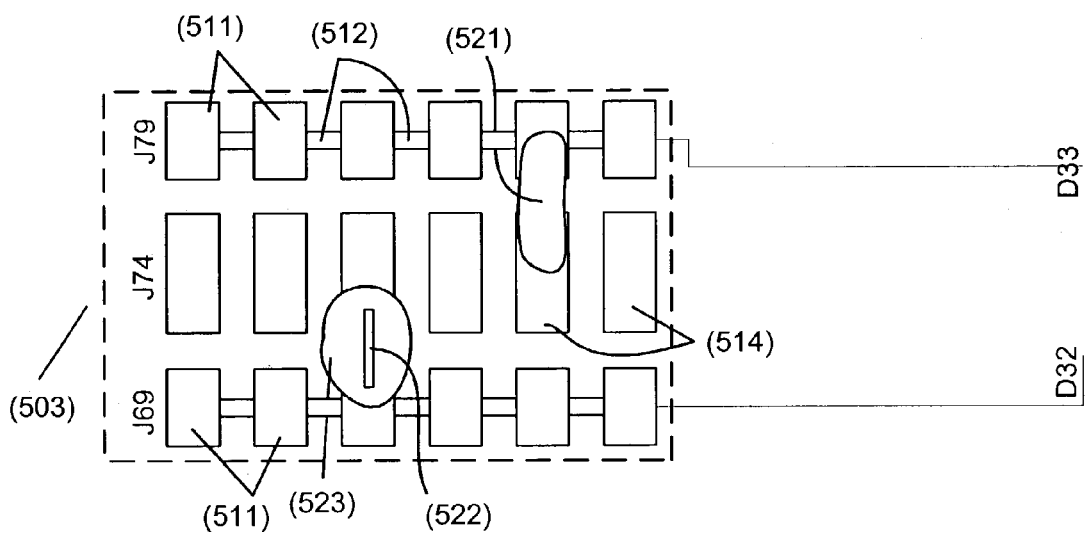
FIG. 5c is a block diagram illustrating a completed 4-to-1 I/O line patching network according to one embodiment of the present invention.

FIG. 5c is a block diagram illustrating a completed 4-to-1 I/O line patching network. More specifically, FIG. 5c illustrates the 4-to-1 patching network (503) shown in FIG. 5b. As shown in FIG. 5c, a number of solder dots (521) or jumper wires (522) may be used to electrically connect a primary I/O line pad or secondary I/O line pad (514) to output I/O line pads (511). In some embodiments, the 4-to-1 patching network shown in FIG. 5c allows two operable I/O lines (out of 6 possibilities) to be connected to the output I/O lines, D32 and D33. Additionally, a selectively settable material (523) may be used to protect solder dots (521) or jumper wires (522) from physical damage. As illustrated in FIG. 5c, J69 and J79, shown in FIG. 4N, which connect to 110 output lines D32 and D33, comprise a series of conductive pads (511) connected by traces (512), thereby allowing a convenient means of connecting 2 of the 6 primary and secondary I/O lines associated with J74 to D32 and D33.

Figure 5D:
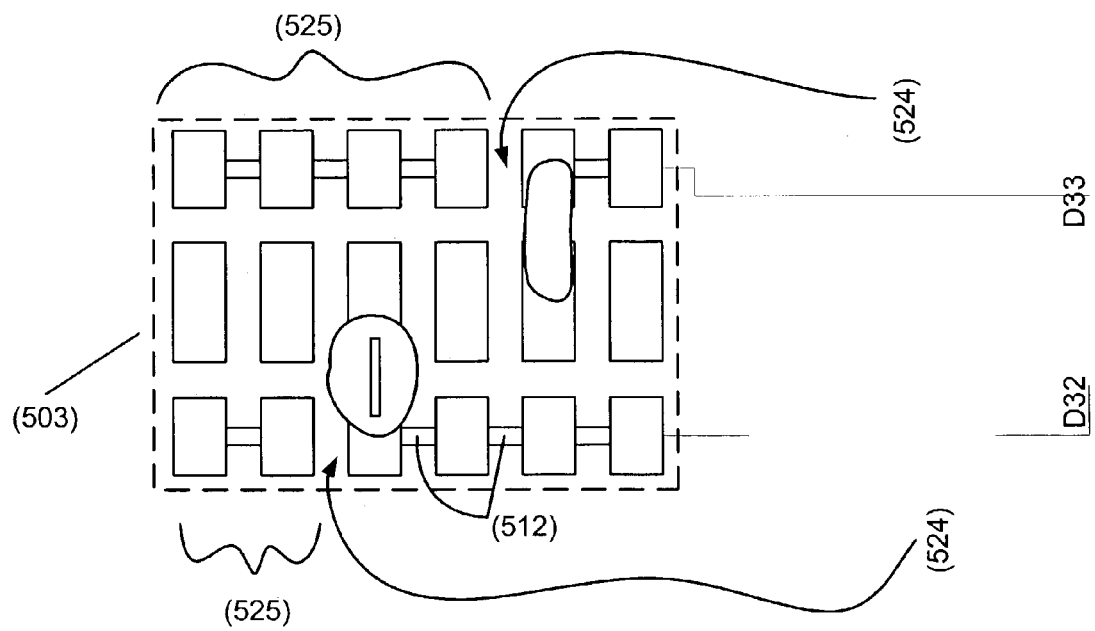
FIG. 5*d* is a block diagram illustrating another completed 4-to-1 I/O line patching network according to one embodiment of the present invention.

FIG. 5d is a block diagram illustrating another completed 4-to-1 I/O line patching network. As shown in FIG. 5d the 4-to-1 patching network (503) is completed as illustrated in FIG. 5c. The block diagram of FIG. 5d illustrates an optional removal of traces (524) from the 4-to-1 patching network (503) to reduce high-frequency stubbing effects that may distort the I/O signal. More specifically, the open circuit "stubs" (525) cause electrical waves to reflect, thereby causing possible distortion to the I/O line signal. By removing the trace (512) closest to the patch connection, stubbing effects may be significantly reduced. In particular, memory modules which operate at a frequency greater than 100 MHz are susceptible to deleterious stubbing effects, and may use the removal of traces, as illustrated in FIG. 5d, to reduce stubbing effects.

If any changes need to be made to a completed 4-to-1 single-bit patching element (503), i.e., if one of the connected I/O data lines fails, the failed I/O data line is disconnected and another appropriate patching connection is made.

FIGS. 6A–6L are a schematic diagram illustrating a SDRAM DIMM memory module fabricated using an 8-to-1 I/O line patching networks. As shown in FIGS. 6A–6L, a variety of signals, comprising power supplies, clocks, ground, control signals, addressing signals, I/O lines, etc., are transferred between the memory module and a host device, e.g., a computer, capable of providing the signals necessary for the memory parts (U2–U9) to operate.

In particular, FIGS. 6E–6H are schematic diagrams of primary and secondary memory parts used in a SDRAM DIMM 8-to-1 patching configuration, and FIGS. 6I–6L are a schematic diagram of an 8-to-1 patching network.

As shown in FIGS. 6E–6H, primary memory parts, U2–U5, and secondary memory parts, U6–U9, are used to build a SDRAM DIMM 8M×64 module. Each memory part is a SDRAM 8M×16 capable of providing 8 megabytes of memory accessed 16 bits at a time. If any of the I/O bits of the primary memory parts (U2–U5) are not fully functional (partially defective memory parts may be purchased for a discounted price), operable I/O bits of secondary memory parts, U6–U9, may be used to replace the failed bits of the primary memory parts. The input/output bits of all primary and secondary memory parts are pre-connected to certain points (called pads) on the multi-layer circuit board and are represented by MD[0:63] (the primary I/O lines) and PTD [0:63] bus lines (the secondary I/O lines) shown in FIGS. 6A–6L.

FIGS. 6I–6L illustrate a schematic diagram of an 8-to-1 patching network of the memory module. As shown in FIGS. 2I–2L, a number of primary I/O bits (MD[0:63]) and secondary I/O bits (PTD[0:63]) are traced to a number of 10-pin connectors or junctions. More specifically, each 10-pin connector consists of two primary I/O bits and eight secondary I/O bits. Usually, only two of the ten I/O bits for each connector are used to complete a patch. These two I/O bits may be determined using the test information for functional I/O bits explained in FIG. 1. In the embodiment shown in FIGS. 6A–6L, two working I/O bits are connected for each of thirty-two 8-to-1 patching networks to provide 64 functional I/O lines (D[0:63]) for the memory module.

For example, in the SDRAM embodiment shown in FIGS. 6A–6L, the primary memory parts U2, U3, U4, and U5, are matched with secondary memory parts U6, U7, U8, and U9, respectively. More specifically, any of the first 8-bits of U2 can be patched by any of the first 8-bits of U6, and any of the second 8-bits of U2 can be patched by any of the second 8-bits of U6. The same is true for all other primary memory parts and corresponding secondary memory parts.

Figure 6A:
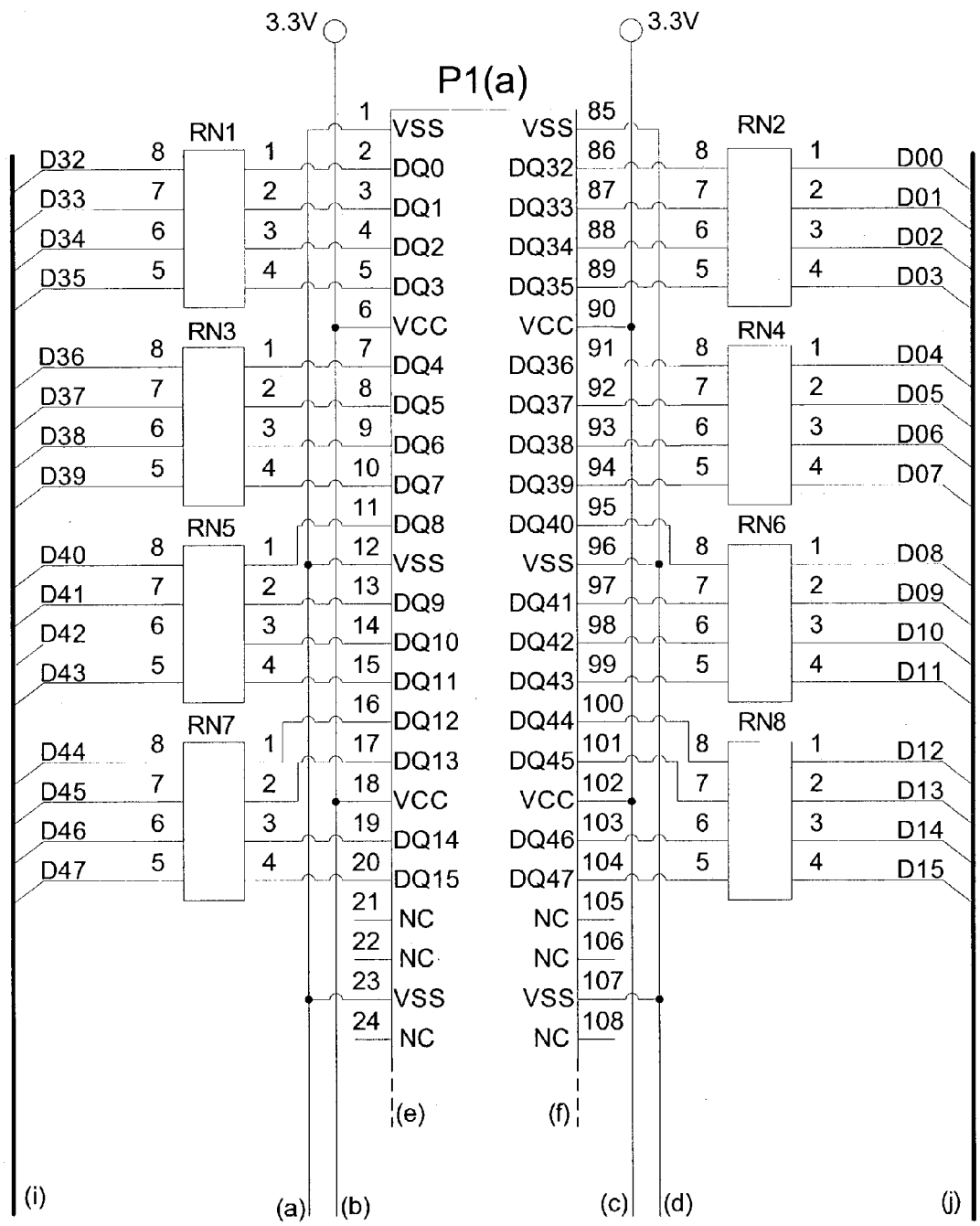
Figure 6B:
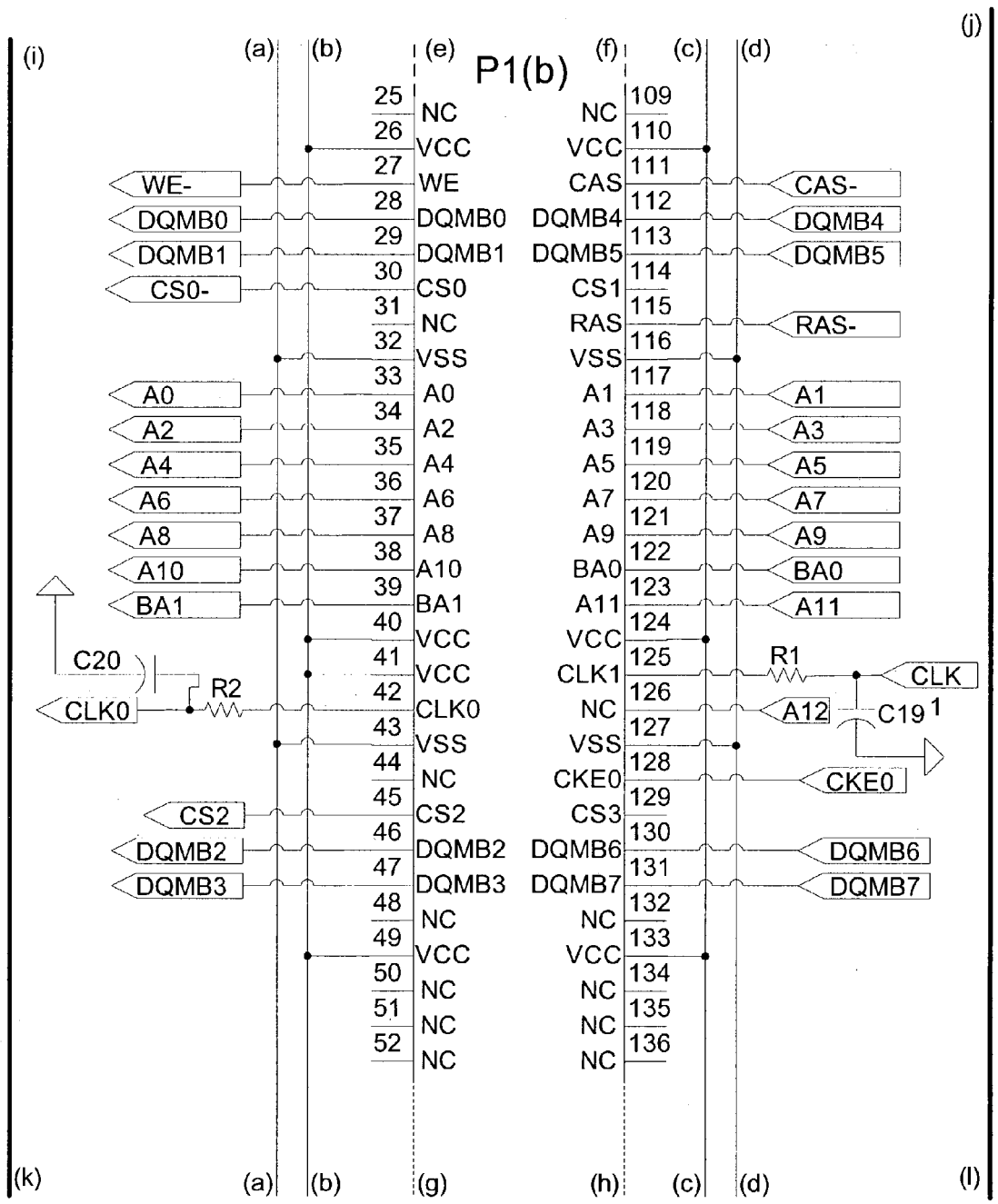
Figure 6C:
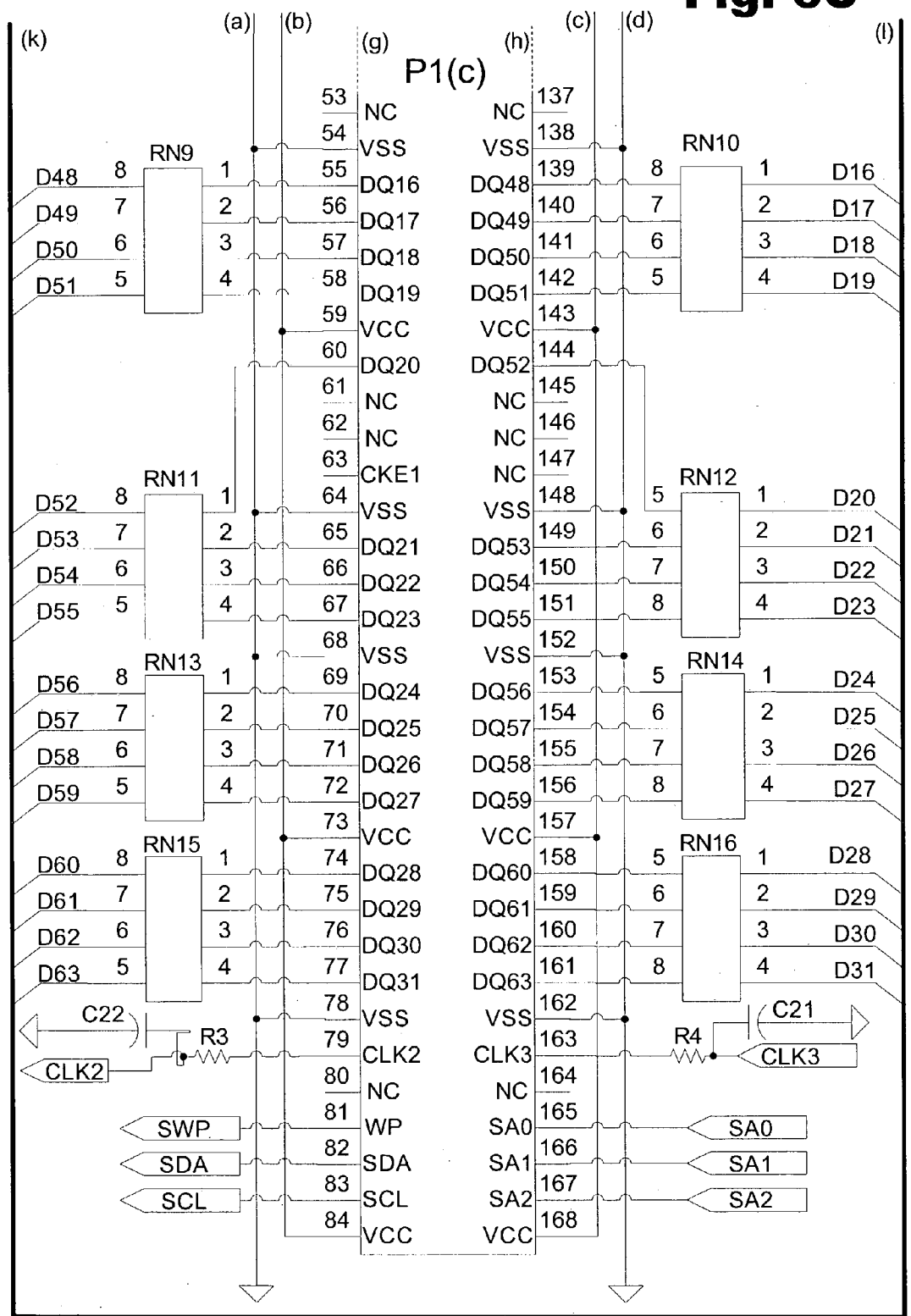
Figure 6E:
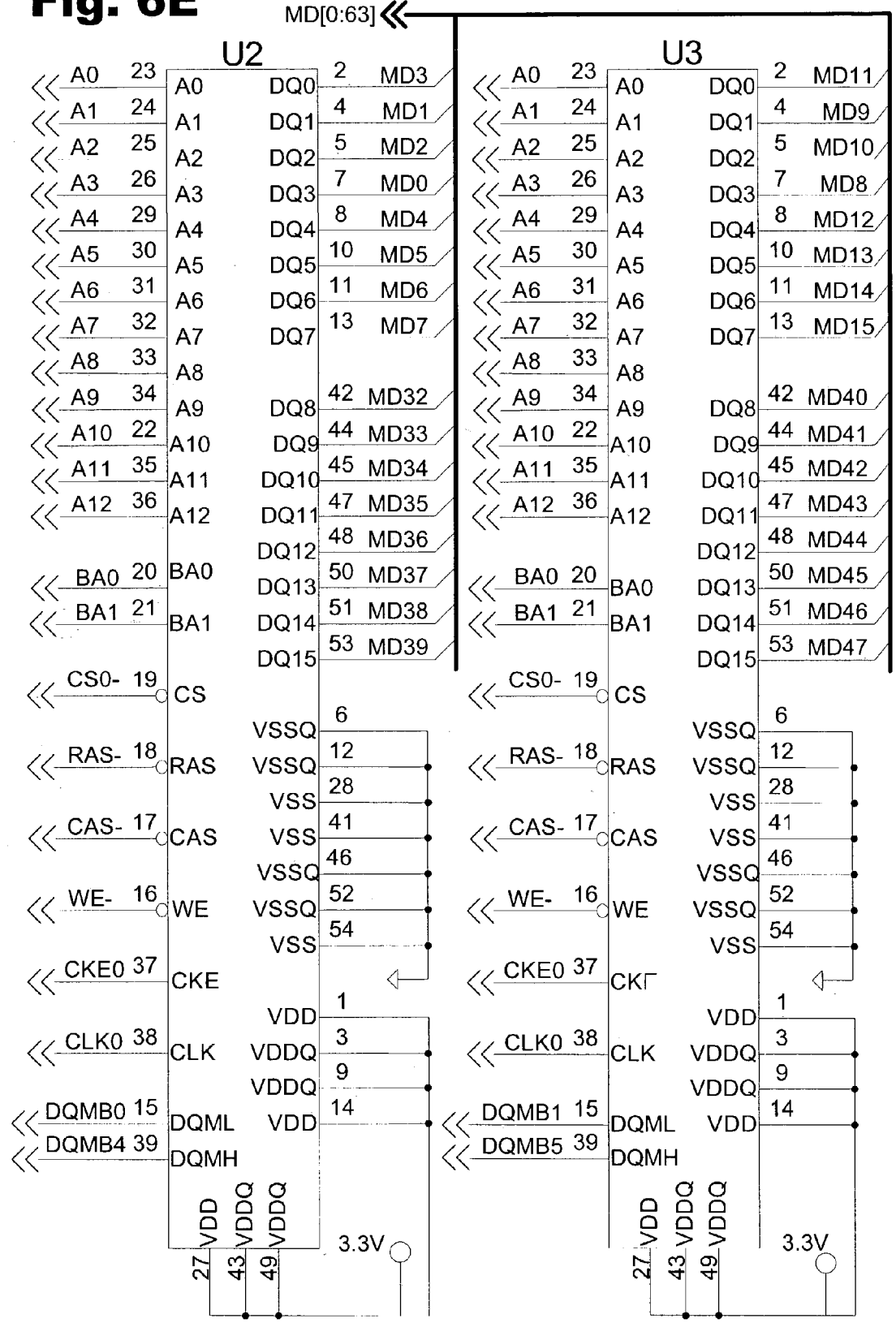
Figure 6F:
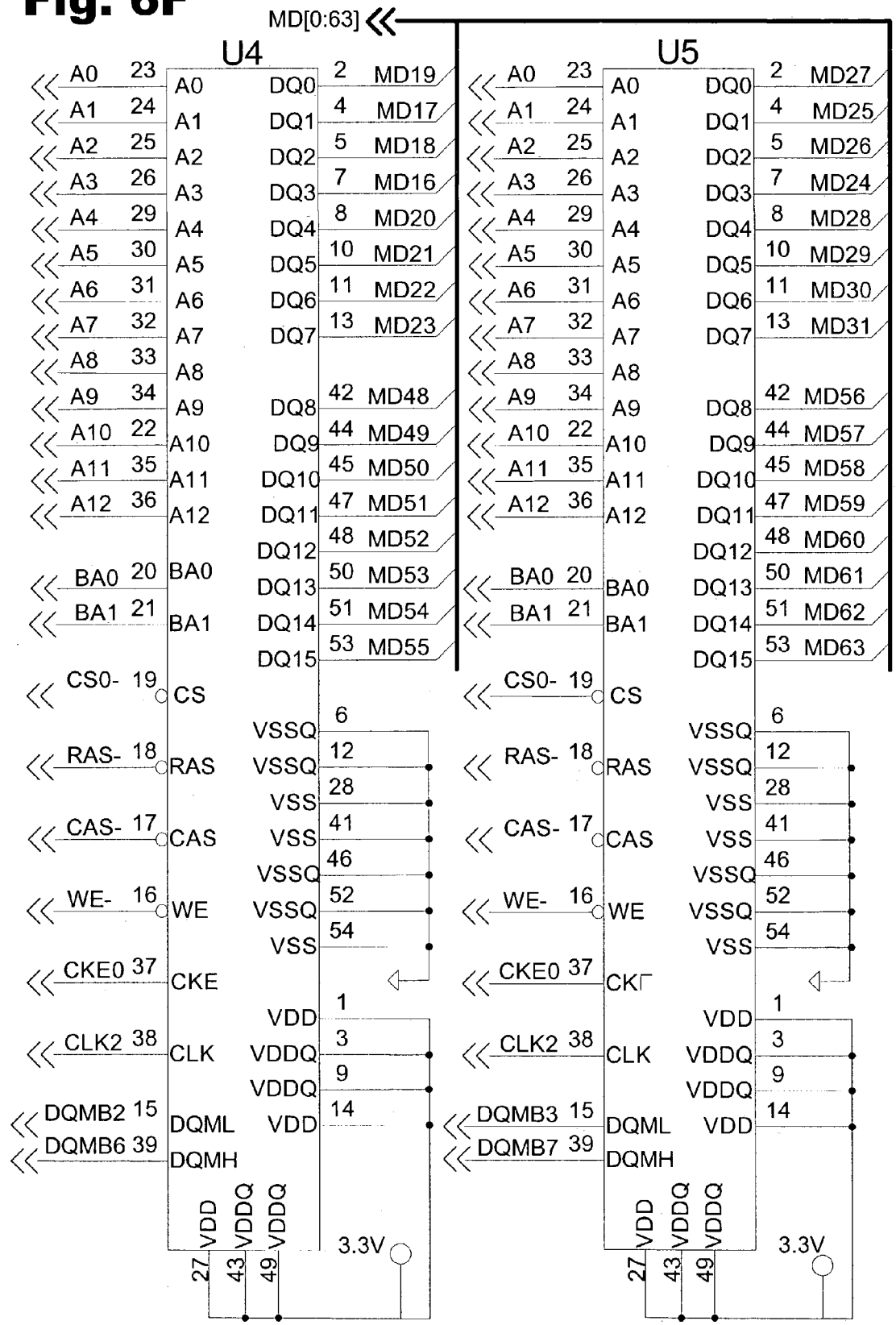
Figure 6G:
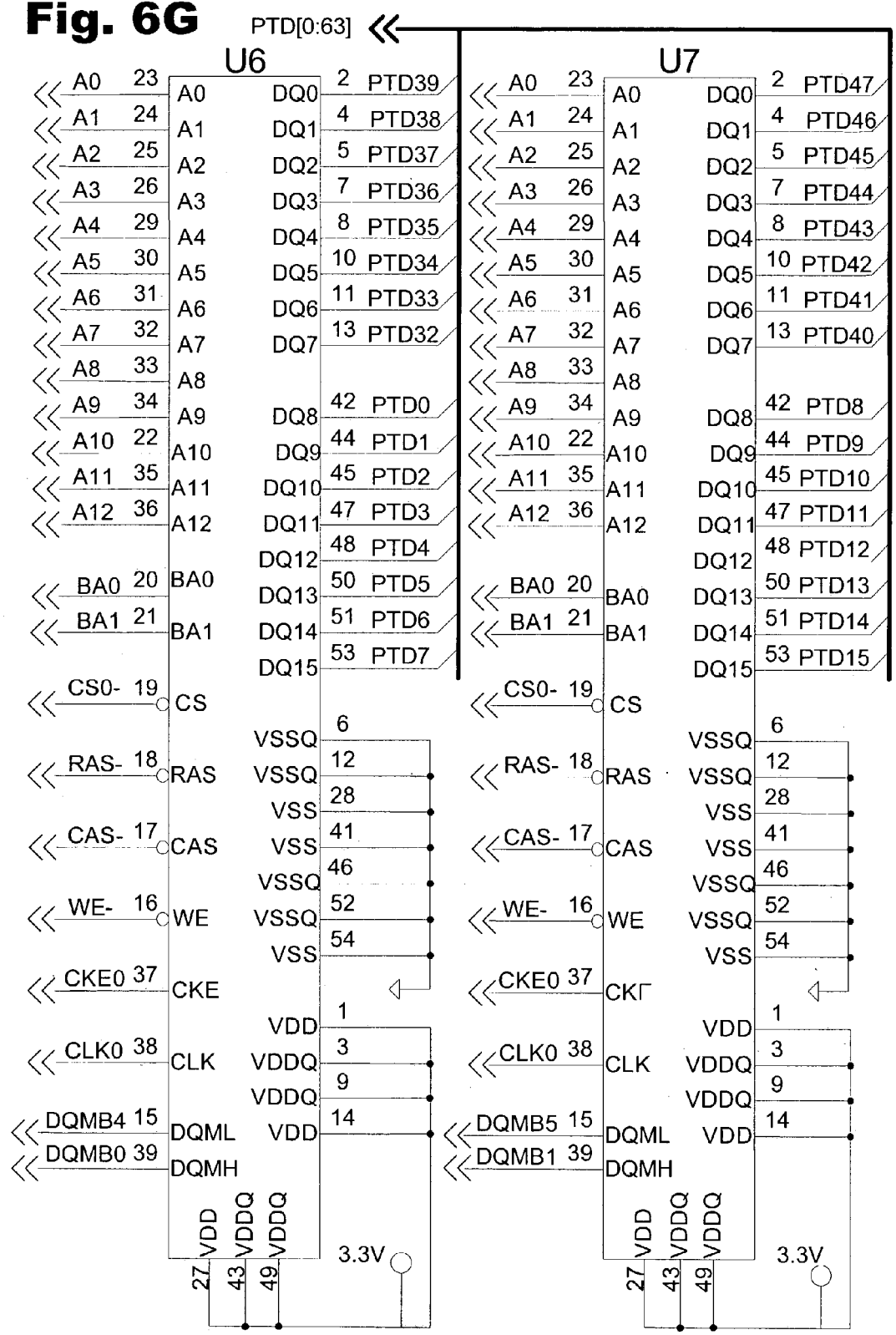
Figure 6H:
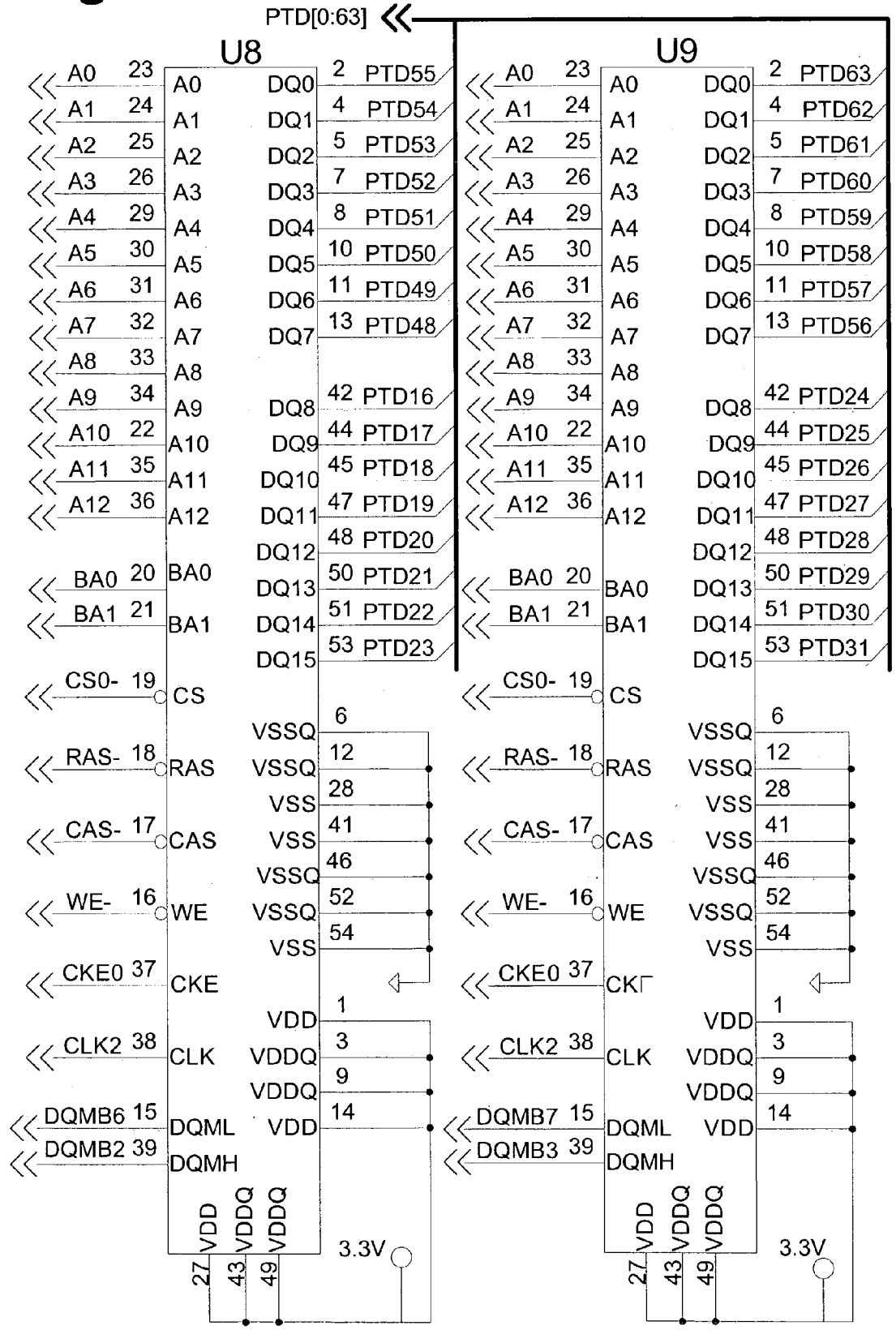

In the embodiment of FIGS. 6A–6L, each memory part (U2–U9) is equipped with a separate control signal (DQM) for the first and second 8-bits. For example, U 2(of FIG. 2E) uses the control signals DQM0 and DQM4 to allow separate read/write control for the first 8-bits and second 8-bits of the I/O lines. By matching the DQM control signals for each primary and secondary memory part pair, the I/O bits of the secondary memory part may be used to replace non-operable I/O bit of the primary memory part. As an example, if operable I/O bits of U 6(FIG. 6G) are to replace non-operable I/O bits of U 2(FIG. 6E), then both memory parts may use DQMB0 and DQMB4 as shown in FIGS. 6E and 6G.

More specifically, in the embodiment of FIGS. 2A–2L, the first 8-bits of the primary memory part U2 may be patched by the second 8-bits of secondary memory part U6, and the second 8-bits of the primary memory part U2 may be patched by the first 8-bits of the secondary memory part U6.

Figure 7A:
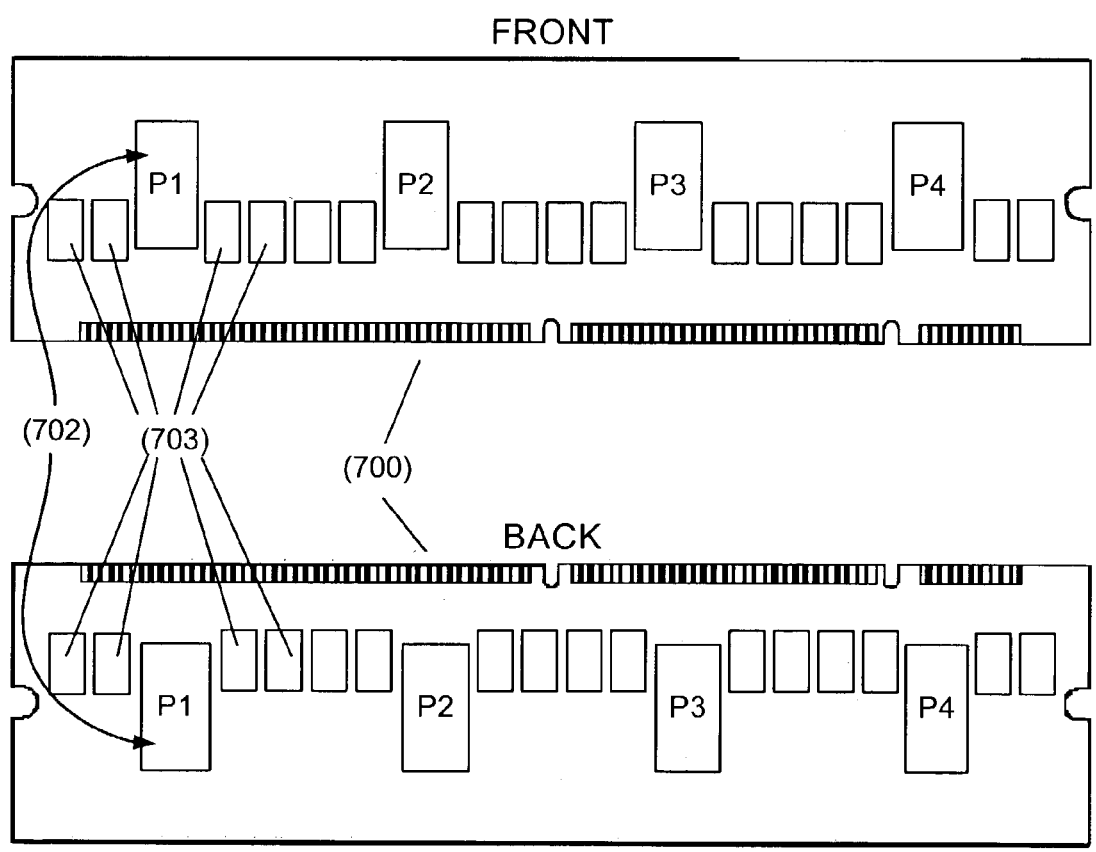
FIG. 7*a* is a block diagram illustrating a layout of major components of a memory module fabricated using 8-to-1 I/O line patching networks according to one embodiment of the present invention.

FIG. 7a is a block diagram illustrating a layout of major components of a memory module fabricated using 8-to-1 I/O line patching networks. As shown in FIG. 7a, memory parts (702) are mounted on the front and back of a multi-layer circuit board (700). More specifically, in the embodiment shown, 4 pairs (P1–P4) of memory parts (702), each pair consisting of one primary and one secondary memory part, are mounted on a multi-layer circuit board (700). For each memory part (702) pair (P1–P4), eight 8-to-1 I/O line patching networks (703) are used.

Figure 6I:
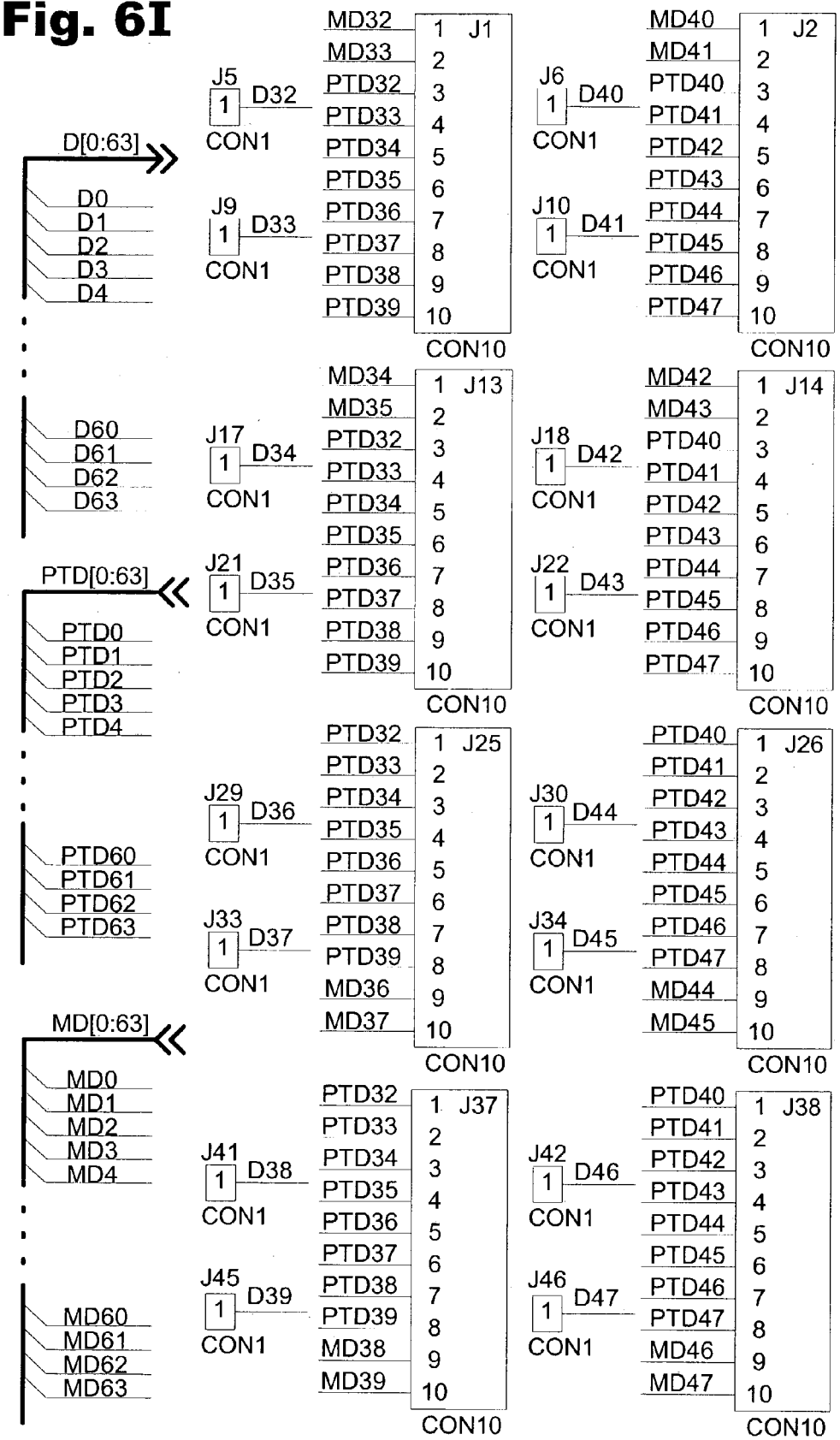
Figure 6J:
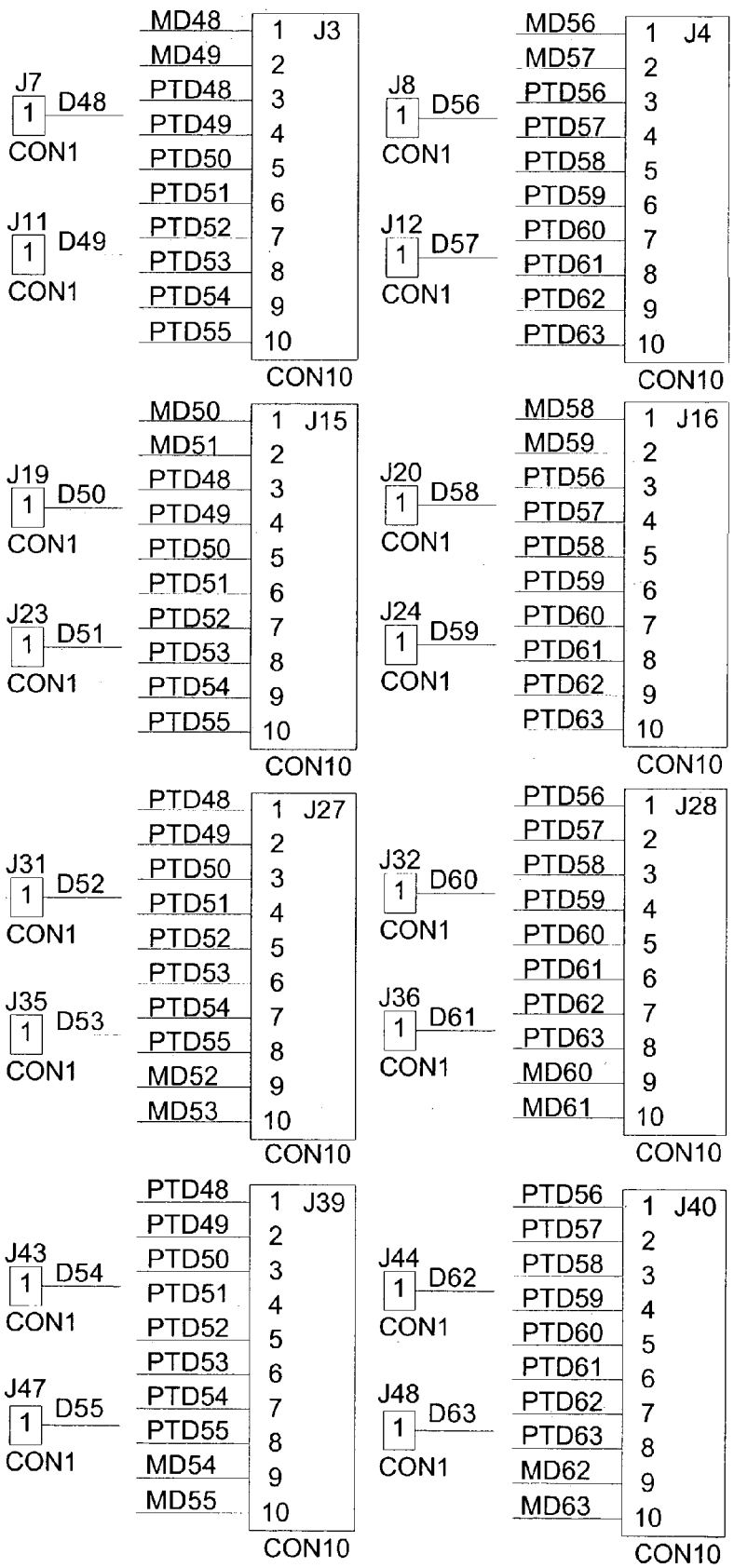
Figure 6K:
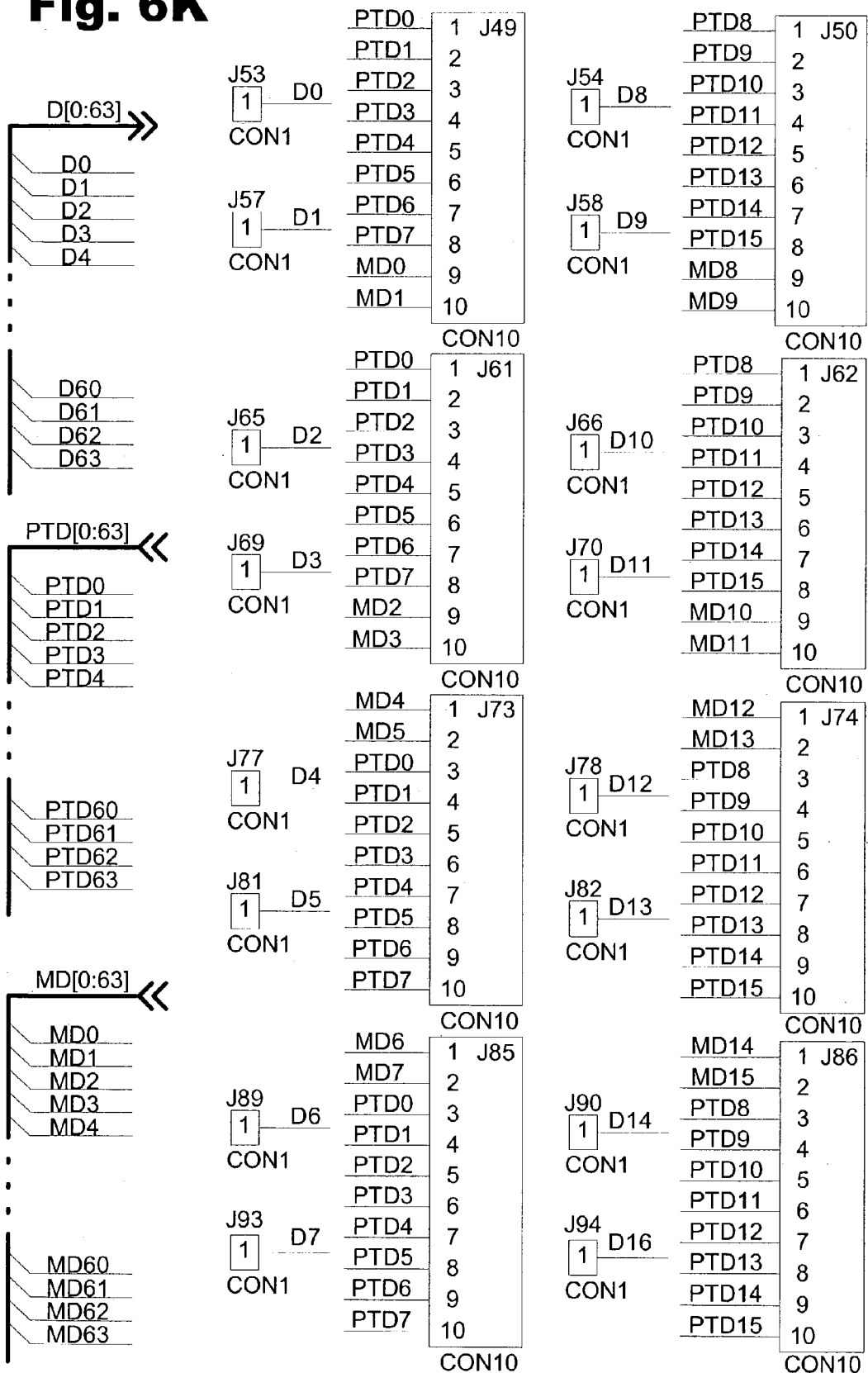
Figure 6L:
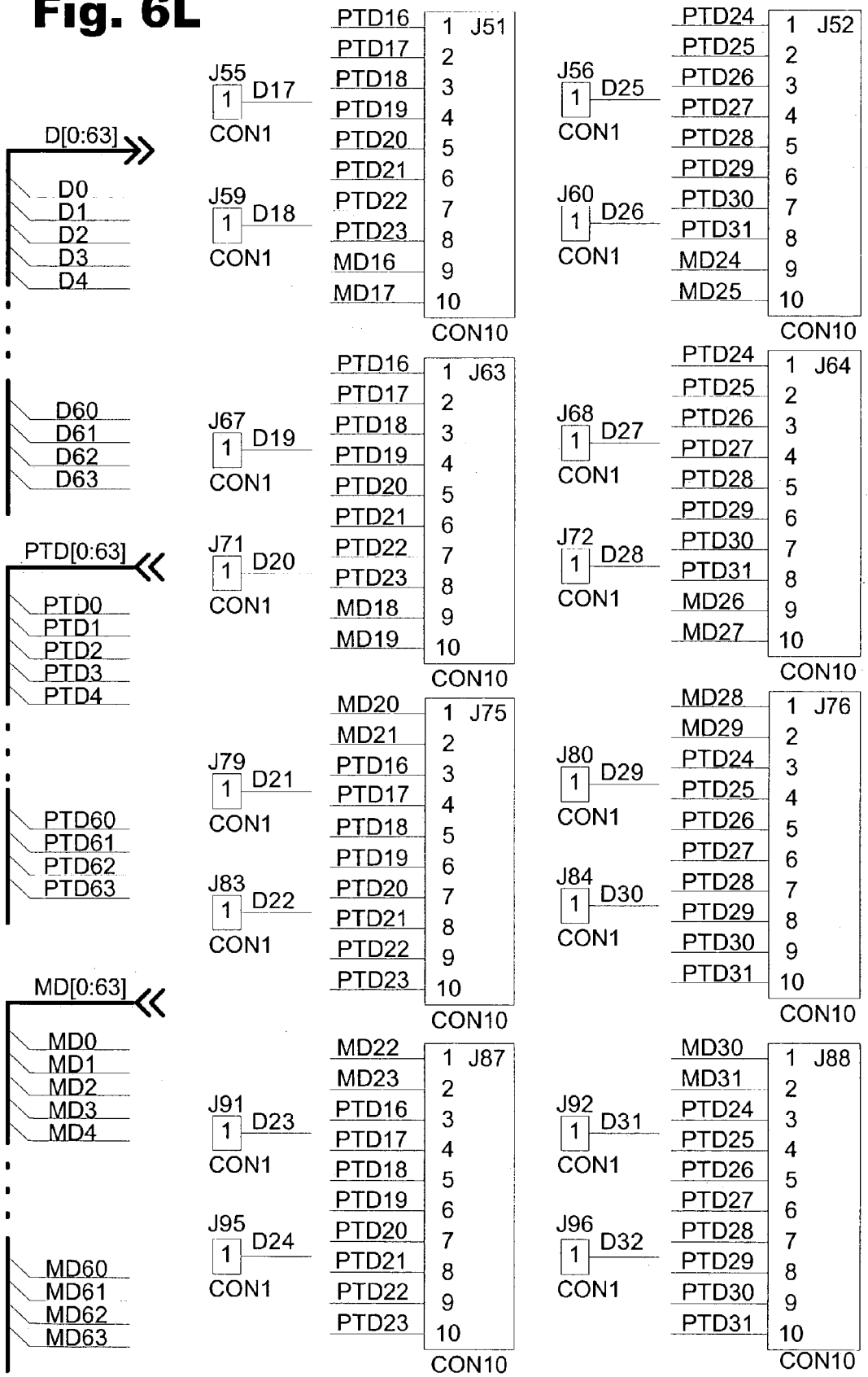
Figure 7B:
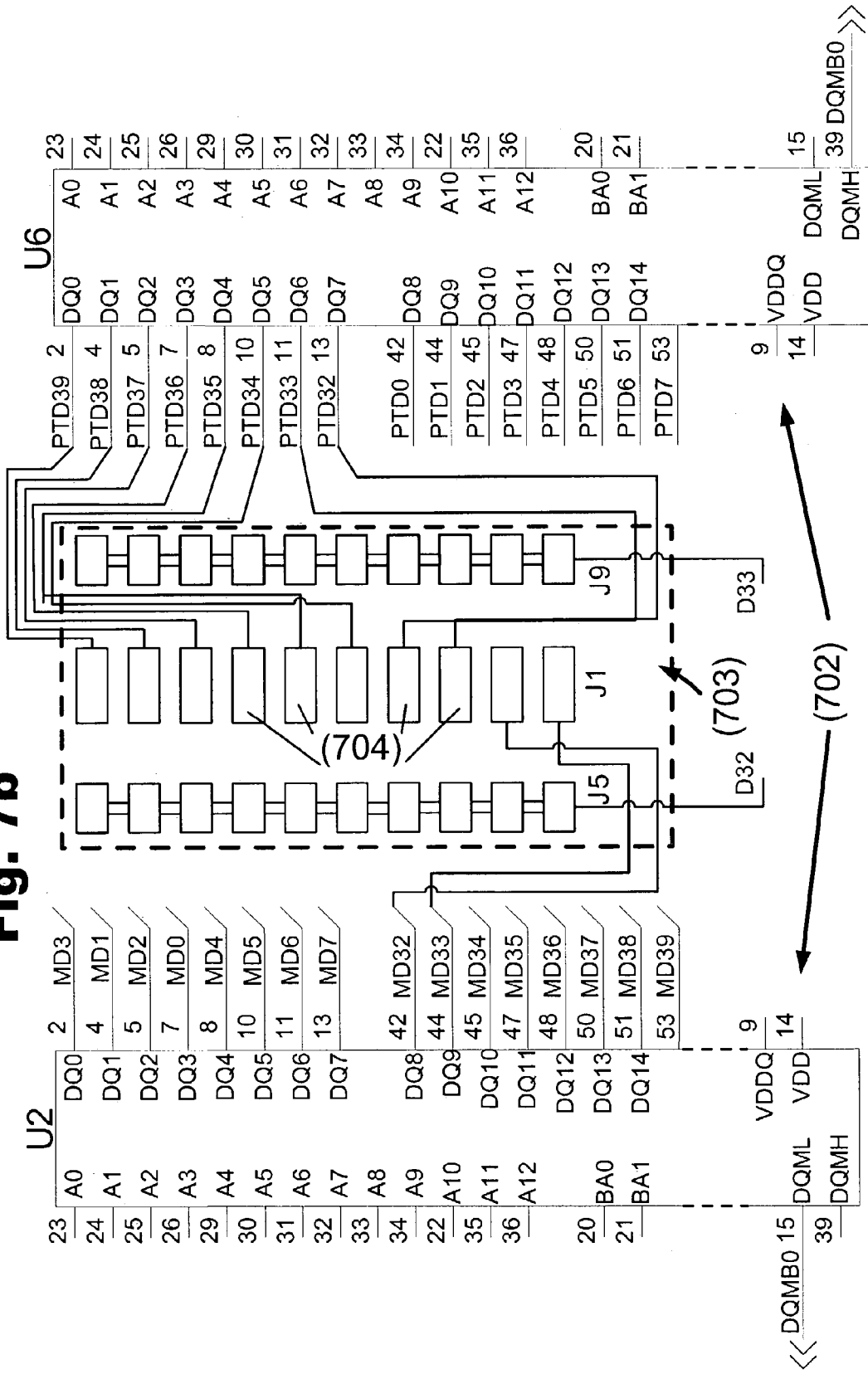
FIG. 7*b* is a block diagram illustrating a primary and secondary memory part in conjunction with an 8-to-1 I/O line patching network according to one embodiment of the present invention.

FIG. 7b is a block diagram illustrating a primary and secondary memory part in conjunction with an 8-to-1 I/O line patching network. In particular, FIG. 7b illustrates a memory part (702) pair, U2 and U6, as described for FIGS. 6A–6L, connected to one of eight 8-to-1 patching networks (703). As shown in FIG. 7b, the primary I/O lines (MD32–MD33) of U2 and secondary I/O lines (PTD32–PTD39) of U6 are electrically connected to conductive pads (704) of an 8-to-1 patching network (703). As described in FIG. 7a, eight 8-to-1 patching networks (703) would be used for each memory part (702) pair of the SDRAM embodiment shown in FIGS. 6A–6L. Therefore, the illustration of FIG. 7b shows only a portion of the 8-to-1 patching networks (703) used in association with U2 and U6.

For a complete description of the 8-to-1 patching networks (703) used with U2 and U6 of FIG. 7b, a reference may be made to FIG. 6I, wherein the 8-to-1 patching network (703) shown in FIG. 7b is described by J5, J9, and J1, and their associated signals. Likewise, all of the connectors and signals shown in FIG. 6I, provide a complete description of the eight 8-to-1 patching networks (703) used in association with U2 and U6.

Figure 7C:
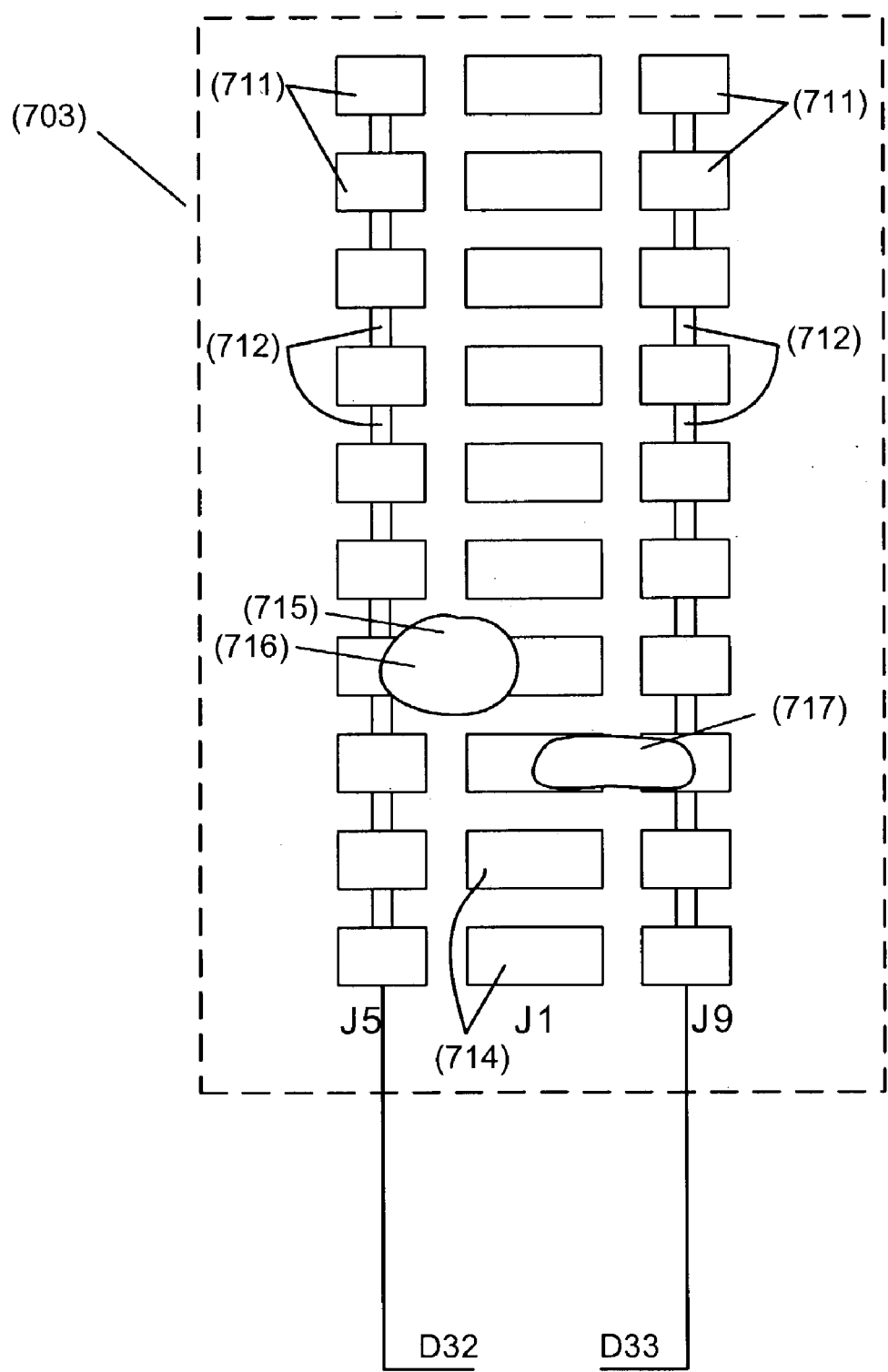
FIG. 7*c* is a block diagram illustrating a completed 8-to-1 I/O line patching network according to one embodiment of the present invention.

FIG. 7c is a block diagram illustrating a completed 8-to-1 I/O line patching network. More specifically, FIG. 7c illustrates the 8-to-1 patching network (703) shown in FIG. 7b. As shown in FIG. 7c, a number of solder dots (717) or jumper wires (716) may be used to electrically connect a primary I/O line pad or secondary I/O line pad (714) to output I/O line pads (711). In some embodiments, the 8-to-1 patching network shown in FIG. 7c allows two operable I/O lines (out of 10 possibilities) to be connected to the output I/O lines, D32 and D33. Additionally, a selectively settable material (715) may be used to protect solder dots (717) or jumper wires (716) from physical damage. As illustrated in FIG. 7c, J5 and J9, also shown in FIG. 6I, which connect to I/O output lines D32 and D33, comprise a series of conductive pads (711) connected by traces (712), thereby allowing a convenient means of connecting 2 of the 10 primary and secondary I/O lines associated with J1 to J4 and J9.

Figure 7D:
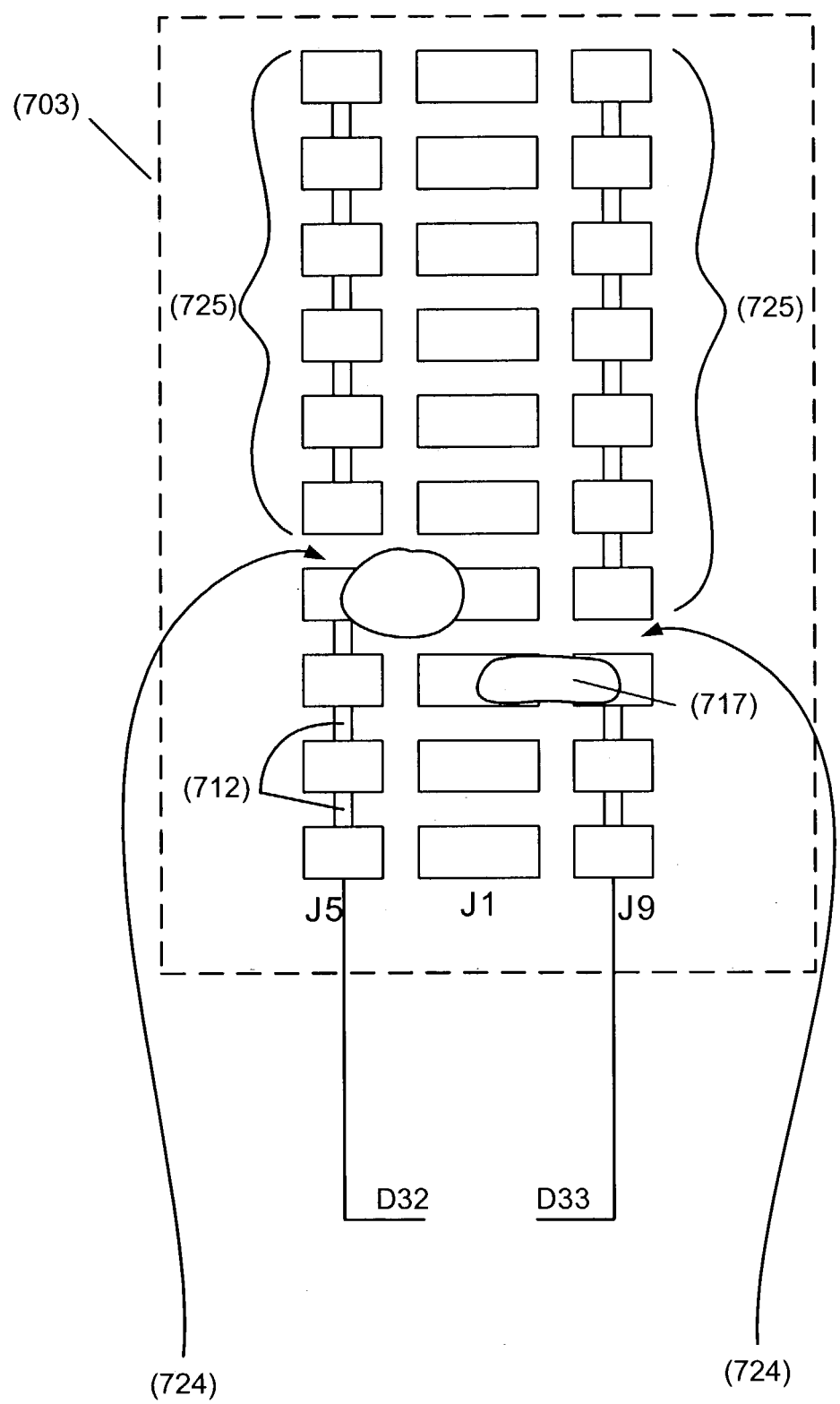
FIG. 7*d* is a block diagram illustrating another completed 8-to-1 I/O line patching network.

FIG. 7d is a block diagram illustrating another completed 8-to-1 I/O line patching network. As shown in FIG. 7d the 8-to-1 patching network (703) is completed as illustrated in FIG. 7c. The block diagram of FIG. 7d illustrates an optional removal of traces (724) from the 7-to-1 patching network (703) to reduce high-frequency stubbing effects that may distort the I/O signal. More specifically, the open circuit "stubs" (725) cause electrical waves to reflect, thereby causing possible distortion to the I/O line signal. By removing the trace (712) closest to the patch connection, stubbing effects may be significantly reduced. In particular, memory modules which operate at a frequency greater than 100 MHz are susceptible to deleterious stubbing effects, and may use the removal of traces, as illustrated in FIG. 7d, to reduce stubbing effects.

Figure 8:
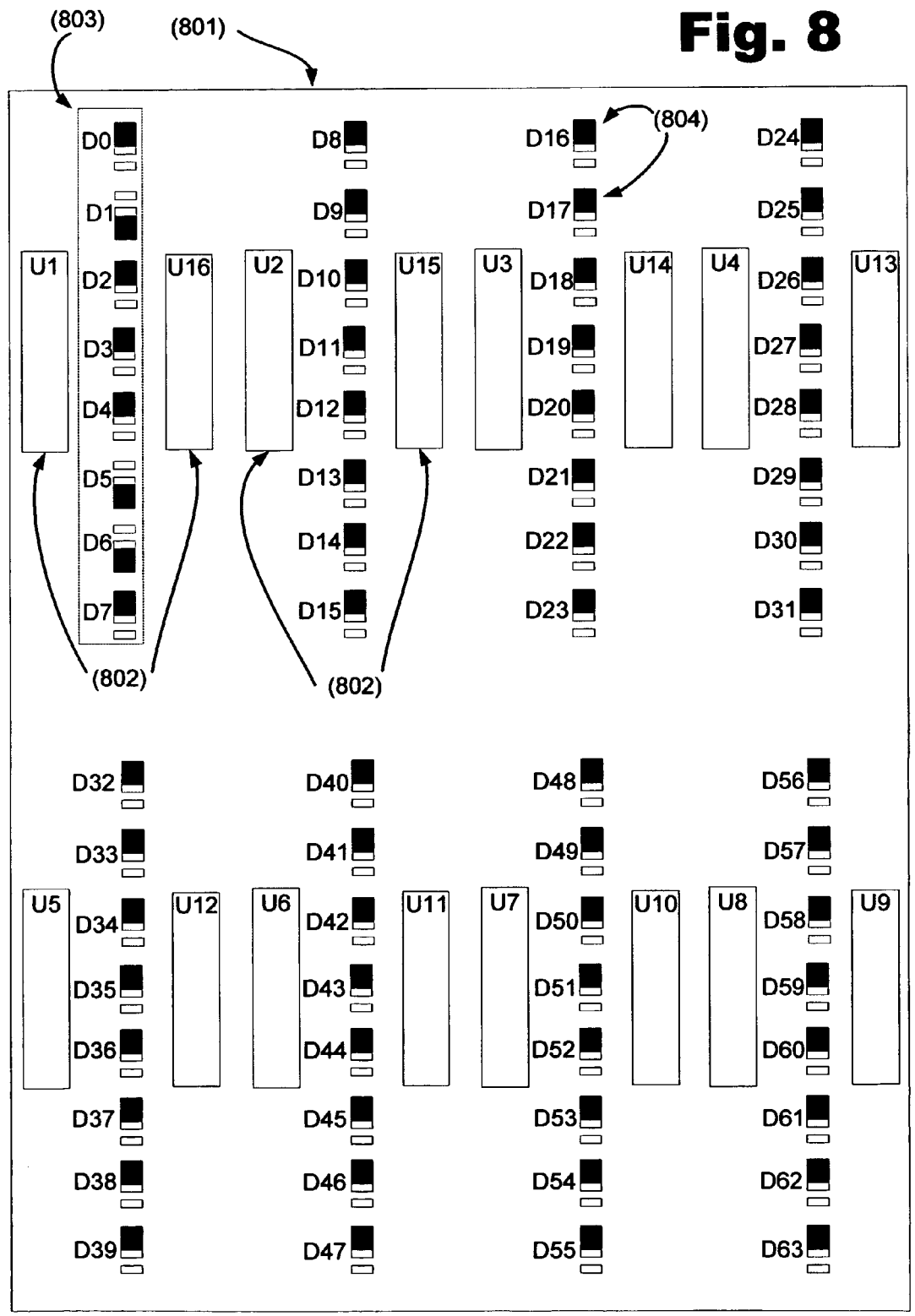
FIG. 8 is a block diagram illustrating a traveling table used during the fabrication process of a memory module using 2-to-1 patching according to one embodiment of the present invention.

FIG. 8 is a block diagram illustrating a traveling table used during the fabrication process of a memory module using 2-to-1 patching. As shown in FIG. 8, a traveling table (801) may comprise a number of memory part pair graphics (802), 2-to-1 patching network graphics (803), and marks (804) to designate which pads, corresponding to a primary or secondary I/O line, are connected to the output lines (designated by D0–D63), as previously described in detail for FIGS. 3b–3c.

In the embodiment of FIG. 8, 64 output lines from the primary and secondary memory parts represented by the memory part pair graphics (802) are shown. During the fabrication process, a traveling table (801) may be updated by changing the marks (804) to show the most recent patches made on a memory module. The marks (804) may be updated manually, or in a selected embodiment by a computerized program.

The traveling table (801) may be used when fabricating a memory module represented by FIG. 3a. Additionally, other traveling tables, similar to the traveling table (801) of FIG. 8, may be used during the fabrication process of memory products which use 2-to-1 patching. In a selected embodiment, a traveling table (801) may show the memory parts on a memory module, the patching configuration, and the connections (I/O lines to output lines) that are made during the fabrication process. Additionally, a traveling table (801) may include a product serial number, patching codes, etc.

Figure 9:
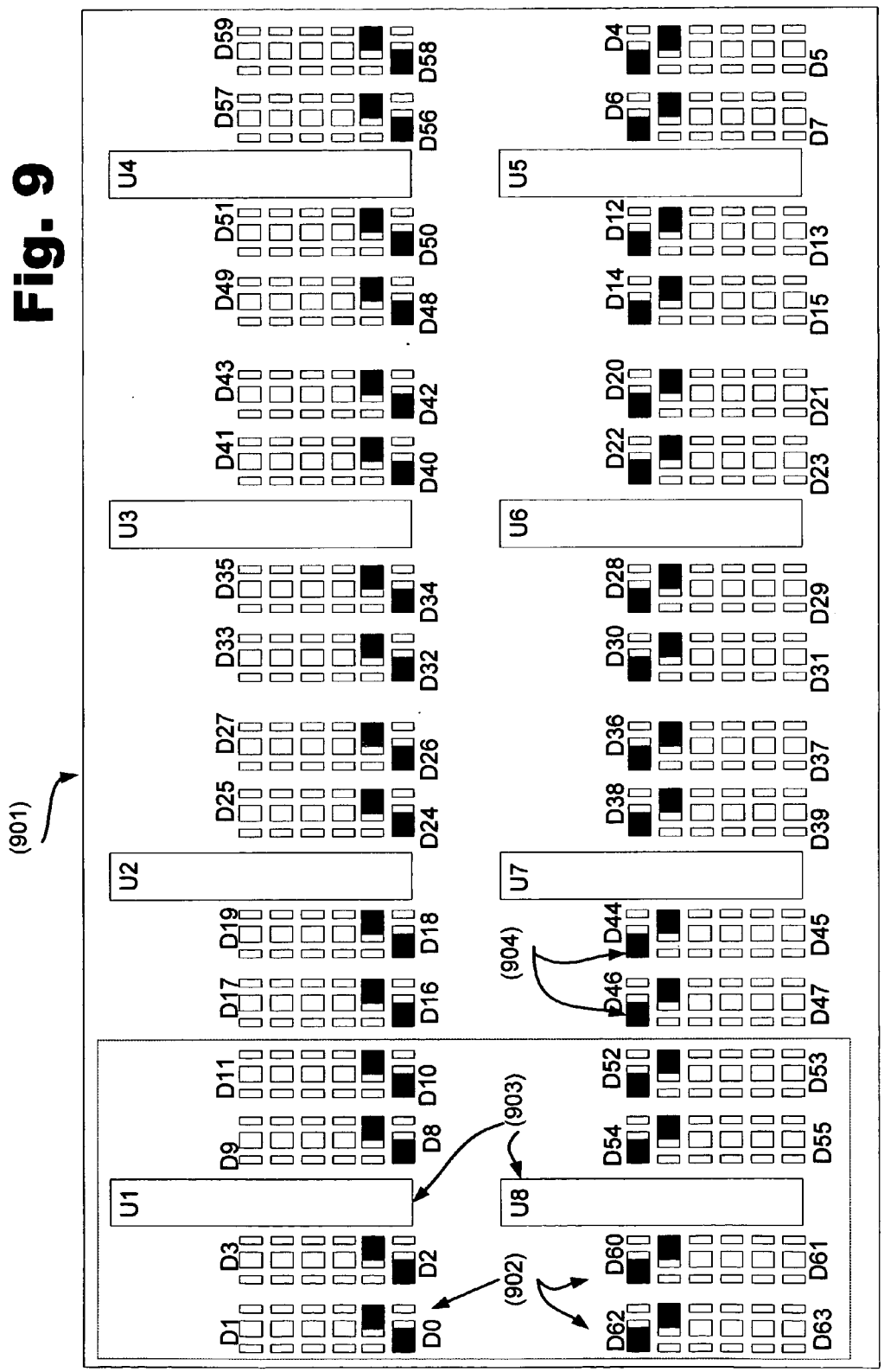
FIG. 9 is a block diagram illustrating a traveling table used during the fabrication process of a memory module using 4-to-1 patching according to one embodiment of the present invention.

FIG. 9 is a block diagram illustrating a traveling table used during the fabrication process of a memory module using 4-to-1 patching. As shown in FIG. 9, a traveling table (901) may comprise a number of memory part pair graphics (902), 4-to-1 patching network graphics (903), and marks (904) to designate which pads, corresponding to a primary or secondary I/O line, are connected to the output lines (designated by D0–D63), as previously described in detail for FIGS. 5*b*–5*d*.

In the embodiment of FIG. 9, 64 output lines from the primary and secondary memory parts represented by the memory part pair graphics (902) are shown. During the fabrication process, a traveling table (901) may be updated by changing the marks (904) to show the most recent patches made on a memory module. The marks (904) may be updated manually, or in a selected embodiment, by a computerized program.

The traveling table (901) may be used when fabricating a memory module represented by FIG. 5*a*. Additionally, other traveling tables, similar to the traveling table (901) of FIG. 9, may be used during the fabrication process of memory products which use 4-to-1 patching. In a selected embodiment, a traveling table (901) may show the memory parts on a memory module, the patching configuration, and the connections (I/O lines to output lines) that are made during the fabrication process. Additionally, a traveling table (901) may include a serial number, patching codes, etc.

Figure 10:
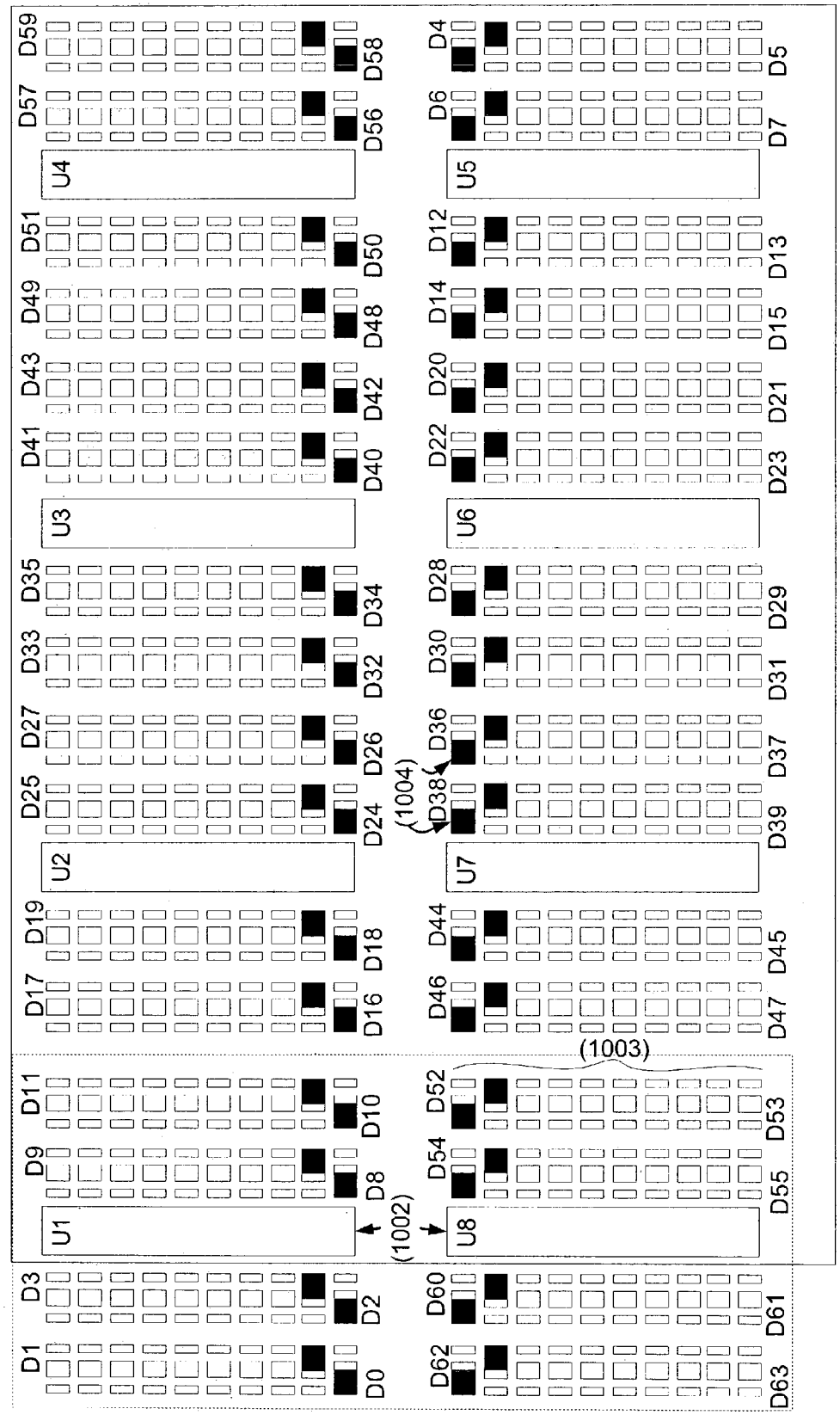
FIG. 10 is a block diagram illustrating a traveling table used during the fabrication process of a memory module using 8-to-1 patching according to one embodiment of the present invention.

FIG. 10 is a block diagram illustrating a traveling table used during the fabrication process of a memory module using 8-to-1 patching. As shown in FIG. 10, a traveling table (1001) may comprise a number of memory part pair graphics (1002), 8-to-1 patching network graphics (1003), and marks (1004) to designate which pads, corresponding to a primary or secondary I/O line, are connected to the output lines (designated by D0–D63), as previously described in detail for FIGS. 7*b*–7*d*.

In the embodiment of FIG. 10, 64 output lines from the primary and secondary memory parts represented by the memory part pair graphics (1002) are shown. During the fabrication process, a traveling table (1001) may be updated by changing the marks (1004) to show the most recent patches made on a memory module. The marks (1004) may be updated manually, or in a selected embodiment, by a computerized program.

The traveling table (1001) may be used when fabricating a memory module represented by FIG. 7*a*. Additionally, other traveling tables, similar to the traveling table (1001) of FIG. 10, may be used during the fabrication process of memory products which use 8-to-1 patching. In a selected embodiment, a traveling table (1001) may show the memory parts on a memory module, the patching configuration, and the connections (I/O lines to output lines) that are made during the fabrication process. Additionally, a traveling table (1001) may include a serial number, patching codes, etc.

The preceding description has been presented only to illustrate and describe selected embodiments of invention. It is not intended to be exhaustive or to limit the invention to any precise form disclosed. Many modifications and variations are possible in light of the above teaching. It is intended that the scope of the invention be defined by the following claims.

What is claimed is:

1. A method for fabricating a semiconductor memory module on a multi-layer printed circuit board comprising the steps of:
   mounting a plurality of primary memory parts on said printed circuit board;
   testing said primary memory parts to determine Input/Output (I/O) line functionality;
   mounting pre-tested secondary memory parts whose operable I/O lines match failed I/O lines of said primary memory parts;
   positioning I/O line patching elements on said printed circuit board adjacent to said primary and secondary memory parts;
   matching read/write control signal lines for each respective I/O line of one of said primary memory parts with a like I/O line of an individually associated secondary memory part;
   patching any non-operable I/O line of a primary memory part by replacing it with a fully-operable I/O line of its associated backup memory part by selectively connecting and disconnecting patching elements corresponding to a functional I/O line of said secondary memory part and a non-functional I/O line of said primary memory part.

2. The method of claim 1, wherein said step of positioning comprises a step of forming on said PC board a multi-column essentially a two-dimensional ladder-like structure of isolated conductive pads for facilitating connection of working I/O line segments of said matched read/write control lines to enable a working I/O line of its associated backup memory part to replace a non-working I/O line of one of said primary memory parts.

3. The method of claim 1, wherein the step of patching comprises the step of selectively establishing an electrical connection between selected ones of the conductive pads of two of said isolated columns and electrically isolating said selective ones of said conductive pads from other conductive pads in a same column.

4. A semiconductor memory module fabricated in accordance with claim 3.

5. A semiconductor memory module fabricated in accordance with the method of claim 1 wherein said primary and secondary memory parts comprise at least one less than fully operational memory parts.

6. The method of claim 1, wherein 4 and 8M×64 SDRAM DIMM said bit patching network comprises a total of 32 patching network elements for simultaneously accessing a 64 bit word.

7. The method of claim 1, wherein the patching network comprises a 4-to-1 patching network configuration.

8. The method of claim 1, wherein said patching network comprises a 2-to-1 patching network configuration.

9. A method for fabricating a semiconductor memory module on a multi-layer printed circuit board comprising the steps of:
   mounting a plurality of primary memory parts and secondary backup memory parts on said circuit board,
   positioning a lattice type I/O line bit patching network adjacent ones of said primary and said secondary memory parts,
   matching read/write control signal lines for each respective I/O line of one of said primary memory parts with a like I/O line of an individually associated secondary memory part,
   testing each primary and secondary memory part to identify any non-operable I/O lines, and patching any non-operable I/O line of a primary memory part by replacing it with a fully operable I/O line of its associated backup memory part by selectively coupling one of said matched read/write control signal lines to said adjacent bit patching network to form a fully operational memory module.

10. The method of claim 9, wherein said step of positioning comprises a step of forming on said PC board a multicolumn essentially a two-dimensional ladder-like structure of isolated conductive pads for facilitating connection of working I/O line segments of said matched read/write control lines to enable a working I/O line of its associated backup memory part to replace a non-working I/O line of one of said primary memory parts.

11. The method of claim 9, wherein the step of patching comprises the step of selectively establishing an electrical connection between selected ones of the conductive pads of two of said isolated columns and electrically isolating said selective ones of said conductive pads from other conductive pads in a same column.

12. A semiconductor memory module fabricated in accordance with claim 11.

13. A semiconductor memory module fabricated in accordance with the method of claim 9, wherein said primary and secondary memory parts comprise at least one less than fully operational memory parts.

14. The method of claim 9, wherein said patching network comprises an 8-to-1 patching network configuration.

15. A semiconductor memory module including a plurality of primary memory parts and a plurality of secondary backup memory parts, at least one of said secondary backup memory parts having one or more defective I/O output line segments, said memory module comprising:
   a multi-layer PC board for supporting said primary and secondary memory parts on at least one outer surface thereof,
   a plurality of I/O bit patching networks at least one of which networks is positioned adjacent each memory part,
   a first conductive pathway on said PC board for combining individual memory parts read/write control lines of each primary memory part with an associated backup memory part,
   a second conductive pathway on said PC board for connecting each said individual combined read/write control line to a predetermined conductive tab of a first of said bit patching networks adjacent to a pair of predetermined associated primary memory part and its associated backup secondary memory part, and
   a third conductive pathway for selectively establishing an electrical connection between said first and said second conductive pathways with said bit patching network to operatively replace a non-operable I/O line of a primary memory part with an operable I/O line of said associated backup secondary memory part.

16. The semiconductor memory module of claim 15, wherein said third conductive pathway comprises a solder dot connection.

17. The semiconductor memory module of claim 15, wherein said third conductive pathway comprises a wire jumper.

18. The semiconductor memory module of claim 15, wherein said first and said second conductive pathways comprise conductive leads formed on one surface of said PC board.

19. The semiconductor memory module of claim 15, wherein said plurality of bit patching networks comprise a plurality of individual ladder-like structures of conductive tabs arranged in a plurality of parallel columns and a plurality of conductive tabs arranged in a like parallel column intermediate said ladder-like structure.

20. The semiconductor memory module of claim 15, wherein said I/O bit patching network comprises a first columnar array of a plurality of individual conductive pads for connecting said I/O segments of a primary memory part, second and third columnar arrays of conductive paths parallel to and on either side of said first columnar array, said second and third array of conductive paths electrically connected to predetermined I/O segments of said primary memory module, and a plurality of conductive jumpers for connecting a pre-selected tab of said first array to predetermined ones of said conductive tabs of said second or third array of conductive paths to selectively connect one or more of said fully operable I/O data lines as outputs for said memory module.

* * * * *